US011217635B2

(12) United States Patent
Ikeda et al.

(10) Patent No.: US 11,217,635 B2
(45) Date of Patent: Jan. 4, 2022

(54) IMAGING DISPLAY DEVICE AND ELECTRONIC DEVICE

(71) Applicant: Semiconductor Energy Laboratory Co., Ltd., Atsugi (JP)

(72) Inventors: Takayuki Ikeda, Kanagawa (JP); Naoto Kusumoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 92 days.

(21) Appl. No.: 16/605,253

(22) PCT Filed: Apr. 16, 2018

(86) PCT No.: PCT/IB2018/052615
§ 371 (c)(1),
(2) Date: Oct. 15, 2019

(87) PCT Pub. No.: WO2018/197987
PCT Pub. Date: Nov. 1, 2018

(65) Prior Publication Data
US 2020/0127064 A1   Apr. 23, 2020

(30) Foreign Application Priority Data

Apr. 28, 2017 (JP) .............................. JP2017-090230

(51) Int. Cl.
*H01L 27/32* (2006.01)
*G06N 3/02* (2006.01)
(Continued)

(52) U.S. Cl.
CPC ............ *H01L 27/3227* (2013.01); *G06N 3/02* (2013.01); *H04N 7/144* (2013.01); *H01L 27/1225* (2013.01); *H01L 27/14612* (2013.01)

(58) Field of Classification Search
CPC ........... H01L 27/3227; H01L 27/14612; H01L 27/1225; H01L 51/50; H04N 5/3745;
(Continued)

(56) References Cited

U.S. PATENT DOCUMENTS 8,378,391 B2   2/2013   Koyama et al.
8,654,231 B2   2/2014   Kurokawa et al.
(Continued)

FOREIGN PATENT DOCUMENTS

CN   101751846 A   6/2010
EP   3525238 A   8/2019
(Continued)

OTHER PUBLICATIONS

International Search Report (Application No. PCT/IB2018/052615) dated Jun. 19, 2018.
(Continued)

*Primary Examiner* — Thanh T Nguyen
(74) *Attorney, Agent, or Firm* — Fish & Richardson P.C.

(57) ABSTRACT

An imaging display device which can quickly display a captured image is provided. The imaging display device includes an imaging portion on a first surface and a display portion on a second surface that is opposite to the first surface. The imaging portion includes a photoelectric conversion element configured to receive light delivered to the first surface. The display portion includes a light-emitting element configured to emit light in a direction opposite to the first surface. A pixel in the imaging portion is electrically connected to a pixel in the display portion. An image signal obtained at the imaging portion can be directly input to the display portion. Accordingly, the time delay due to data conversion can be eliminated, so that a captured image can be displayed in a moment.

12 Claims, 27 Drawing Sheets

(51) Int. Cl.
*H04N 7/14* (2006.01)
*H01L 27/12* (2006.01)
*H01L 27/146* (2006.01)

(58) Field of Classification Search
CPC .... H04N 7/144; H04N 5/22525; H04N 5/379; G06N 3/02
See application file for complete search history.

(56) References Cited

U.S. PATENT DOCUMENTS

| | | | |
|---|---|---|---|
| 8,836,626 | B2 | 9/2014 | Ikeda |
| 8,916,869 | B2 | 12/2014 | Koyama et al. |
| 9,331,112 | B2 | 5/2016 | Koyama et al. |
| 9,575,381 | B2 | 2/2017 | Kurokawa et al. |
| 9,773,814 | B2 | 9/2017 | Koyama et al. |
| 2010/0149079 | A1 | 6/2010 | Yamashita et al. |
| 2019/0222733 | A1 | 7/2019 | Nishide et al. |

FOREIGN PATENT DOCUMENTS

| | | | | |
|---|---|---|---|---|
| JP | 08-102924 A | | 4/1996 | |
| JP | 2008-177738 | * | 7/2008 | ............. H04N 5/335 |
| JP | 2008-177738 A | | 7/2008 | |
| JP | 2008-241827 | * | 10/2008 | ............... G09F 9/00 |
| JP | 2008-241827 A | | 10/2008 | |
| JP | 2010-139895 A | | 6/2010 | |
| JP | 2011-119711 A | | 6/2011 | |
| KR | 2010-0069591 A | | 6/2010 | |
| TW | 201030713 | | 8/2010 | |
| WO | WO-2018/066225 | | 4/2018 | |

OTHER PUBLICATIONS

Written Opinion (Application No. PCT/IB2018/052615) dated Jun. 19, 2018.

\* cited by examiner

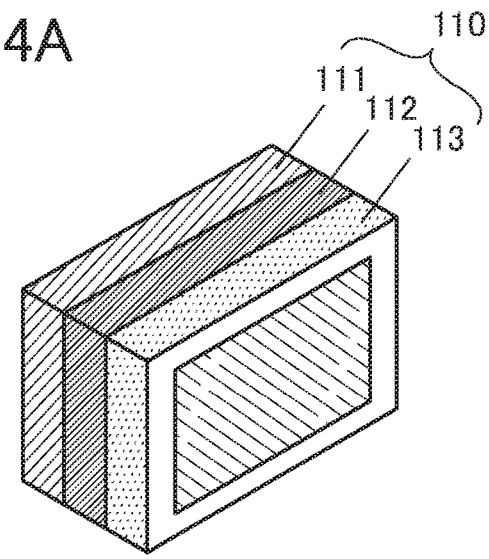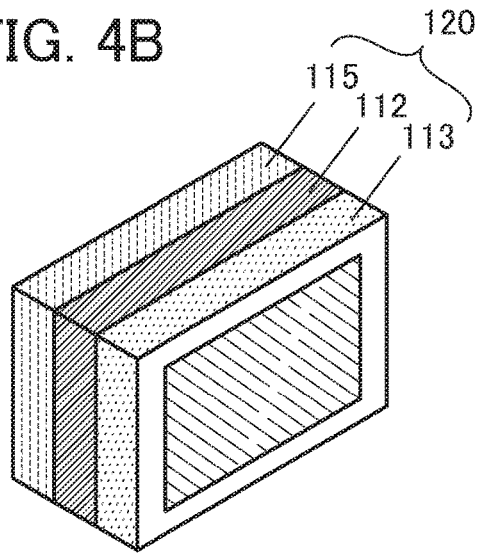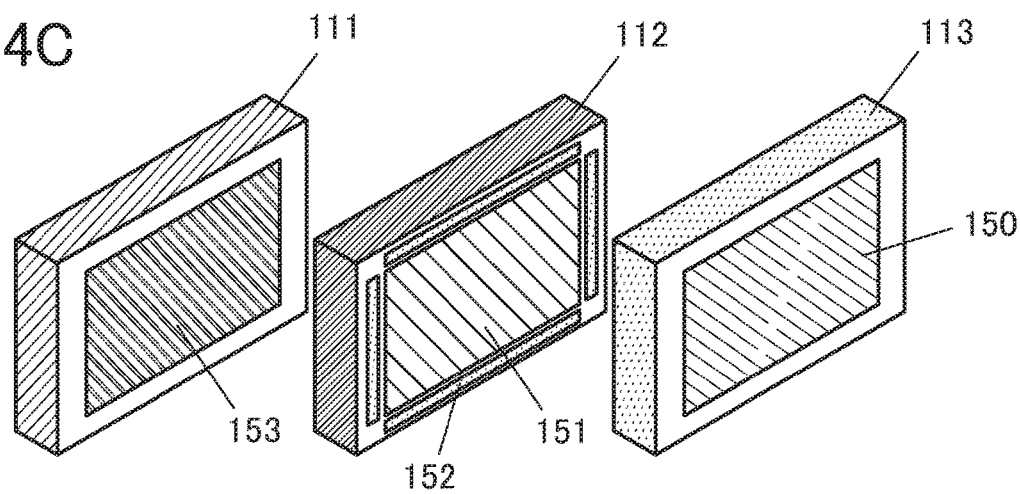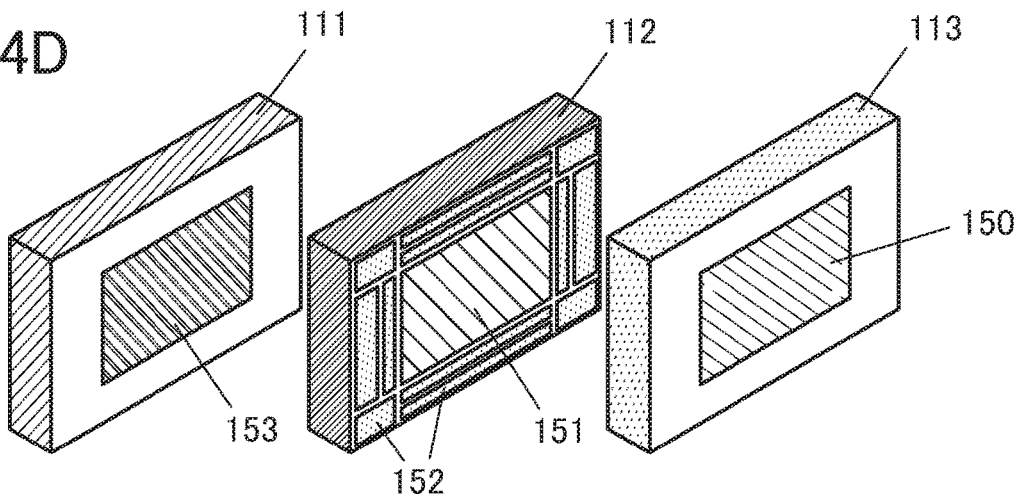

IMAGING DISPLAY DEVICE AND ELECTRONIC DEVICE

CROSS REFERENCE TO RELATED APPLICATIONS

This application is a U.S. National Phase Application under 35 U.S.C. § 371 of International Application PCT/IB2018/052615, filed on Apr. 16, 2018 and claims the benefit of a foreign priority application filed in Japan on Apr. 28, 2017, as Application No. 2017-090230, both of which are incorporated by reference.

TECHNICAL FIELD

An embodiment of the present invention relates to an imaging display device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming transistors using oxide semiconductor thin films formed over a substrate has been attracting attention. For example, Patent Document 1 discloses an imaging device in which a transistor including an oxide semiconductor with an extremely low off-state current is used in a pixel circuit.

Imaging devices are incorporated in a variety of electronic devices together with display devices, which enables users to see captured images on the spot. Furthermore, augmented reality (AR) technology which combines a captured real-world image and additional data obtained from a server or the like, such as text data or computer graphics (CG), on the display device has been used.

REFERENCE

Patent Document

[Patent Document 1] Japanese Published Patent Application No. 2011-119711

DISCLOSURE OF INVENTION

Because image data obtained with an imaging device is analog data, the data is converted into digital data and transmitted to a storage medium or a display device. In the display device, the digital data is converted into analog data and a display element is driven with the analog data. Therefore, even in the case where the captured image is displayed in real time, there arise a time lag between reality and the actually displayed image on the display device.

In AR-displaying additional data, it takes time to communicate with a server and process the data. In order to ensure consistency between reality and the displayed additional data, a reduction of a load on the server and the employment of a high-performance data processing device as well as higher-speed communication with the server are effective.

Another display method with the use of a see-through display has been proposed, in which the reality is a real image that has passed through the display and only additional data is displayed on the display. However, a relationship between the position of a viewer and the position of the display is not always the same and therefore the positional adjustment between the reality and the additional data is necessary. For example, even when the display is seen from the front and an object and additional data such as text are displayed overlapping with each other, the object and the additional data do not look overlapping appropriately when the display is seen obliquely.

In view of the foregoing circumstance, an object of one embodiment of the present invention is to provide an imaging display device which can transmit analog data that is obtained with an imaging portion to a display portion without converting the analog data into digital data. Another object of one embodiment of the present invention is to provide an imaging display device which can quickly obtain additional data for AR display. Another object of one embodiment of the present invention is to provide an imaging display device which eliminates the need for the positional adjustment between the displayed reality and additional data in performing AR display.

Another object of one embodiment of the present invention is to provide an imaging display device with low power consumption. Another object of one embodiment of the present invention is to provide an imaging display device capable of capturing an image with little noise. Another object of one embodiment of the present invention is to provide an imaging display device that can capture an image with high sensitivity. Another object of one embodiment of the present invention is to provide an imaging display device with high reliability. Another object of one embodiment of the present invention is to provide a novel imaging display device or the like. Another object of one embodiment of the present invention is to provide a method for driving any of the above-described imaging display devices. Another object of one embodiment of the present invention is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging display device which includes an imaging portion on a first surface and a display portion on a second surface that is opposite to the first surface.

One embodiment of the present invention is an imaging display device which includes an imaging portion on a first surface and a display portion on a second surface that is opposite to the first surface. The imaging portion includes a photoelectric conversion element configured to receive light delivered to the first surface. The display portion includes a light-emitting element configured to emit light in a direction opposite to the first surface. The photoelectric conversion element is electrically connected to a gate of a transistor. The light-emitting element is electrically connected to one of a source and a drain of the transistor.

The imaging display device can further include a data processing portion. The data processing portion includes a neural network configured to estimate the kind of an object. Moreover, the data processing portion can be positioned between the photoelectric conversion element and the light-emitting element.

Another embodiment of the present invention is an imaging display device which includes a first layer, a second layer, and a third layer. The second layer is positioned between the first layer and the third layer. The first layer includes a light-emitting element. The second layer includes a first transistor and a second transistor. The third layer includes a photoelectric conversion element. The light-emitting element is electrically connected to the first transistor. The photoelectric conversion element is electrically connected to the second transistor. The first transistor is electrically connected to the second transistor.

The imaging display device of the above-described embodiment can further include a fourth layer. The fourth layer is positioned between the second layer and the third layer. The fourth layer includes a third transistor. The third transistor is electrically connected to the second transistor. The first transistor and the second transistor each include a metal oxide in a channel formation region, and the third transistor includes silicon in a channel formation region.

The metal oxide preferably includes In, Zn, and M (M is Al, Ti, Ga, Sn, Y, Zr, La, Ce, Nd, or Hf).

The photoelectric conversion element preferably includes selenium or a compound including selenium.

Another embodiment of the present invention is an imaging display device which includes a first transistor, a second transistor, a third transistor, a photoelectric conversion element, and a light-emitting element. One electrode of the photoelectric conversion element is electrically connected to one of a source and a drain of the first transistor. The one electrode of the photoelectric conversion element is electrically connected to one of a source and a drain of the second transistor. A gate of the third transistor is electrically connected to the other of the source and the drain of the second transistor. One electrode of the light-emitting element is electrically connected to one of a source and a drain of the third transistor.

The imaging display device of the above-described embodiment can further include a fourth transistor. One of a source and a drain of the fourth transistor is electrically connected to the other of the source and the drain of the second transistor. The other of the source and the drain of the fourth transistor is electrically connected to the gate of the third transistor.

With one embodiment of the present invention, an imaging display device which can transmit analog data that is obtained with an imaging portion to a display portion without converting the analog data into digital data can be provided. An imaging display device which can quickly obtain additional data for AR display can be provided. An imaging display device which eliminates the need for the positional adjustment between the displayed reality and additional data in performing AR display can be provided. An imaging display device with low power consumption can be provided. An imaging display device capable of capturing an image with little noise can be provided. An imaging display device that can capture an image with high sensitivity can be provided. An imaging display device with high reliability can be provided. A novel imaging display device or the like can be provided. A method for driving any of the above-described imaging display devices can be provided. A novel semiconductor device or the like can be provided.

BRIEF DESCRIPTION OF DRAWINGS

In the accompanying drawings:

FIGS. 4A to 4D illustrate structure examples of an imaging display device;

BEST MODE FOR CARRYING OUT THE INVENTION

Figure 1:
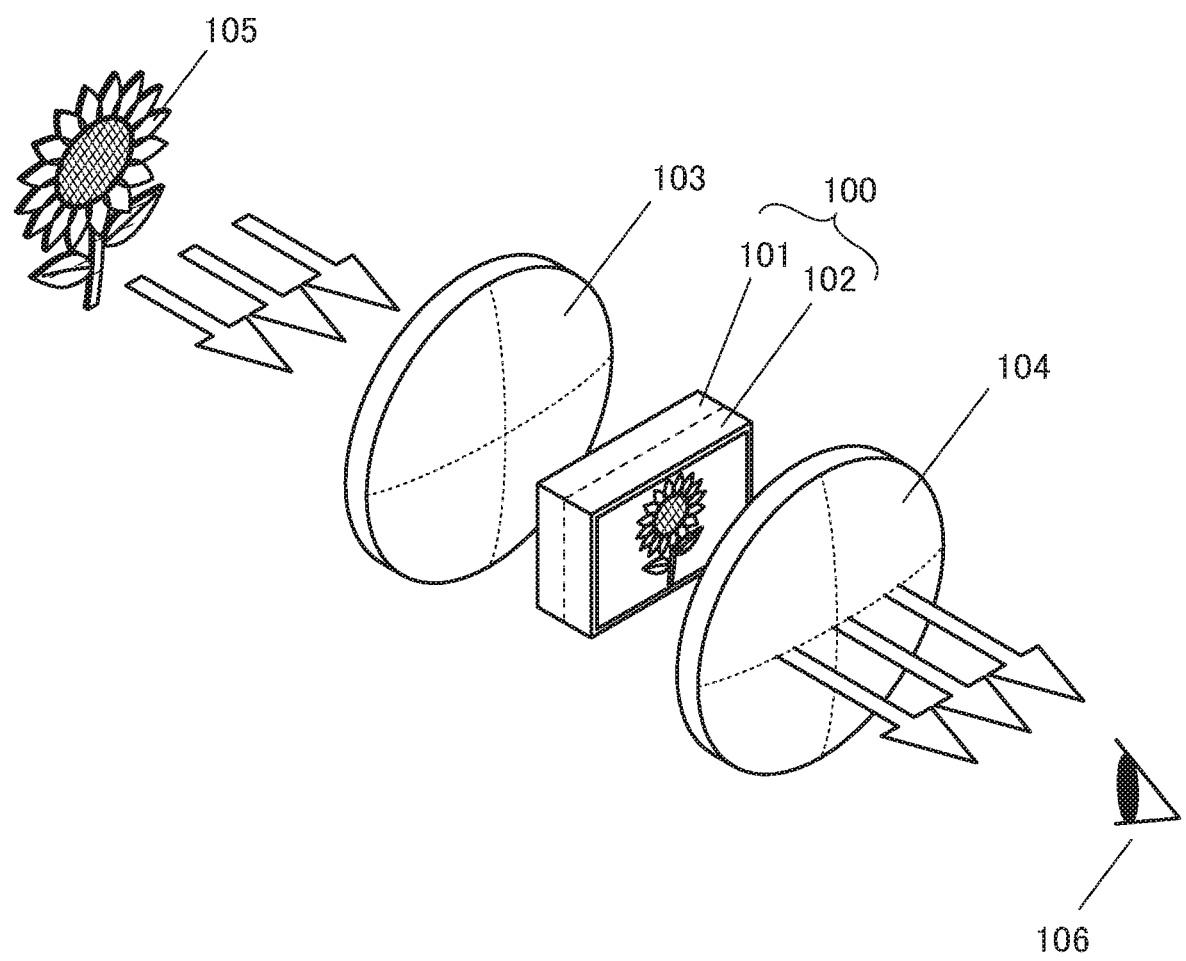
FIG. 1 illustrates an imaging display device.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Embodiment 1

In this embodiment, an imaging display device of one embodiment of the present invention will be described with reference to drawings.

One embodiment of the present invention is an imaging display device including an imaging portion and a display portion. The imaging display device includes the imaging portion on a first surface and the display portion on a second surface that is opposite to the first surface. Since the light sensing surface and the light emission surface face the opposite directions, the structure of this imaging display device is suitable for smart glasses, a telescope, binoculars, a monocle, a microscope, a night scope, and the like.

The imaging display device includes a pixel in each of the imaging portion and the display portion, and the pixel in the imaging portion is electrically connected to the pixel in the display portion. In other words, a portion functioning as the imaging portion and a portion functioning as the display portion are included in one pixel. With such a structure, an image signal obtained at the imaging portion can be directly input to the display portion. Accordingly, the time delay due to data conversion can be eliminated, so that a captured image can be displayed in a moment.

FIG. 1 illustrates an imaging display device of one embodiment of the present invention. An imaging display device 100 includes an imaging portion (IS) 101 and a display portion (DIS) 102. A lens 103 may be provided between the imaging portion 101 and an object 105. Furthermore, a lens 104 may be provided between the display portion 102 and a viewer 106.

For example, the lens 103 has a function of demagnifying an image of the object 105 and throwing the image onto the imaging portion 101. Furthermore, the lens 104 has a function of magnifying the image displayed on the display portion 102 for the viewer 106. Although the lenses 103 and 104 are each illustrated as consisting of one convex lens in FIG. 1, the structures and functions thereof are determined as needed, and a combination lens or the like may be used as well. Moreover, a mirror which adjusts the optical path may be provided between the display portion 102 and the object 105.

Pixels in the imaging portion 101 are each electrically connected to corresponding pixels in the display portion 102 with one-to-one correspondence. Accordingly, analog data obtained at the pixels in the imaging portion 101 as image signals is transmitted to the pixels in the display portion 102 without being converted into digital data, and display is performed.

Therefore, the imaging display device of one embodiment of the present invention can significantly reduce the delay in displaying the reality.

Figure 2:
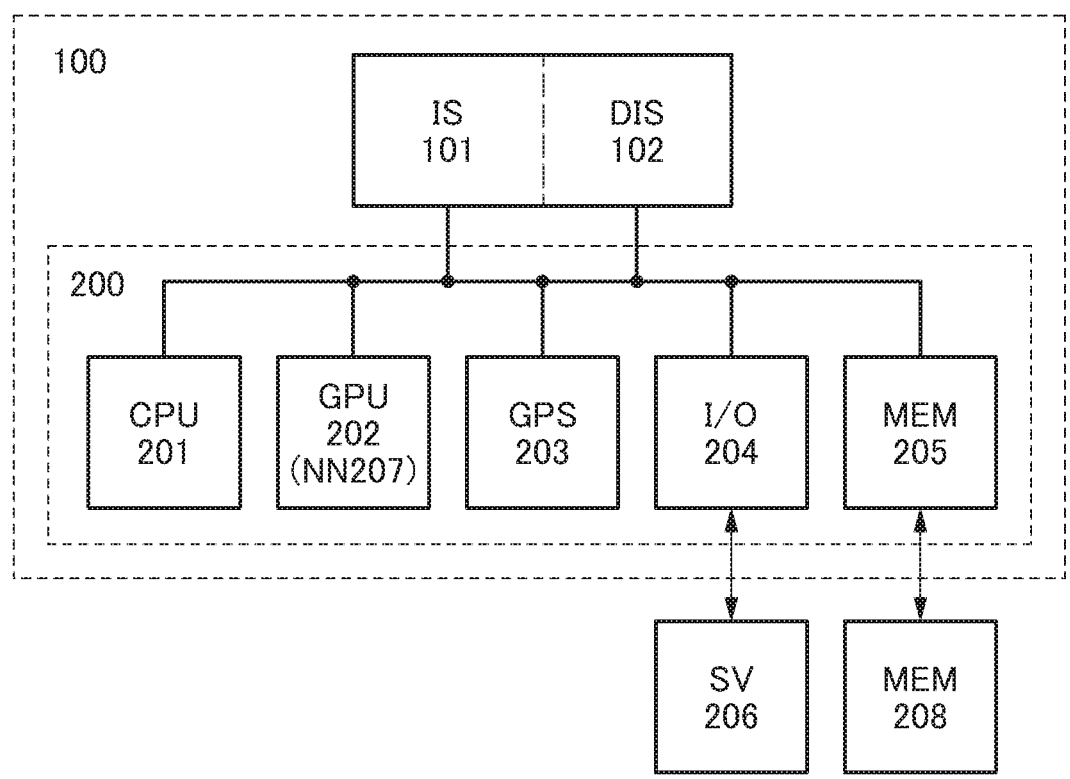
FIG. 2 is a block diagram of an imaging display device.

FIG. 2 illustrates an example of a block diagram of the imaging display device 100. The imaging display device 100 includes a data processing portion 200 in addition to the imaging portion 101 and the display portion 102. The data processing portion 200 includes an arithmetic portion (CPU) 201, an image processing portion (GPU) 202, a position sensor (GPS) 203, an input output portion (I/O) 204, and a memory portion (MEM) 205, for example.

The imaging portion 101, the display portion 102, and the components of the data processing portion 200 are electrically connected to each other, and can transmit signals and data as necessary. Note that any of the components is not electrically connected to any of the other components, in some cases. Furthermore, any of the components has a function of any of the other components, in some cases. Moreover, a function of one component is distributed among a plurality of components, in some cases.

The imaging portion 101 has a function of capturing image data, and an imaging device such as a CMOS image sensor can be used, for example. The display portion 102 has a function of displaying image data, and a display device including a light-emitting element such as an organic EL element is preferably used, for example.

The arithmetic portion 201 has a function of performing an arithmetic operation associated with the operation of the whole imaging display device 100, and a central processing unit (CPU) or the like can be used, for example.

The image processing portion 202 has a function of processing data on images, and a graphics processing unit (GPU) or the like can be used, for example. Furthermore, the image processing portion 202 can include a neural network (NN) 207 for analyzing images.

The position sensor 203 has a function of specifying the position of the imaging display device 100, and a global positioning system (GPS) receiver can be used, for example. Moreover, a gyro sensor, an acceleration sensor, an optical sensor, a temperature sensor, or the like may be included.

The input output portion 204 has a function of obtaining data from the outside or a function of outputting data to the outside. For example, the input output portion 204 can be connected to a wired or wireless network, and data can be input to and output from a server (SV) 206 via the network. A medium which stores data to which the obtained image data is compared may be connected to the input output portion 204.

The memory portion 205 has a function of storing programs and items to set which are responsible for operating the imaging display device 100. Furthermore, the memory portion 205 has a function of storing image data captured with the imaging portion 101. A detachable storage medium (MEM) 208 which functions as part of the memory portion 205 may be used.

The neural network 207 performs an operation of estimating the category of an object whose image is captured with the imaging portion 101 (whether the object is a building, a plant, or a human, for example). In the case where AR display of data on an object is desired for example, data on an object that is not specified by the position is conventionally hard to obtain although it is possible to obtain data on a building, a road, or the like by using the position sensor 203.

In the case where only image data on an object is transmitted to the server 206 to obtain related data, the server 206 needs to analyze the category of the object and then identify the object, which is a big burden on the server 206 and requires much time for retrieval. Moreover, in some cases, analysis cannot be performed owing to the lack of data or additional data is necessary to accomplish the analysis.

The neural network 207 estimates the category and transmits the category estimation result as well as image data.

This can significantly reduce the analysis burden on the server 206. In addition, data obtained with the position sensor 203 may be transmitted to the server 206 together. Transmission of data to the server 206 after determining the category allows a retrieval result to be quickly obtained from the server 206.

Thus, in the imaging display device of one embodiment of the present invention where the category of an object is estimated by using the neural network, an image that well matches the reality can be AR-displayed.

Figure 3:
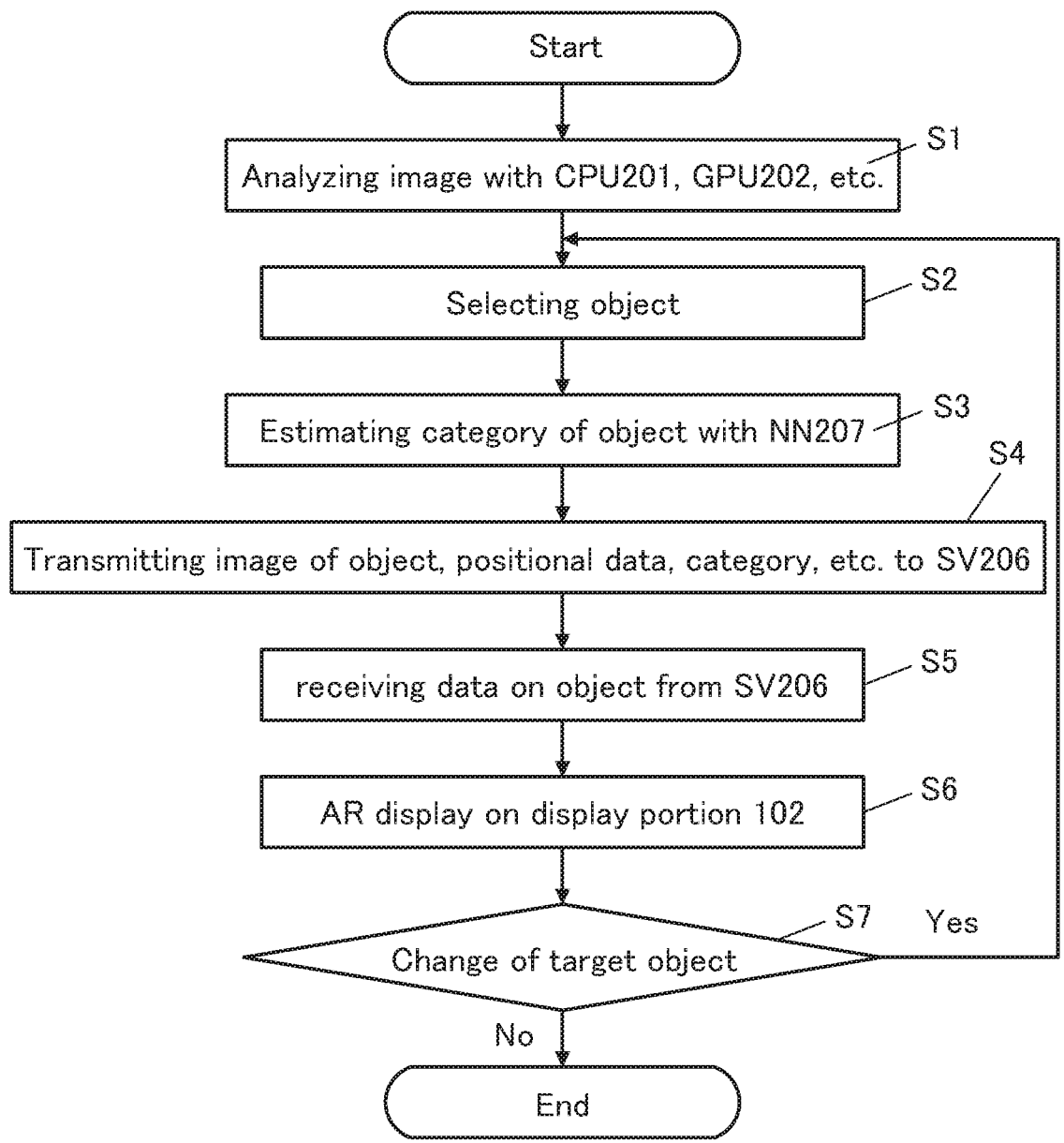
FIG. 3 is a flow chart illustrating an operation for displaying data on an object.

Here, an example of an operation of performing AR display at a given timing in a period when an imaging operation at the imaging portion 101 and a display operation at the display portion 102 are repeated in the imaging display device 100 will be described with reference to a flow chart of FIG. 3. It is assumed that the positional data is obtained with the position sensor 203 at the same time as the imaging operation or the like is performed. Furthermore, it is assumed that in the case where other sensors are provided, a variety of environmental data are obtained with the other sensors at the same time as the imaging operation or the like is performed.

First, an object is extracted from an image captured with the arithmetic portion 201, the image processing portion 202, and the like, and image analysis is performed. In this step, the number of objects in the image and the shape, color, and the like of the object are classified (S1).

Next, an object for which data display is performed is selected (S2). Note that settings may be made previously so that all the objects in the image can be selected.

Next, the category of the selected object is estimated with the neural network 207 by using the already obtained positional data or the like on the object and data obtained from the image analysis in S1 (S3).

Next, the image of the object, data used for the category estimation in S3, and the category estimation result are transmitted to the server 206, and data on the object is retrieved in the server 206 (S4).

Then, data on the object is received from the server 206 (S5), and the data is AR-displayed on the display portion 102 (S6).

To change the object for which data display is performed, the process returns to S2 and the object selection is made again.

Next, structure examples that can be used for the imaging display device 100 will be described with reference to FIGS. 4A to 4D, FIGS. 5A to 5D, FIGS. 6A and 6B, and FIGS. 7A and 7B. Components common to FIGS. 4A to 4D, FIGS. 5A to 5D, FIGS. 6A and 6B, and FIGS. 7A and 7B are denoted by the same reference numerals.

An imaging display device 110 illustrated in FIG. 4A has a structure in which a layer 111, a layer 112, and a layer 113 are sequentially stacked. In the imaging display device 110, components of the imaging portion 101 can be provided in the layer 111 and the layer 112. Furthermore, components of the display portion 102 can be provided in the layer 112 and the layer 113.

FIG. 4C illustrates the layers in the imaging display device 110. The layer 111 includes a region 153 in which a photodiode is provided. As the photodiode, a PN photodiode or a PIN photodiode which includes a silicon substrate as a photoelectric conversion layer is preferably used.

The layer 112 includes a region 151 and regions 152 which are provided in a silicon substrate. The region 151 and the regions 152 each include a transistor whose channel formation region is formed using silicon. The number of regions 152 is more than one, and each of the regions 152 can be provided with a circuit having a function different from each other.

The region 151 has a structure in which both a pixel circuit (excluding the photoelectric conversion element) of the imaging portion 101 and a pixel circuit (excluding a display element) of the display portion 102 are provided. The regions 152 can be provided with a driver circuit, a reading circuit, or the like for the pixel circuits of the imaging portion 101 and the display portion 102.

The layer 113 includes a region 150 provided with the display element. As the display element, a light-emitting element including an organic EL layer is preferably used.

Note that the region 153, the region 151, and the region 150 substantially have the same area.

Figure 6A:
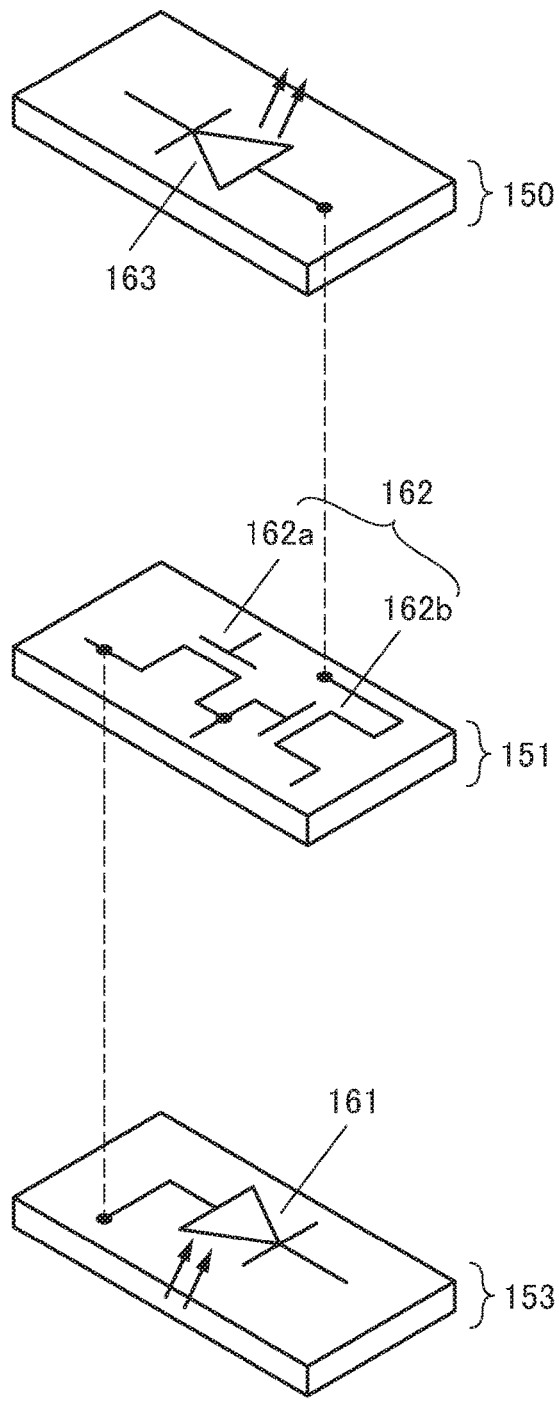
FIGS. 6A and 6B each illustrate an electric connection between components included in an imaging display device.

FIG. 6A illustrates an electric connection between components constituting one pixel of the imaging display device 110. The region 153 includes a photoelectric conversion element 161. The region 151 includes a transistor 162*a* and a transistor 162*b*. The region 150 includes a display element 163.

The transistors 162*a* and 162*b* are components of a pixel circuit 162 in the imaging portion 101 and the display portion 102. The photoelectric conversion element 161, the transistors 162*a* and 162*b*, and the display element 163 are arranged in a matrix in the region 153, the region 151, and the region 150, respectively.

The photoelectric conversion element 161 is placed so as to include a region overlapping with the transistors 162*a* and 162*b*. One electrode of the photoelectric conversion element 161 is electrically connected to one of a source and a drain of the transistor 162*a*.

The transistors 162*a* and 162*b* are placed so as to include a region overlapping with the display element 163. One of a source and a drain of the transistor 162*b* is electrically connected to one electrode of the display element 163.

Note that the other of the source and the drain of the transistor 162*a* is electrically connected to a gate of the transistor 162*b*. A circuit corresponding to the pixel circuit 162 will be described in detail later.

Figure 7A:
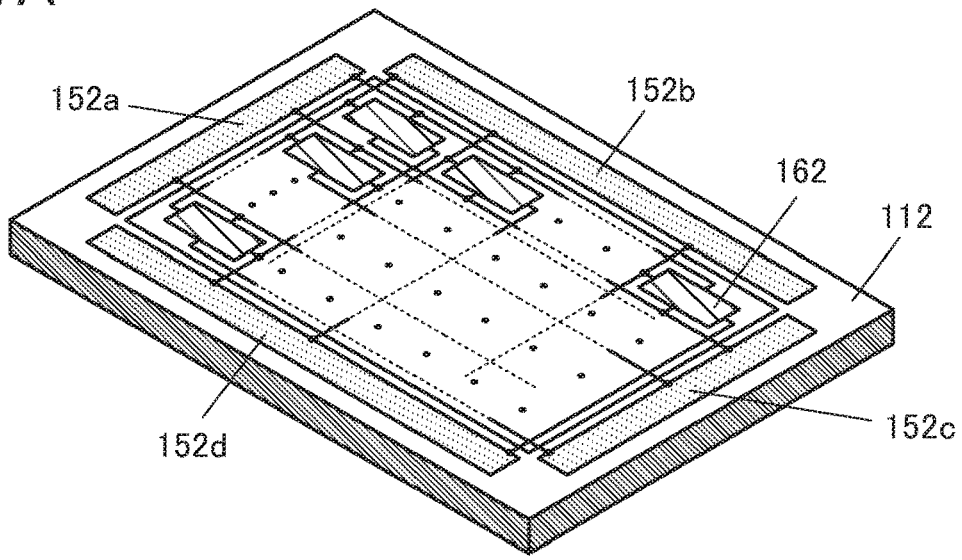
FIGS. 7A and 7B each illustrate an electric connection between a pixel circuit and other circuits.

FIG. 7A illustrates an electric connection between the pixel circuit 162 and circuits 152*a*, 152*b*, 152*c*, and 152*d* provided in the regions 152 in the imaging display device 110. Note that the circuits 152*a*, 152*b*, 152*c*, and 152*d* can have a function of driving the pixel circuit 162, a function of reading out a signal from the pixel circuit 162, or the like.

The circuit 152*a* can have a function of a row driver for the imaging portion 101. The circuit 152*a* is electrically connected to a component of the pixel circuit 162 through a wiring. The circuit 152*b* can have a function of the column driver for the imaging portion 101. The circuit 152*b* may also have a function of a correlated double sampling (CDS) circuit for removing noise and a function of an A/D converter. The circuit 152*b* is electrically connected to the component of the pixel circuit 162 through a wiring.

The circuit 152*c* can have a function of a row driver for the display portion 102. The circuit 152*c* is electrically connected to the component of the pixel circuit 162 through a wiring. The circuit 152*d* can have a function of a column driver for the display portion 102. The circuit 152*d* is electrically connected to the component of the pixel circuit 162 through a wiring.

As in FIG. 4D illustrating the layers, by reducing the relative area of the region 151 in the layer 112, the relative area of the regions 152 in the layer 112 can be increased. In this case, the regions 152 may be provided with not only the above-described driver circuits but also any of components included in the data processing portion 200 or some circuits included in the components.

Furthermore, the imaging display device 100 may have a structure of an imaging display device 120 illustrated in FIG. 4B. The imaging display device 120 is different from the imaging display device 110 in the structure of the photoelectric conversion element and includes a layer 115.

The photoelectric conversion element provided in the layer 115 preferably includes selenium or a selenium compound. A photoelectric conversion element including a selenium-based material can increase the light sensitivity under low illumination by utilizing the avalanche effect. Moreover, a photodiode including an organic semiconductor in the photoelectric conversion layer may be used.

Figure 5A:
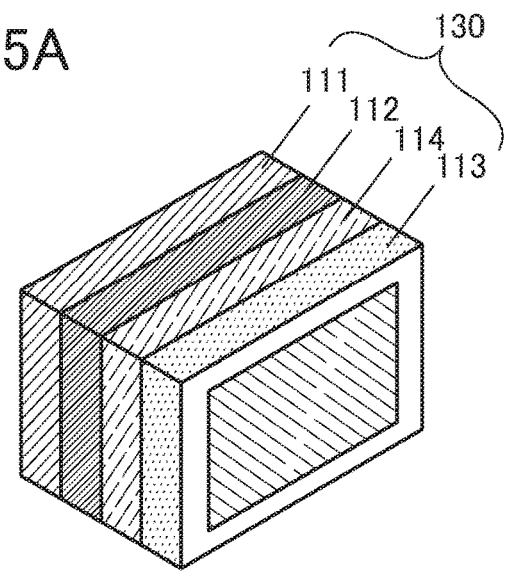
FIGS. 5A to 5D illustrate structure examples of an imaging display device.

Moreover, the imaging display device 100 may have a structure of an imaging display device 130 illustrated in FIG. 5A. The imaging display device 130 has a structure in which the layer 111, the layer 112, a layer 114, and the layer 113 are sequentially stacked.

In the imaging display device 130, the components of the imaging portion 101 can be provided in the layer 111, the layer 112, and the layer 114. Furthermore, the components of the display portion 102 can be provided in the layer 112, the layer 114, and the layer 113.

Figure 5B:
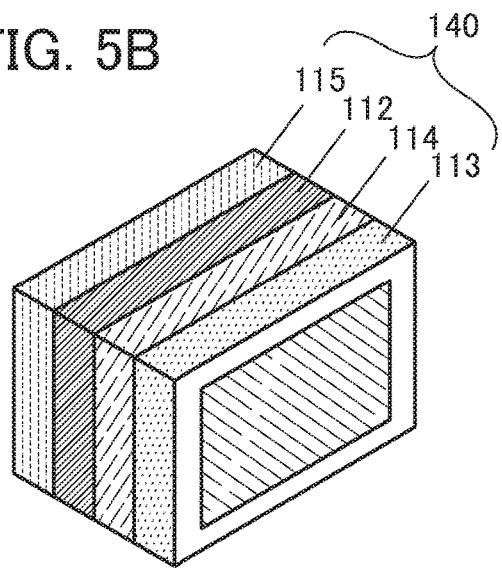
Figure 5C:
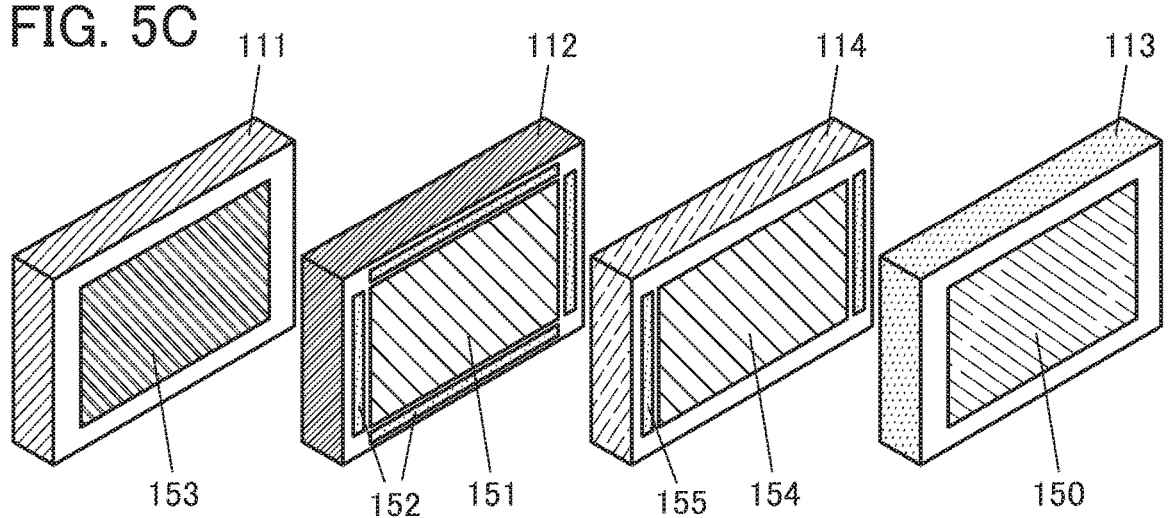

As in FIG. 5C illustrating the layers, the layer 114 includes a region 154 and regions 155. The region 154 and the regions 155 each include a transistor whose channel formation region is formed using a metal oxide. The number of regions 155 is more than one, and each of the regions 155 can be provided with a circuit having a function different from each other.

The region 154 has a structure in which both components of a pixel circuit of the imaging portion 101 (excluding the photoelectric conversion element) and components of a pixel circuit of the display portion 102 (excluding the display element) are provided. The regions 155 can be provided with a driver circuit or the like for the pixel circuits of the imaging portion 101 and the display portion 102.

Figure 6B:
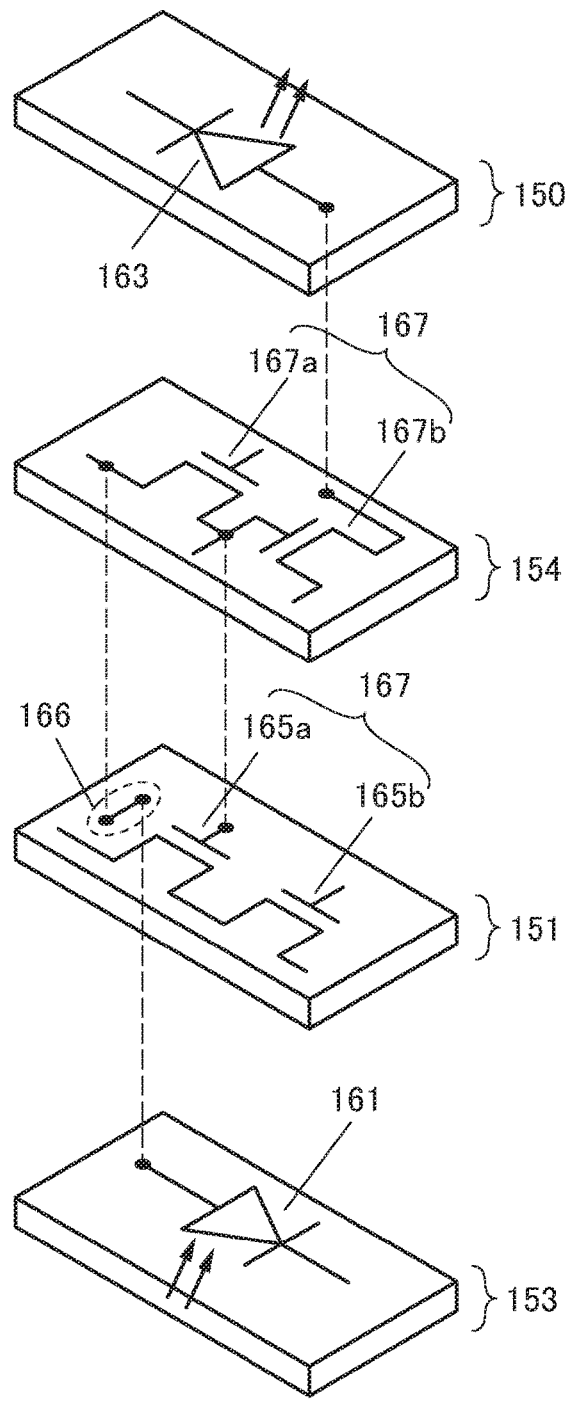

FIG. 6B illustrates an example of an electric connection between components constituting a pixel of the imaging display device 130. The region 153 includes the photoelectric conversion element 161. The region 151 includes a transistor 165a, a transistor 165b, and a connection portion 166. The region 154 includes a transistor 167a and a transistor 167b. The region 150 includes the display element 163.

The transistors 165a, 165b, 167a, and 167b are components of a pixel circuit 167 in the imaging portion 101 and the display portion 102. The connection portion 166 can be a through hole or the like formed in the silicon substrate.

The photoelectric conversion element 161, the transistors 165a and 165b, the transistors 167a and 167b, and the display element 163 are arranged in a matrix in the region 153, the region 151, the region 154, and the region 150, respectively.

The photoelectric conversion element 161 is placed so as to include a region overlapping with the transistors 165a and 165b. One electrode of the photoelectric conversion element 161 is electrically connected to one of a source and a drain of the transistor 167a through the connection portion 166.

One of the transistors 165a and 165b is placed so as to include a region overlapping with one of the transistors 167a and 167b. A gate of the transistor 165a is electrically connected to the other of the source and the drain of the transistor 167a.

The transistors 167a and 167b are placed so as to include a region overlapping with the display element 163. One of a source and a drain of the transistor 167b is electrically connected to one electrode of the display element 163.

Note that the other of the source and the drain of the transistor 167a is electrically connected to a gate of the transistor 167b. A circuit corresponding to the pixel circuit 167 will be described in detail later.

Figure 7B:
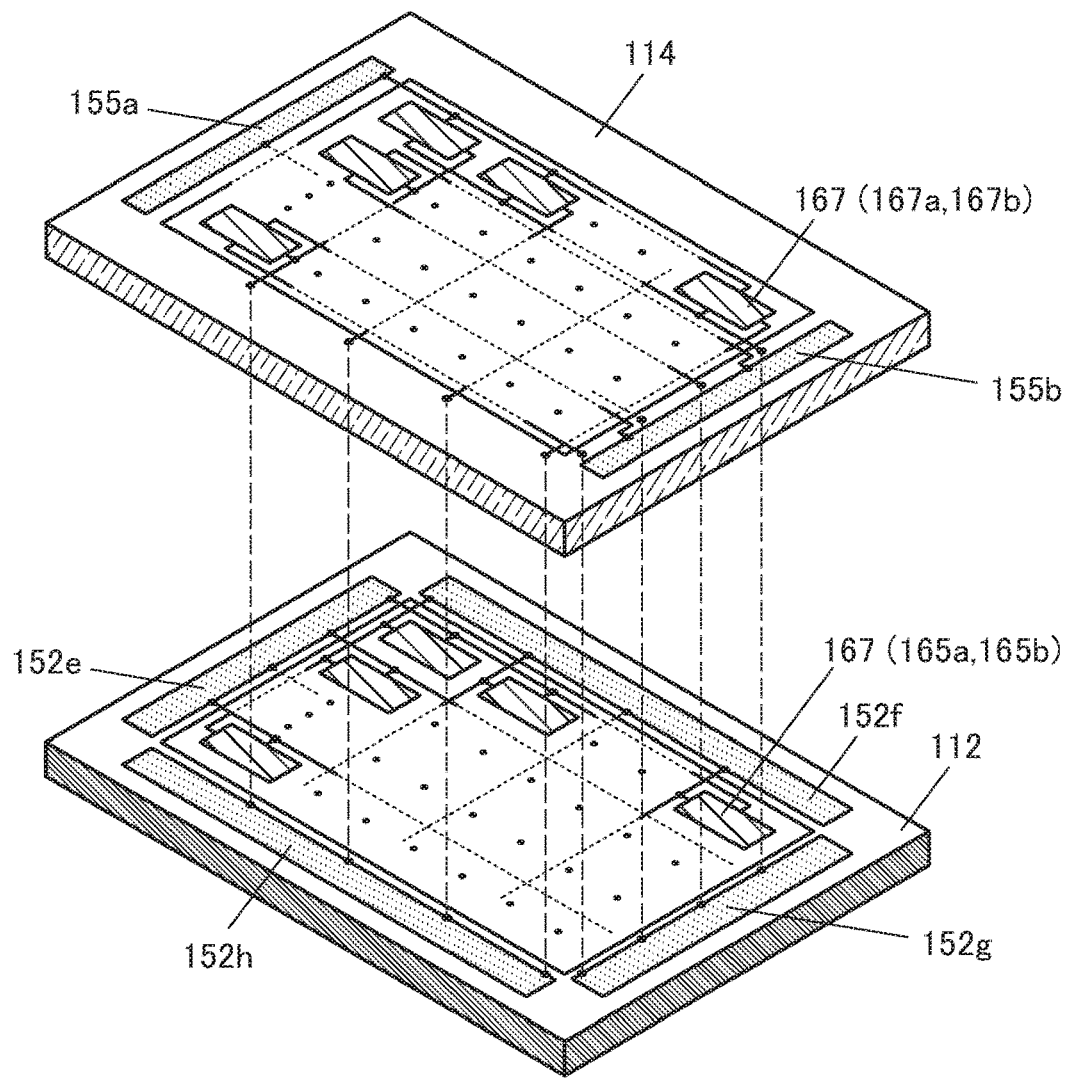

FIG. 7B illustrates an electric connection among the pixel circuit 167, circuits 155a and 155b in the regions 155, and circuits 152e, 152f, 152g, and 152h, in the imaging display device 130. Note that the circuits 155a, 155b, 152e, 152f, 152g, and 152h can have a function of driving the pixel circuit 167, a function of reading out a signal from the pixel circuit 167, or the like.

The circuits 155a and 155b provided in the layer 114 can have a function of a row driver for the display portion 102. The circuits 155a and 155b can each be electrically connected to the component of the pixel circuit 167 provided in the layer 114 through a wiring.

The circuit 152h provided in the layer 112 can have a function of a column driver for the display portion 102. The circuit 152h can be electrically connected to the component of the pixel circuit 167 provided in the layer 114 through a wiring.

The circuits 152e and 152g provided in the layer 112 can have a function of a row driver for the imaging portion 101. The circuit 152e can be electrically connected to the component of the pixel circuit 167 provided in the layer 112 through a wiring. The circuit 152g can be electrically connected to the component of the pixel circuit 167 provided in the layer 114 through a wiring.

The circuit 152f provided in the layer 112 can have a function of a column driver for the imaging portion 101. The circuit 152f may have a function of a CDS circuit for removing noise and a function of an A/D converter. The circuit 152f is electrically connected to the component of the pixel circuit 167 provided in the layer 112 through a wiring.

Figure 5D:
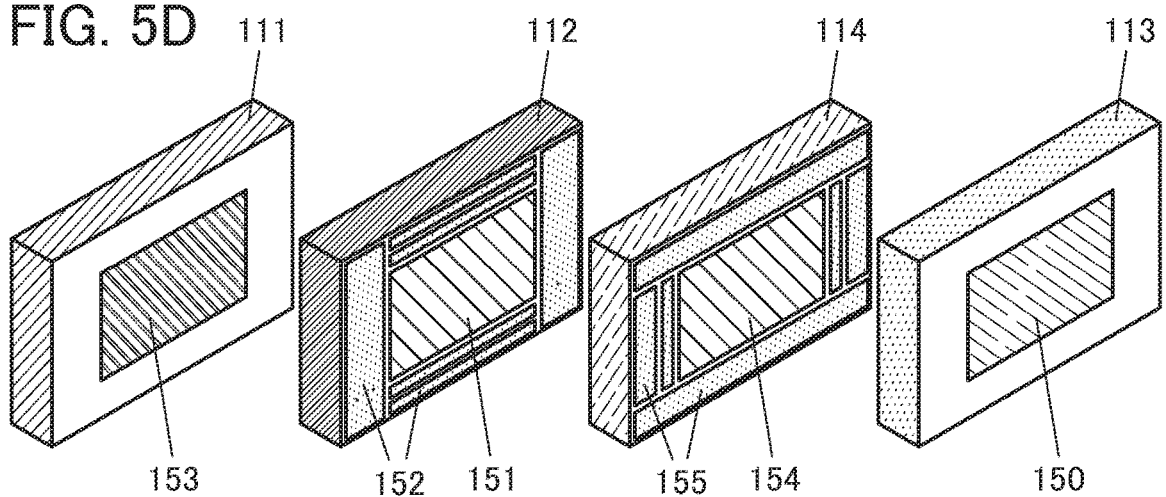

As in FIG. 5D illustrating the layers, by reducing the relative area of the region 154 in the layer 114, the relative area of the regions 155 in the layer 114 can be increased. In this case, the regions 155 may be provided with not only the above-described driver circuits but also any of components included in the data processing portion 200 or some circuits included in the components.

Furthermore, the imaging display device 100 may have a structure of an imaging display device 140 illustrated in FIG. 5B. The imaging display device 140 is different from the imaging display device 130 in the structure of the photoelectric conversion element and includes the layer 115 in which a photoelectric conversion element including selenium or a selenium compound is provided.

Although the circuits electrically connected to the imaging portion 101 or the display portion 102 are provided in the regions 152 or the regions 155 in the above-described examples, such circuits may be provided in an external IC chip.

Structure examples of a pixel circuit that can be used as the above-described pixel circuit 162 or 167 will be described with reference to FIGS. 8A to 8C, FIGS. 9A and 9B, FIGS. 10A and 10B, FIGS. 11A and 11B, FIGS. 12A and 12B, FIGS. 13A and 13B, and FIGS. 14A and 14B. Note that components (e.g., transistors) having functions common to FIGS. 8A to 8C, FIGS. 9A and 9B, FIGS. 10A and 10B, FIGS. 11A and 11B, FIGS. 12A and 12B, FIGS. 13A and 13B, and FIGS. 14A and 14B are denoted by the same reference numerals. Although not strictly separable, a portion which mainly operates as the pixels of the display portion 102 is referred to as a circuit portion 102a.

Figure 8A:
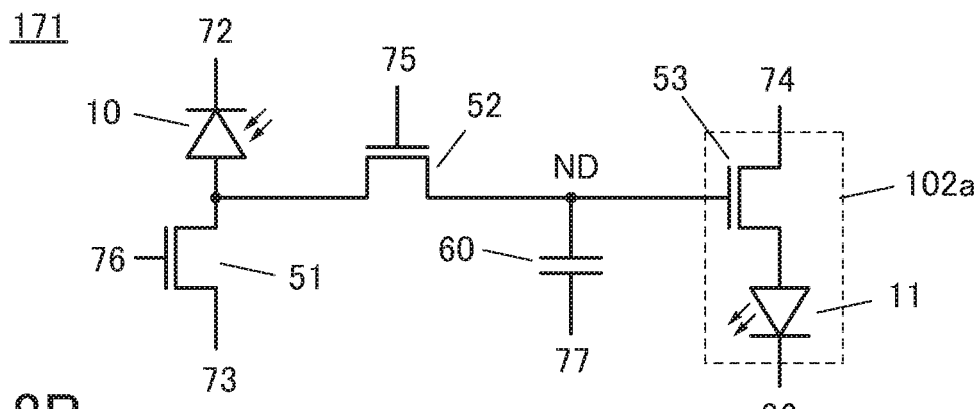
FIGS. 8A and 8B each illustrate a pixel circuit.

A pixel circuit 171 illustrated in FIG. 8A is a fundamental structure of one embodiment of the present invention. The pixel circuit 171 has a function of determining a potential of a charge detection portion ND by a photoelectric conversion element and making a display element emit light in accordance with the potential of the charge detection portion ND. Accordingly, an operation from image capturing to image display can be performed at high speed, without a step for data conversion or the like.

The pixel circuit 171 includes a photoelectric conversion element 10, a transistor 51, a transistor 52, a transistor 53, a display element 11, and a capacitor 60.

Note that the photoelectric conversion element 10 corresponds to the photoelectric conversion element 161 illustrated in FIG. 6A or 6B. The transistor 52 corresponds to the transistor 162a or 167a illustrated in FIG. 6A or 6B. The transistor 53 corresponds to the transistor 162b or 167b illustrated in FIG. 6A or 6B. The display element 11 corresponds to the display element 163 illustrated in FIG. 6A or 6B.

One of a source and a drain of the transistor 51 is electrically connected to one electrode (anode) of the photoelectric conversion element 10. The one electrode of the photoelectric conversion element 10 is electrically connected to one of a source and a drain of the transistor 52. The other of the source and the drain of the transistor 52 is electrically connected to a gate of the transistor 53. One of a source and a drain of the transistor 53 is electrically connected to one electrode (anode) of the display element 11. The gate of the transistor 53 is electrically connected to one electrode of the capacitor 60. Note that a structure without the capacitor 60 may also be employed.

The other electrode (cathode) of the photoelectric conversion element 10 is electrically connected to a wiring 72. A gate of the transistor 51 is electrically connected to a wiring 76. A gate of the transistor 52 is electrically connected to a wiring 75. The other of the source and the drain of the transistor 51 is electrically connected to a wiring 73. The other of the source and the drain of the transistor 53 is electrically connected to a wiring 74. The other electrode (cathode) of the display element 11 is electrically connected to a wiring 86. The other electrode of the capacitor 60 is electrically connected to a wiring 77.

The wirings 72, 73, 74, 77, and 86 can each have a function of a power supply line. For example, the wirings 73, 77, and 86 can function as low power supply lines, and the wiring 74 can function as a high power supply line. The wirings 75 and 76 can function as signal lines for controlling on/off of the transistors.

As the photoelectric conversion element 10, a photoelectric conversion element which causes the avalanche effect may be used to increase the light sensitivity under low illumination. A relatively high potential HVDD (e.g., higher than 10 V and higher than VDD) is necessary to cause the avalanche effect. Accordingly, it is preferable to electrically connect the wiring 72 to a power supply that can feed the potential HVDD. Note that the photoelectric conversion element 10 can also be used in the state of being supplied with a potential which does not cause the avalanche effect. Furthermore, an element which does not cause the avalanche effect can also be used as the photoelectric conversion element 10.

The transistor 51 can have a function of initializing the potential of the charge detection portion ND. The transistor 52 can have a function of controlling the charge detection portion ND. The transistor 53 can have a function of controlling a current that flows toward the display element 11 in accordance with the potential of the charge detection portion ND.

Figure 8B:
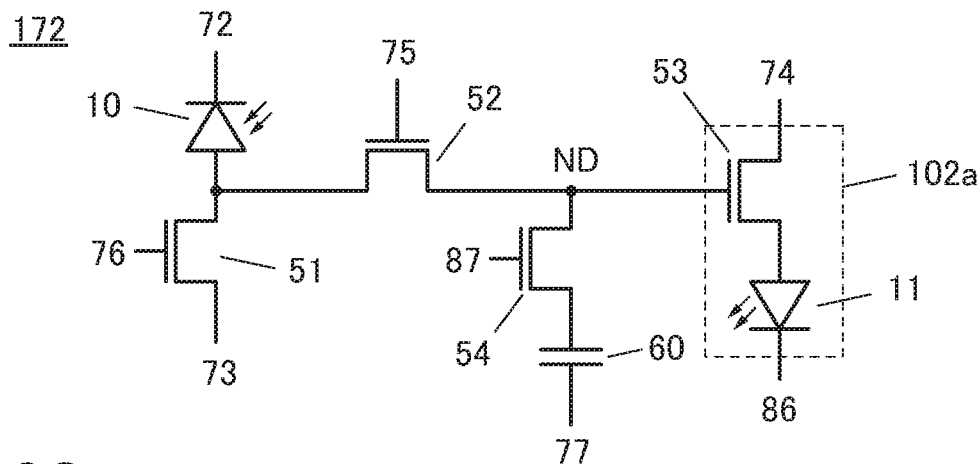

As in a pixel circuit 172 illustrated in FIG. 8B, one of a source and a drain of a transistor 54 may be electrically connected to the gate of the transistor 53, and the other of the source and the drain of transistor 54 may be electrically connected to the one electrode of the capacitor 60. In this case, a wiring 87 that can function as a signal line is electrically connected to a gate of the transistor 54.

With the structure of the pixel circuit 172, the capacitance of the charge detection portion ND can be varied. Thus, by turning off the transistor 54 under low illumination, an image can be captured with high sensitivity. Furthermore, by turning on the transistor 54 under high illumination, an image can be captured with low sensitivity.

In the pixel circuits 171 and 172, sensitivity-adjustable image capturing is possible also by setting the potential supplied to the wiring 74 to be variable. In particular, increasing the potential supplied to the wiring 74 is suitable for the uses such as a night scope because it can increase the luminance of the display element 11.

In the case where high voltage is applied to the photoelectric conversion element 10, a transistor connected to the photoelectric conversion element 10 needs to withstand the high voltage. As the transistor that can withstand high voltage, for example, a transistor including a metal oxide in a channel formation region (hereinafter referred to as an OS transistor) or the like can be used. Specifically, OS transistors are preferably used as the transistors 51 and 52.

A period during which charges can be held in the charge detection portion ND can be extremely long owing to the low off-state current characteristics of the transistors 51 and 52. Therefore, a global shutter system in which charge accumulation operation is performed in all the pixels at the same time can be used without complicating the circuit structure and operation method.

Accordingly, in the case where high voltage is applied to the photoelectric conversion element 10, the structure of the imaging display device 130 or 140 is preferably used. Note that in the case where the pixel circuit 171 or 172 is used in the imaging display device 130 or 140, the transistors 165a and 165b are not necessary.

Moreover, in the case where the photoelectric conversion element 10 is used without application of high voltage, transistors including silicon in their active layers or active regions (hereinafter referred to as Si transistors) may be used as the transistors 51 and 52. Accordingly, the structure of the imaging display device 110 or 120 can also be used.

As the display element 11, a light-emitting element is preferably used. An organic EL element (OLED) including an organic light-emitting layer or the like can be used as the light-emitting element. An organic EL element shows diode characteristics and a current can flow therethrough by application of a forward bias. By adjusting the current with the transistor, the luminance can be changed.

Figure 8C:
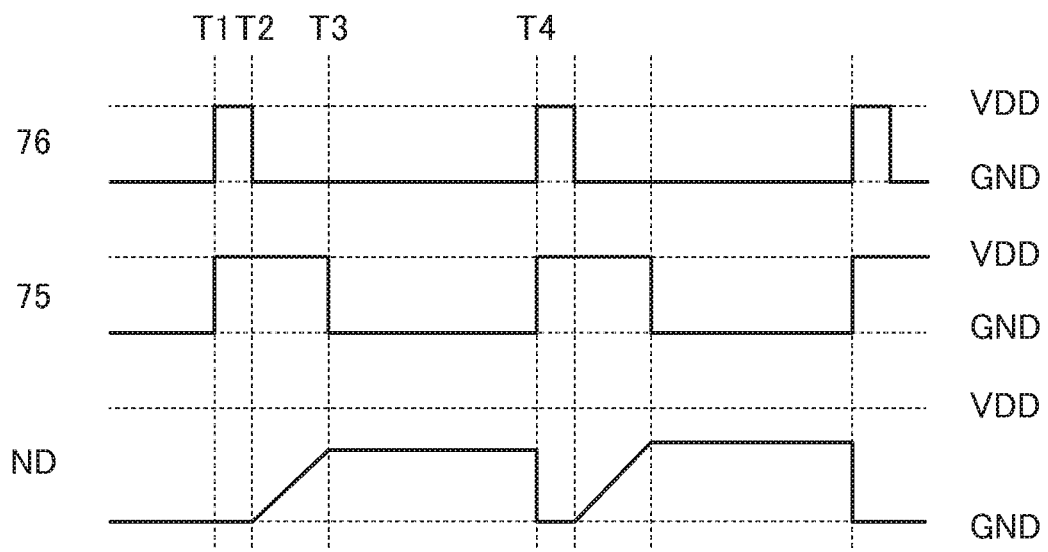
FIG. 8C is a timing chart.

Next, a fundamental operation of the pixel circuits 171 and 172 will be described with reference to a timing chart of FIG. 8C. Note that in the following operation example, VDD and GND are supplied to the wirings 75 and 76 as "H" and "L", respectively; VDD is supplied to the wirings 72 and 74; and GND is supplied to the wirings 73, 77, and 86. Other potentials can also be supplied to the wirings.

At Time T1, the wiring 76 is set at "H" and the wiring 75 is set at "H", to make the charge detection portion ND have a reset potential (GND) (reset operation). At this time, the transistor 53 is off and the display element 11 does not emit light.

At Time T2, the wiring 76 is set at "L" and the wiring 75 is set at "H", to make the potential of the charge detection portion ND start changing (accumulation operation). The potential of the charge detection portion ND is changed from GND to VDD at the maximum depending on the intensity of light that has entered the photoelectric conversion element 10.

At Time T3, the wiring 75 is set at "L" to settle the potential of the charge detection portion ND. At this time, if the potential of the charge detection portion ND is higher than the threshold of the transistor 53, the transistor 53 is turned on, and the display element 11 emits light in accordance with the current value (display operation).

The display state continues for a certain period of time, and then the reset operation is performed again at Time T4. The above-described operations are repeated; thus, image capture and display operations can be performed at high speed. Furthermore, black display is inserted by the reset operation at proper intervals, which can reduce the afterimage or the like of moving images.

In the case where the pixel circuits 171 and 172 are used, image capture and display of images can be performed by the above-described simple control method. In such a case, a pixel selection circuit or the like such as a shift register is unnecessary, and the reset operation, the accumulation operation, or the display operation can be performed in all the pixels at the same time.

Figure 9A:
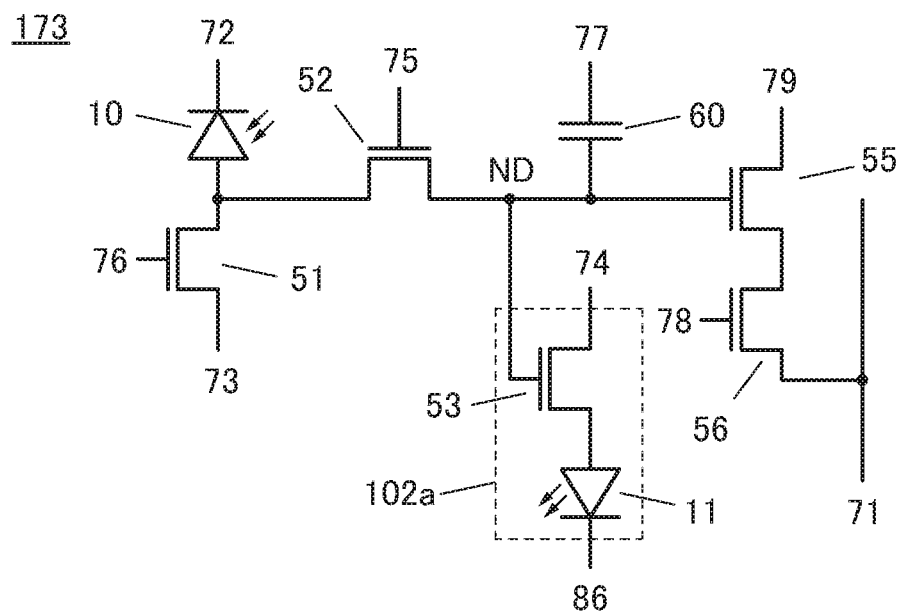
FIG. 9A illustrates a pixel circuit.

Furthermore, one embodiment of the present invention may have a structure of a pixel circuit 173 illustrated in FIG. 9A. The pixel circuit 173 is different from the pixel circuit 171 in having a capability of outputting captured data to the outside of the pixel.

The pixel circuit 173 includes the structure of the pixel circuit 171, a transistor 55, and a transistor 56. A gate of the transistor 55 is electrically connected to the other of the source and the drain of the transistor 52. One of a source and a drain of the transistor 55 is electrically connected to one of a source and a drain of the transistor 56.

Note that the transistor 55 corresponds to the transistor 165a illustrated in FIG. 6B. The transistor 53 corresponds to the transistor 165b illustrated in FIG. 6B. The transistors 55 and 56 may also be provided in the region 151 of the imaging display devices 110 and 120.

The other of the source and the drain of the transistor 55 is electrically connected to a wiring 79. The other of the source and the drain of the transistor 56 is electrically connected to a wiring 71. A gate of the transistor 56 is electrically connected to a wiring 78.

The wiring 79 can have a function of a power supply line. For example, the wiring 79 can function as a high potential power supply line. The wiring 71 can have a function of an output line which outputs a signal from the pixel. The wiring 78 can function as a signal line which controls on/off of the transistor.

The transistor 55 can have a function of outputting a signal determined in accordance with the potential of the charge detection portion ND. The transistor 56 can have a function of selecting a pixel from which a signal is read.

Because the transistor 55 is desired to have excellent amplifying characteristics, the transistor 55 preferably has a high on-state current. Accordingly, it is preferable to use Si transistors as the transistors 55 and 56. As a matter of course, OS transistors may be used as the transistors 55 and 56.

Next, a fundamental operation of the pixel circuit 173 will be described with reference to a timing chart of FIG. 9B. Note that in the following operation example, VDD and GND are supplied to the wirings 75, 76, and 78 as "H" and "L", respectively; VDD is supplied to the wirings 72, 74, and 79; and GND is supplied to the wirings 73, 77, and 86. Other potentials can also be supplied to the wirings.

The description of FIG. 8B can be referred to for operations from Time T1 to Time T3.

At Time T4, the wiring 78 is set at "H" to turn on the transistor 56. Thus, an image signal corresponding to the potential of the charge detection portion ND is output to the wiring 71.

At Time T5, the reset operation is performed again. The above-described operations are repeated; thus, image capture and display operations can be performed at high speed and image data can be output to the outside.

In the case where the pixel circuit 173 is used, a row driver and a column driver for selecting a pixel for image capture are necessary. The row driver and the column driver can be provided in the regions 152 or the like.

Figure 10A:
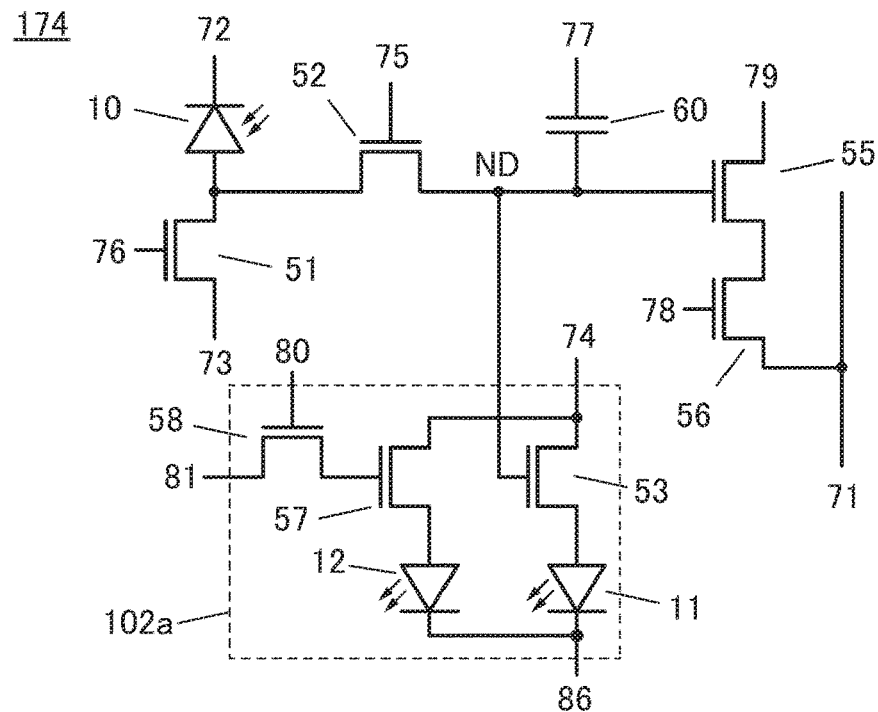
FIG. 10A illustrates a pixel circuit.

Furthermore, one embodiment of the present invention may have a structure of a pixel circuit 174 illustrated in FIG. 10A. The pixel circuit 174 is different from the pixel circuit 173 in having a capability of displaying a given image superimposed on a captured image.

The pixel circuit 174 includes the structure of the pixel circuit 173, a transistor 57, a transistor 58, and a display element 12.

One of a source and a drain of the transistor 57 is electrically connected to one electrode of the display element 12. A gate of the transistor 57 is electrically connected to one of a source and a drain of the transistor 58. The other of the source and the drain of the transistor 57 is electrically connected to the wiring 74. The other electrode of the display element 12 is electrically connected to the wiring 86. The other of the source and the drain of the transistor 58 is electrically connected to a wiring 81. A gate of the transistor 58 is electrically connected to a wiring 80.

Note that the transistors 57 and 58 can be provided in the region 151 of the imaging display devices 110 and 120 or the region 154 of the imaging display devices 130 and 140. An element similar to the display element 11 can be used as the display element 12. The display element 12 can be provided in the region 150.

The wirings 80 and 81 can have a function of signal lines. For example, the wiring 80 can function as a signal line which controls on/off of the transistor 58. The wiring 81 can function as a signal line which supplies an image signal.

The transistor 57 can have a function of controlling a current that flows toward the display element 12 in accordance with the potential supplied from the wiring 81. The transistor 58 can have a function of selecting a pixel which displays a given image.

Since the imaging display device using the pixel circuit 174 can display a given image using the transistors 57 and 58 and the display element 12, AR display in which data is superimposed on the displayed reality can be performed.

Figure 10B:
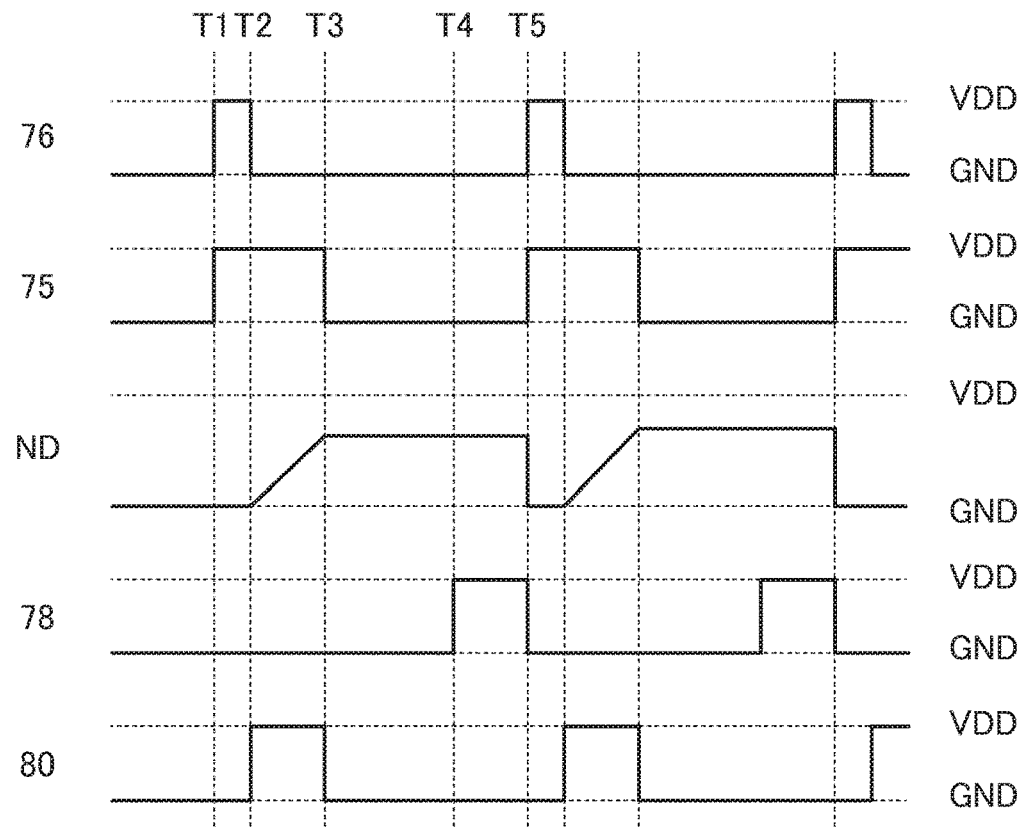
FIG. 10B is a timing chart.

Next, a fundamental operation of the pixel circuit 173 will be described with reference to a timing chart of FIG. 10B. Note that in the following operation example, VDD and GND are supplied to the wirings 75, 76, 78, and 80 as "H" and "L", respectively; VDD is supplied to the wirings 72, 74, and 79; GND is supplied to the wirings 73, 77, and 86; and an arbitrary potential (image signal) is supplied to the wiring 81. Other potentials can also be supplied to the wirings.

The description of FIG. 8B can be referred to for an operation at Time Ti.

At Time T2, the wiring 76 is set at "L", the wiring 75 is set at "H", and the wiring 80 is set at "H", to make the potential of the charge detection portion ND start changing (accumulation operation). The potential of the charge detection portion ND is changed from GND to VDD at the maximum depending on the intensity of light that has entered the photoelectric conversion element 10. In addition, an image signal supplied from the wiring 81 is written to the gate of the transistor 57.

At Time T3, the wiring 75 is set at "L" and the wiring 80 is set at "L", to settle the potential of the charge detection portion ND. At this time, if the potential of the charge detection portion ND is higher than the threshold of the transistor 53, the transistor 53 is turned on, and the display element 11 emits light in accordance with the current value. Furthermore, if the potential of the gate of the transistor 57 is higher than the threshold of the transistor 57, the transistor 57 is turned on, and the display element 12 emits light in accordance with the current value (display operation).

Figure 9B:
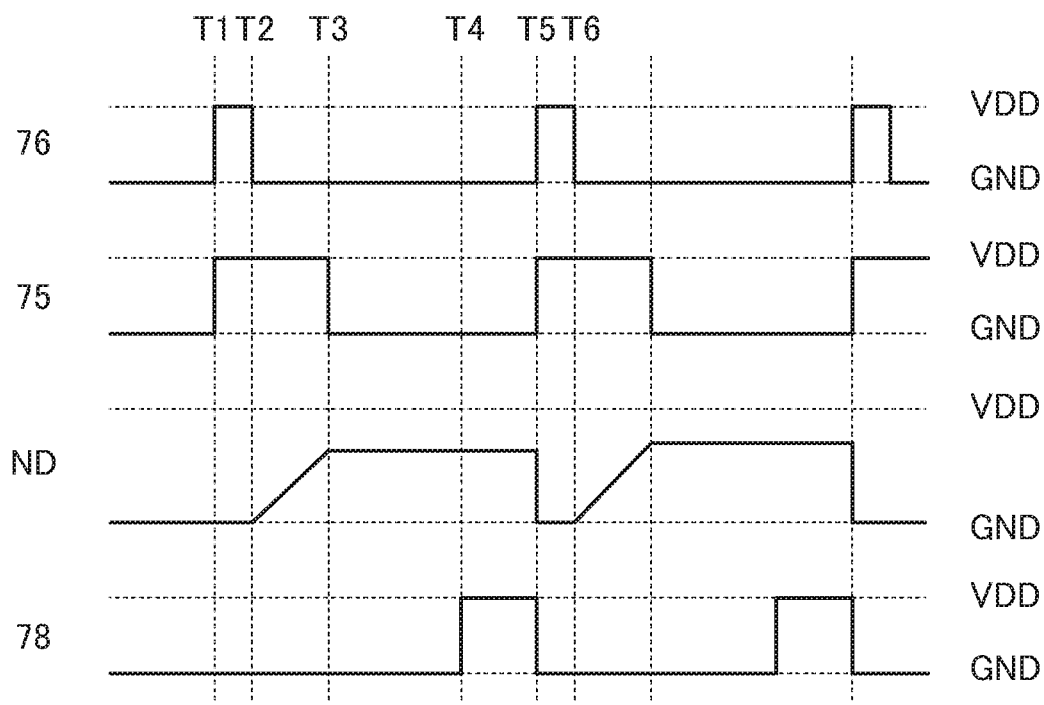
FIG. 9B is a timing chart.

The description of FIG. 9B can be referred to for an operation after Time T4.

In the case where the pixel circuit 174 is used, a row driver and a column driver for selecting a pixel for image capturing and display are necessary. The row driver and the column driver can be provided in the regions 152 and 155 or the like.

Figure 11A:
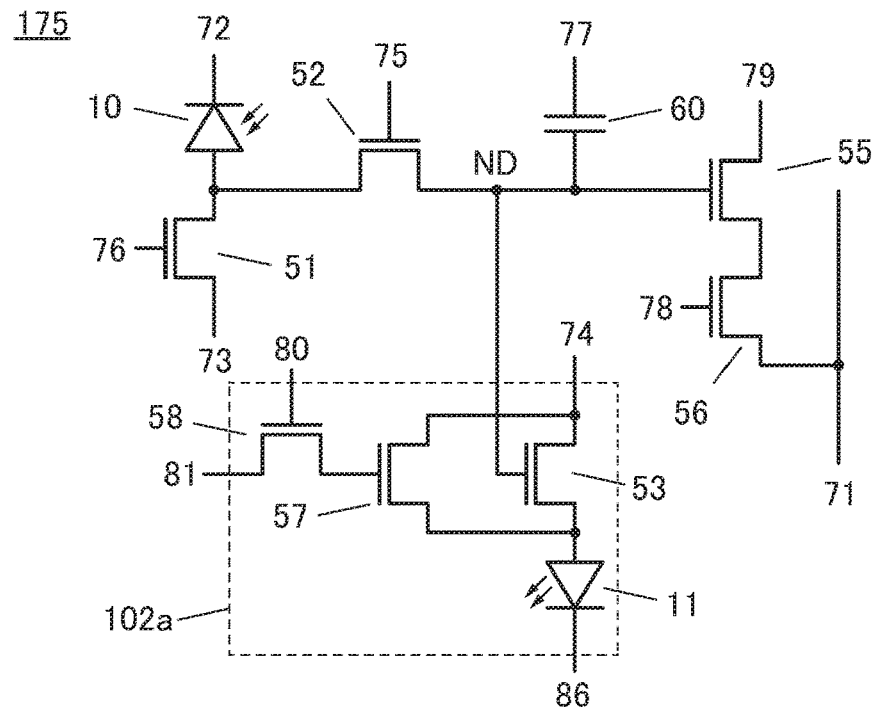
FIGS. 11A and 11B each illustrate a pixel circuit.

Moreover, one embodiment of the present invention may have a structure of a pixel circuit 175 illustrated in FIG. 11A. The pixel circuit 175 has a structure in which the display element 12 is eliminated from the pixel circuit 174, where the other of the source and the drain of the transistor 57 is electrically connected to the one electrode of the display element 11.

In the structure illustrated in FIG. 10A, either of the display elements 11 and 12 having a higher emission intensity is dominant in the displayed image. Thus, in order that an arbitrary image is displayed by the display element 12, the emission intensity of the display element 12 has to be increased so that the display element 12 can overwrite the image displayed by the display element 11. In the structure of FIG. 11A, the display element 12 can be eliminated because a signal can be input from the wiring 81 to overwrite the previous image displayed by the display element 11.

Figure 11B:
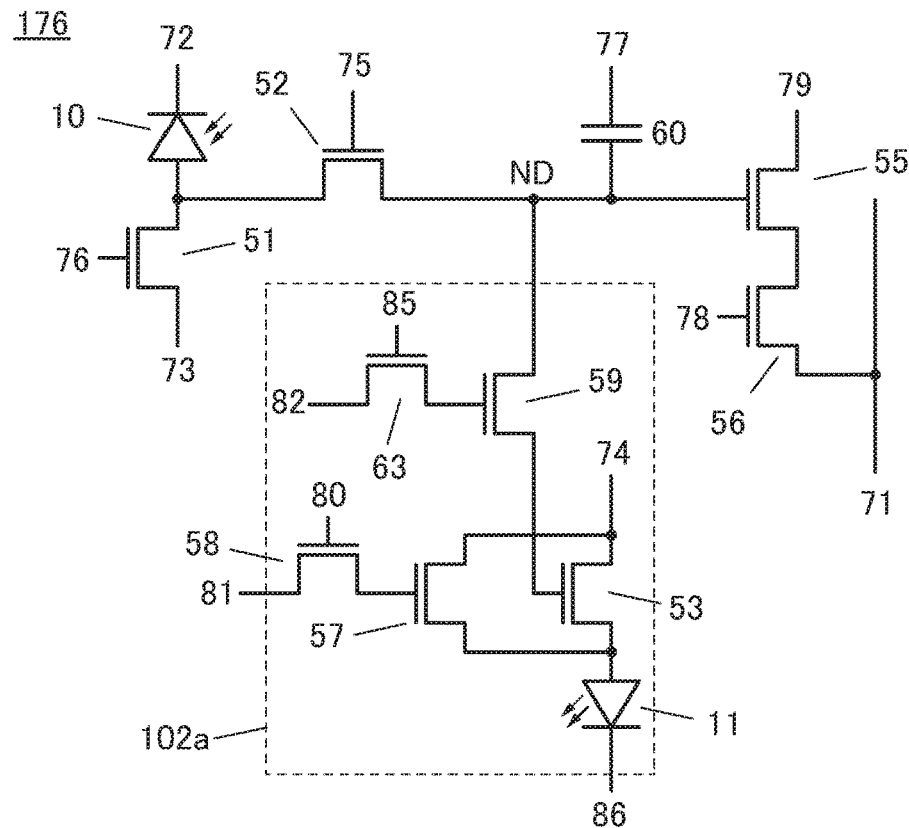

Moreover, one embodiment of the present invention may have a structure of a pixel circuit 176 illustrated in FIG. 11B. The pixel circuit 176 includes the structure illustrated in FIG. 11A, a transistor 59, and a transistor 63.

One of a source and a drain of the transistor 59 is electrically connected to the other of the source and the drain of the transistor 52. The other of the source and the drain of the transistor 59 is electrically connected to the gate of the transistor 53. A gate of the transistor 59 is electrically connected to one of a source and a drain of the transistor 63. A gate of the transistor 63 is electrically connected to a wiring 85. The other of the source and the drain of the transistor 63 is electrically connected to a wiring 82.

The wiring 82 can function as a signal line which controls on/off of the transistor 59. The wiring 85 can function as a signal line which selects a pixel. Note that a structure without the transistor 63, where the gate of the transistor 59 is electrically connected to the wiring 82, can be employed as well.

When the transistor 59 is turned off, display of an image simultaneous with image capture can be stopped. When the transistor 59 is turned off in all the pixels, arbitrary image data supplied from the wiring 81 can be displayed in the entire display portion 102. Data that has been taken out to the outside through the wiring 71 and processed may be supplied from the wiring 81 and displayed. In this case, for example, the captured image can be subjected to enlargement, processing, or the like.

When a pixel is selected and the transistor 59 is turned off, display of an image simultaneous with image capture can be stopped in the selected pixel. Furthermore, when the transistor 59 is turned off in a reset period, the transistor 53 is off and black display can be performed. By displaying arbitrary image data supplied form the wiring 81 on the background pixel where black display is performed, vivid AR display can be performed.

Note that if a low potential power supply line is electrically connected to the gate of the transistor 53 via a switch (e.g., a transistor), the transistor 53 can be turned off and black display can be performed at any given time as well as in the reset period.

Figure 12A:
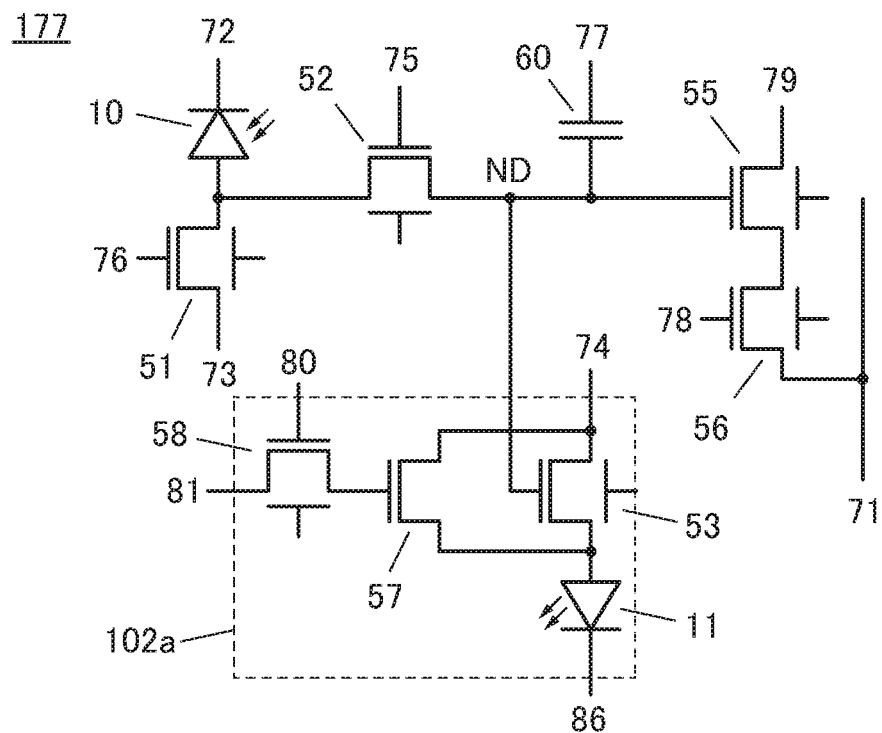
FIGS. 12A and 12B each illustrate a pixel circuit.

Furthermore, one embodiment of the present invention may have a structure of a pixel circuit 177 illustrated in FIG. 12A. In the pixel circuit 177, each transistor has a backgate. The application of a constant voltage to the backgate can adjust the threshold of the transistor. The same potential as the potential applied to the front gate may be applied to control the on-state current and the off-state current. Although all of the transistors have a backgate in FIG. 12A, a transistor not provided with a backgate may also be included.

Figure 12B:
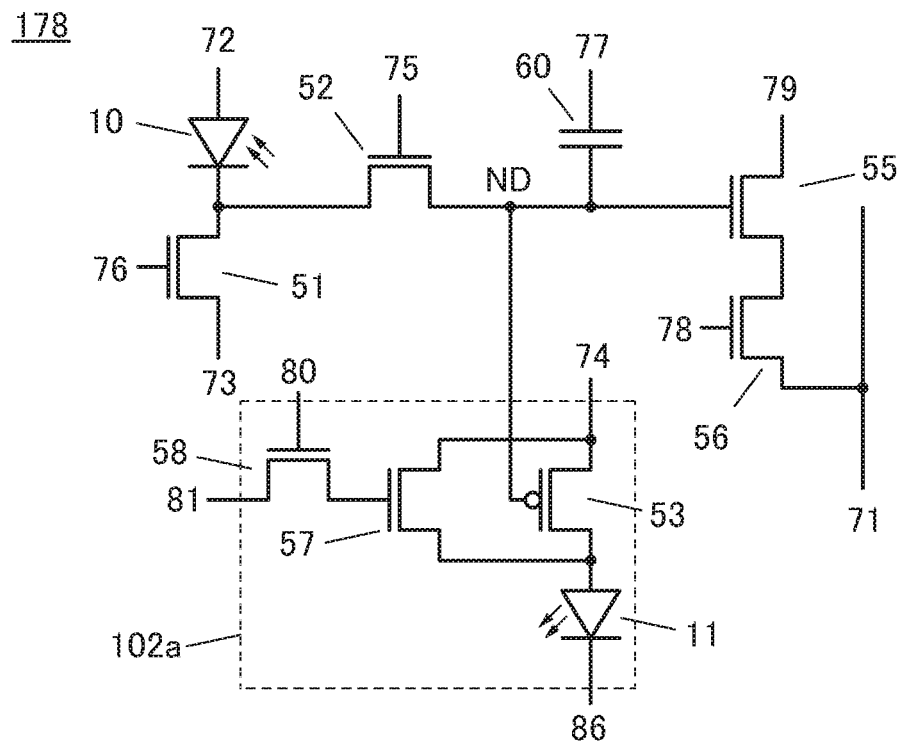

Furthermore, one embodiment of the present invention may have a structure of a pixel circuit 178 illustrated in FIG. 12B. The pixel circuit 178 is an example of a structure in which the charge detection portion ND can be reset to a high potential in the operation.

The pixel circuit 178 is different from the above-described pixel circuit in that the connection direction of the photoelectric conversion element 10 is opposite and the transistor 53 is of a p-channel type. In this example, the transistor 53 is preferably a Si transistor. In the operation of the pixel circuit 178, the wiring 72 is set at a low potential, and the wiring 73 is set at a high potential.

In the pixel circuit 178, the potential of the charge detection portion ND is relatively low when the light intensity is high, and is relatively high when the light intensity is low. Accordingly, a p-channel transistor is used as the transistor 53 so that bright light can be emitted from the display element 11 when the potential of the charge detection portion ND is low.

Figure 13A:
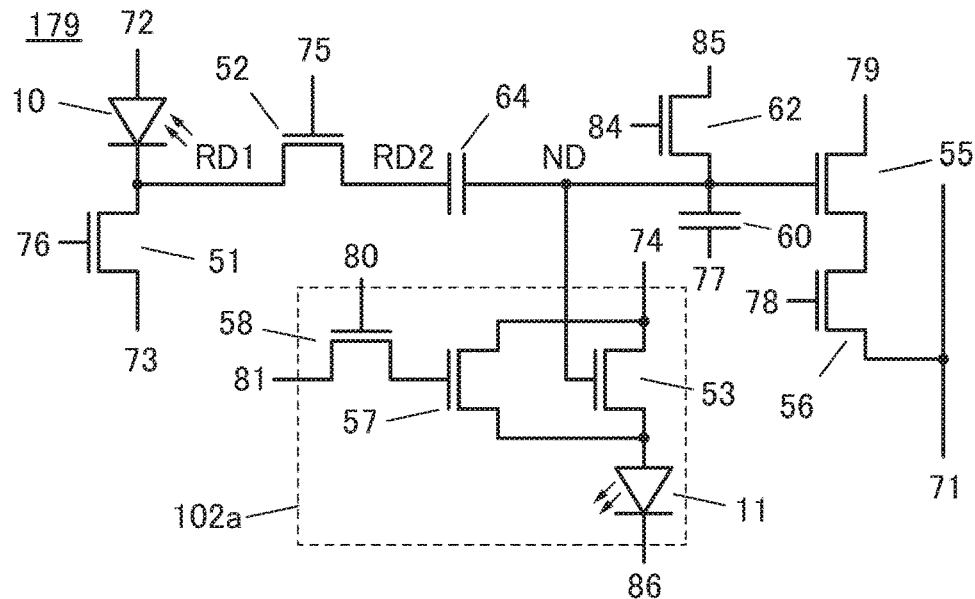
FIG. 13A illustrates a pixel circuit.

Furthermore, one embodiment of the present invention may have a structure of a pixel circuit 179 illustrated in FIG. 13A. The pixel circuit 179 can reset the charge detection portion ND to a high potential in the operation.

The pixel circuit 179 includes a transistor 62 and a capacitor 64 in addition to the structure of the pixel circuit 175. One of a source and a drain of the transistor 62 is electrically connected to the gate of the transistor 55. One electrode of the capacitor 64 is electrically connected to the other of the source and the drain of the transistor 52. The other electrode of the capacitor 64 is electrically connected to the gate of the transistor 55. Furthermore, the connection direction of the photoelectric conversion element 10 is opposite to that in the pixel circuit 175.

The other of the source and the drain of the transistor 62 is electrically connected to the wiring 85, and a gate of the transistor 62 is electrically connected to a wiring 84. The wiring 85 can have a function of a power supply line and can supply a high potential. The wiring 84 can have a function of a signal line which controls on/off of the transistor 62.

Note that a wiring which connects the one electrode of the photoelectric conversion element 10 to the one of the source and the drain of the transistor 52 is referred to as a charge accumulation portion RD1. In addition, a wiring which connects the other of the source and the drain of the transistor 52 to the capacitor 64 is referred to as a charge accumulation portion RD2.

Figure 13B:
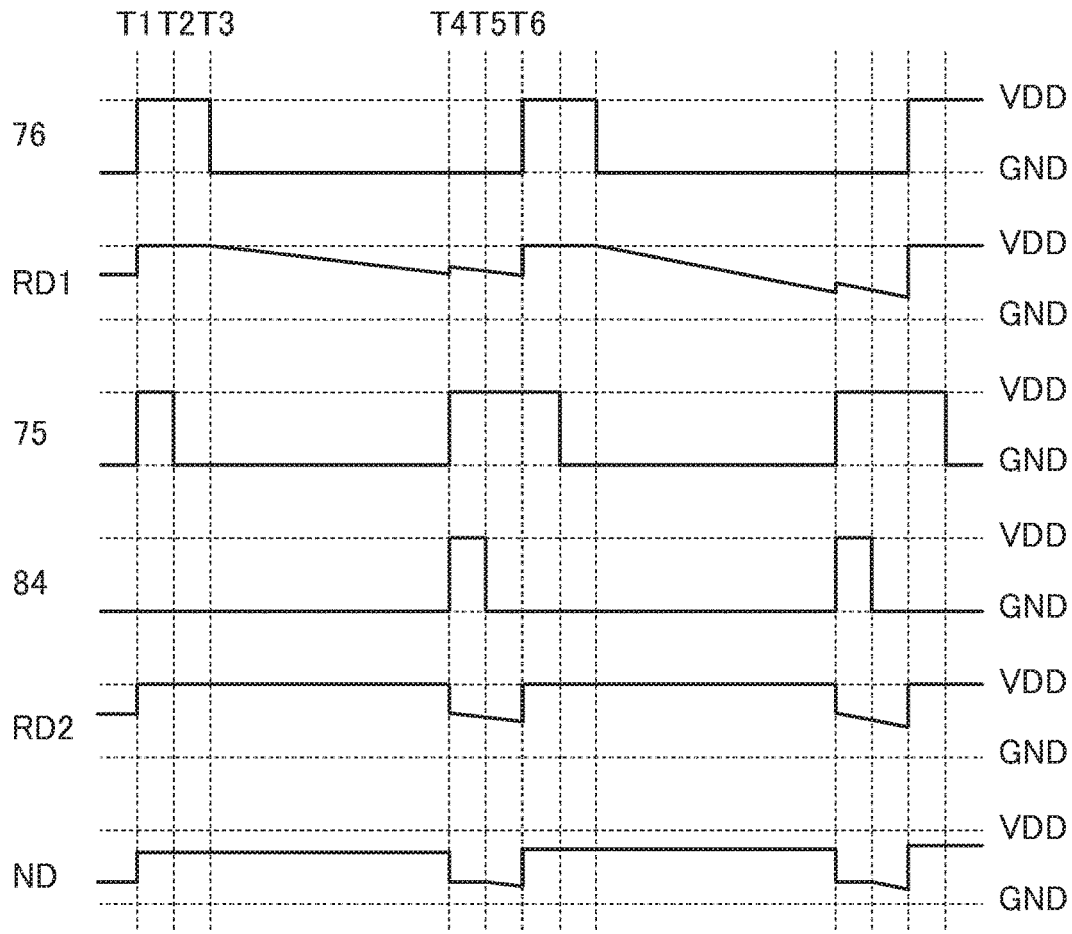
FIG. 13B is a timing chart.

Next, a fundamental operation of the pixel circuit 179 will be described with reference to a timing chart of FIG. 13B. Note that in the following operation example, VDD and GND are supplied to the wirings 75, 76, 78, 80, and 84 as "H" and "L", respectively; GND is supplied to the wirings 72, 77, and 85; VDD is supplied to the wirings 73, 74, and 79; and an arbitrary potential (image signal) is supplied to the wiring 81. Other potentials can also be supplied to the wirings.

At Time T1, the wiring 76 is set at "H" and the wiring 75 is set at "H", to set the potentials of the charge accumulation portions RD1 and RD2 to a first reset potential (VDD). At this time, in some cases, the potential of the charge detection portion ND is increased owing to capacitive coupling by the capacitor 64, which turns on the transistor 53, leading to light emission from the display element 11.

At Time T2, the wiring 75 is set at "L", and at Time T3, the wiring 76 is set at "L", to make the potential of the charge accumulation portion RD1 start changing. The potential of the charge accumulation portion RD1 is changed from VDD to GND at the minimum depending on the intensity of light that has entered the photoelectric conversion element 10.

At Time T4, the wiring 75 is set at "H" and the wiring 84 is set at "H", so that the potential of the charge accumulation portion RD2 becomes equal to the potential of the charge accumulation portion RD1. In addition, the potential of the charge detection portion ND is set at a second reset potential.

At Time T5, the wiring 84 is set at "L", so that the potential of the charge detection portion ND is decreased owing to capacitive coupling by the capacitor 64.

At Time T6, the wiring 76 is set at "H", so that the potential of the charge accumulation portion RD1 becomes the first reset potential (VDD). In other words, the potentials of the charge accumulation portions RD1 and RD2 are increased by the amount decreased in the exposure period (from Time T3 to Time T6). At this time, the potential of the charge detection portion ND is increased in response to the increase in the potentials of the charge accumulation portions RD1 and RD2 due to capacitive coupling by the capacitor 64. That is, the charge detection portion ND becomes to have a potential reflecting the exposure period, and the display element 11 emits light in accordance with the potential.

In this operation, the higher the light intensity, the potentials of the charge accumulation portions RD1 and RD2 are lower in the exposure period, increasing the difference between the potentials of the charge accumulation portions RD1 and RD2 and the first reset potential. Thus, when the light intensity is high, the potential of the charge detection portion ND is relatively high, and when the light intensity is low, the potential of the charge detection portion ND is relatively low.

Thus, even in the case where the transistor 53 is of an n-channel type, the pixel circuit 179 can be configured so that the display element 11 emits bright light when the potential of the charge detection portion ND is high.

Note that T6 corresponds to T1, and the repetition of the above-described operation enables high-speed image capture and display operation.

Figure 14A:
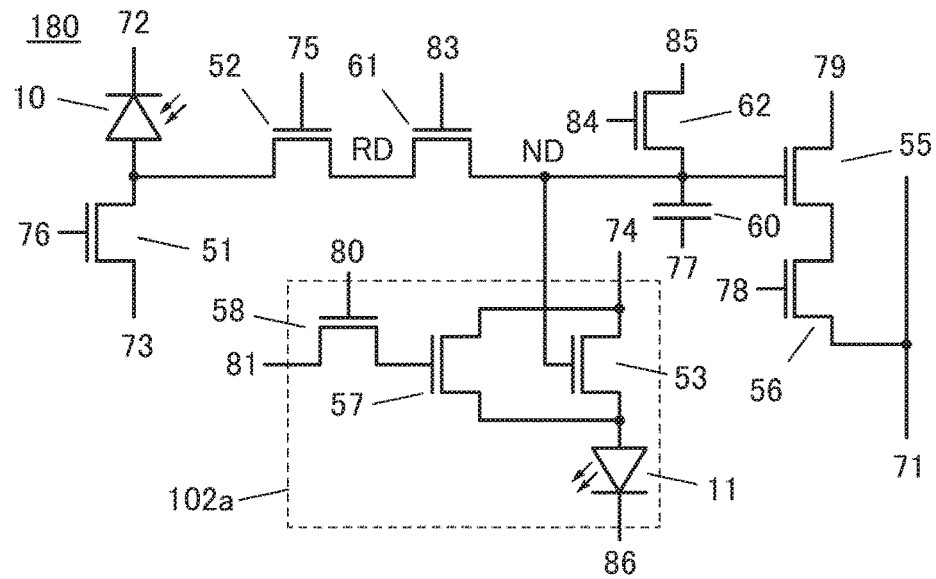
FIG. 14A illustrates a pixel circuit.

Furthermore, one embodiment of the present invention may have a structure of a pixel circuit 180 illustrated in FIG. 14A. The pixel circuit 180 is an example of a pixel circuit for correlated double sampling which cancels out noise of a component included in a circuit, such as a transistor. Note that a CDS circuit which performs correlated double sampling is provided so as to be electrically connected to the wiring 71. In the correlated double sampling, a signal at the time of the reset operation is subtracted from an image signal taken out to the wiring 71.

The pixel circuit 180 is obtained by replacing the capacitor 64 of the pixel circuit 179 with a transistor 61. In addition, the connection direction of the photoelectric conversion element is opposite to that in the pixel circuit 179. One of a source and a drain of the transistor 61 is electrically connected to the other of the source and the drain of the transistor 52. The other of the source and the drain of the transistor 61 is electrically connected to the gate of the transistor 55.

A gate of the transistor 61 is electrically connected to a wiring 83. The wiring 83 can have a function of a signal line which controls on/off of the transistor 61.

Note that a wiring which connects the other of the source and the drain of the transistor 52 to the one of the source and the drain of the transistor 61 is referred to as a charge accumulation portion RD.

Figure 14B:
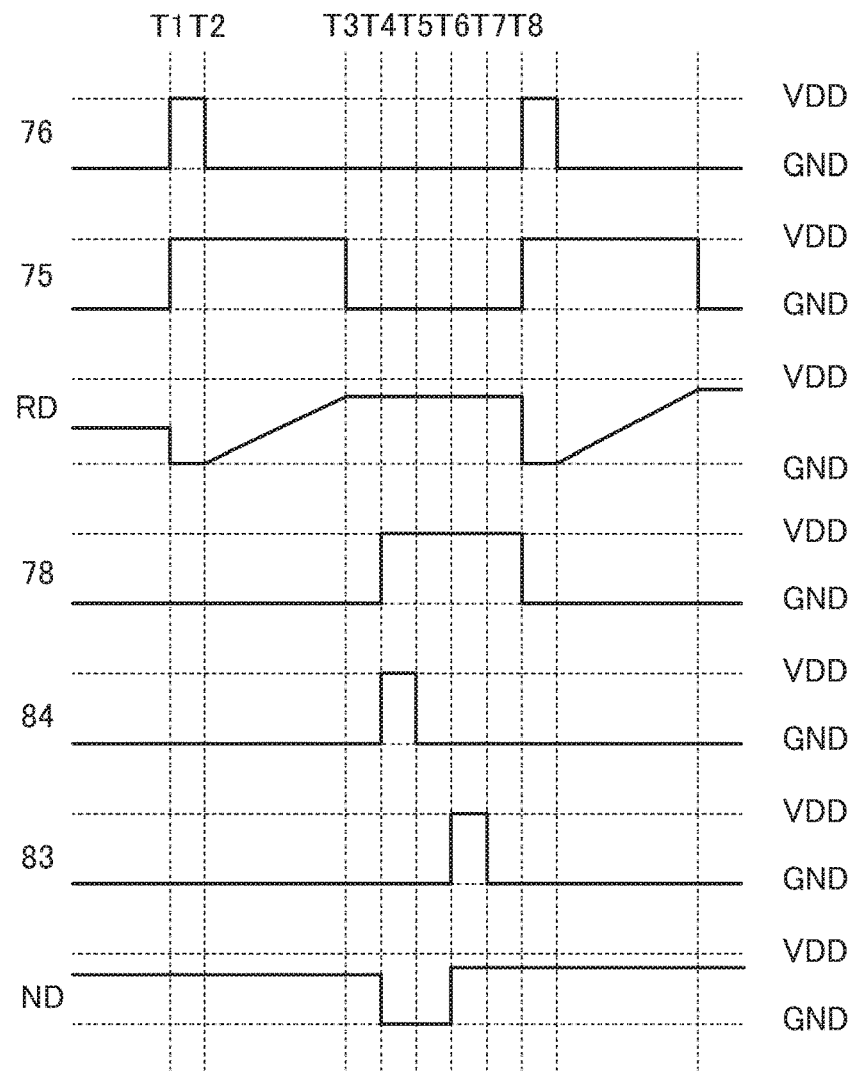
FIG. 14B is a timing chart.

Next, a fundamental operation of the pixel circuit 180 will be described with reference to a timing chart of FIG. 14B. Note that in the following operation example, VDD and GND are supplied to the wirings 75, 76, 78, 80, and 84 as "H" and "L", respectively; VDD is supplied to the wirings 72, 74, and 79; GND is supplied to the wirings 73, 77, and 85; and an arbitrary potential (image signal) is supplied to the wiring 81. Other potentials can also be supplied to the wirings.

At Time T1, the wiring 76 is set at "H" and the wiring 75 is set at "H", to make the charge accumulation portion RD have a reset potential (GND) (reset operation).

At Time T2, the wiring 76 is set at "L" to make the potential of the charge accumulation portion RD start changing (accumulation operation). The potential of the charge accumulation portion RD is changed from GND to VDD at the maximum depending on the intensity of light that has entered the photoelectric conversion element 10.

At Time T3, the wiring 75 is set at "L" to settle the potential of the charge accumulation portion RD.

At Time T4, the wiring 78 is set at "H" and the wiring 84 is set at "H", so that the potential of the charge detection portion ND becomes the reset potential (GND) and the reset potential (GND) containing a noise signal due to a transistor or the like is read to the wiring 71. In this case, the reset potential (GND) is stored in the CDS circuit. Note that the display element 11 does not emit light at Time T4.

The wiring 84 is set at "L" at Time T5, and the wiring 83 is set at "H" at Time T6, so that the potential of the charge detection portion ND becomes equal to the potential of the charge accumulation portion RD and a potential of an image signal containing a noise signal due to a transistor or the like is read to the wiring 71. At Time T5, the display element 11 emits light in accordance with the potential of the charge detection portion ND.

The CDS circuit performs an operation of subtracting the previously stored reset potential (GND) containing the noise signal due to the transistor or the like, from the potential of the image signal containing the noise signal due to the transistor or the like, whereby a net image signal is obtained.

The wiring 83 is set at "L" at Time T7, and the wiring 78 is set at "L" at Time T8. Thus, extraction of the image data from which noise is removed is completed. Note that Time T8 corresponds to Time Ti, and the repetition of the above-described operation enables high-speed image capture and display operation and extraction of image data from which noise is removed.

Note that the structures of the pixel circuits 171 to 180 described above as one embodiment of the present invention can be freely combined with one another.

Figure 15A:
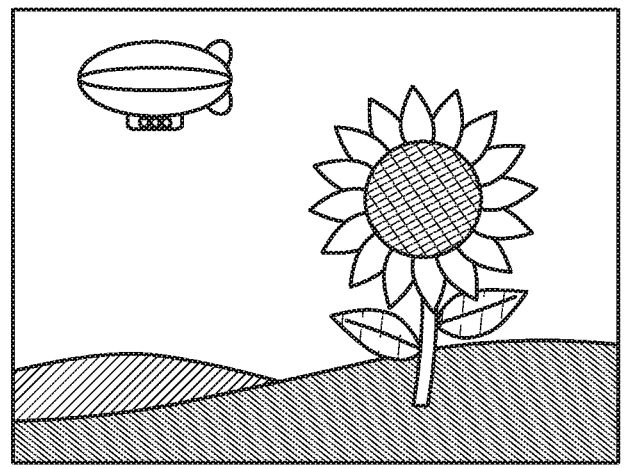
FIGS. 15A to 15C illustrate examples of an image displayed on a display portion.
Figure 15B:
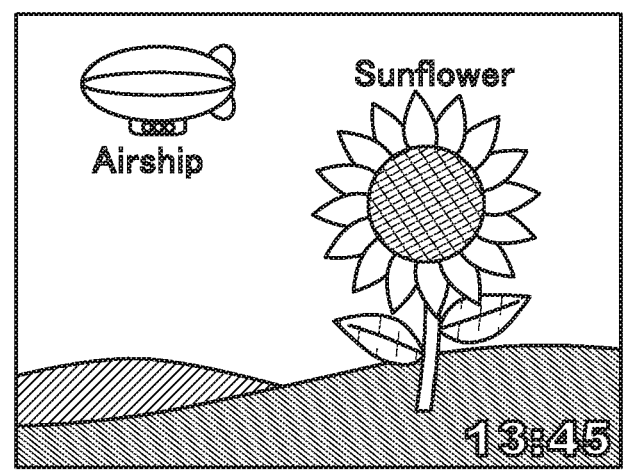
Figure 15C:
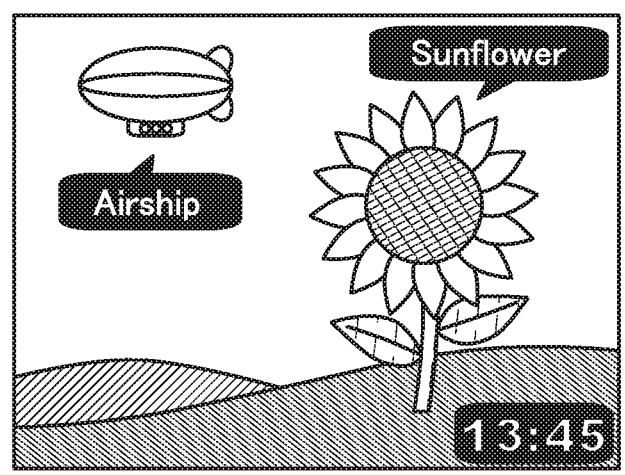

FIGS. 15A to 15C illustrate examples of an image displayed on the display portion 102. For example, an image of objects such as a flower blooming on the hill and an airship floating in the air as illustrated in FIG. 15A is captured.

FIG. 15B is an example of adding time and AR-displayed data on the objects. As described above, in the case of displaying added data on the display portion, an operation of overwriting the background image is performed. In the case where the color of the background image is dark, visibility is enhanced by displaying the data in a bright color. In the case where the color of the background is bright, visibility is hard to increase even when the luminance of the displayed data is increased.

In such a case, it is preferable to display the data in a color complementary to the color of the background. For example, the words "Airship" and "Sunflower" are displayed preferably in orange or yellow, which is a color complementary to blue for the sky or a color close to the complementary color. Furthermore, the numbers for the time are displayed preferably in red or magenta, which is a color complementary to green for the hill or a color close to the complementary color.

Moreover, by using the structure of the pixel circuit 176, display of an image simultaneous with image capture can be stopped in the selected pixel. Accordingly, as illustrated in FIG. 15C, the background captured image in the region where data such as the words are displayed is made not to be displayed (made to be displayed in black), and the data is made to be displayed in a bright color. In this way, visibility can be enhanced.

In the imaging display device of one embodiment of the present invention, unlike a see-through display, an AR-displayed image can be added to a captured image and thus the position of the AR-displayed image does not need to be adjusted with respect to the position of a viewer.

In the case where data of an object as illustrated in FIG. 15A is obtained from a server, if the object is an unknown object, the following process is required: an image of the object and data on the periphery are uploaded to the server, and data such as the shape, color, place, and time is compared with massive data in a database to obtain a retrieval result. Accordingly, in the case where data is obtained from the server, as described above, categories of the object are preferably narrowed down before the retrieval from the server.

The categories are preferably narrowed down by estimation using a neural network.

Figure 16:
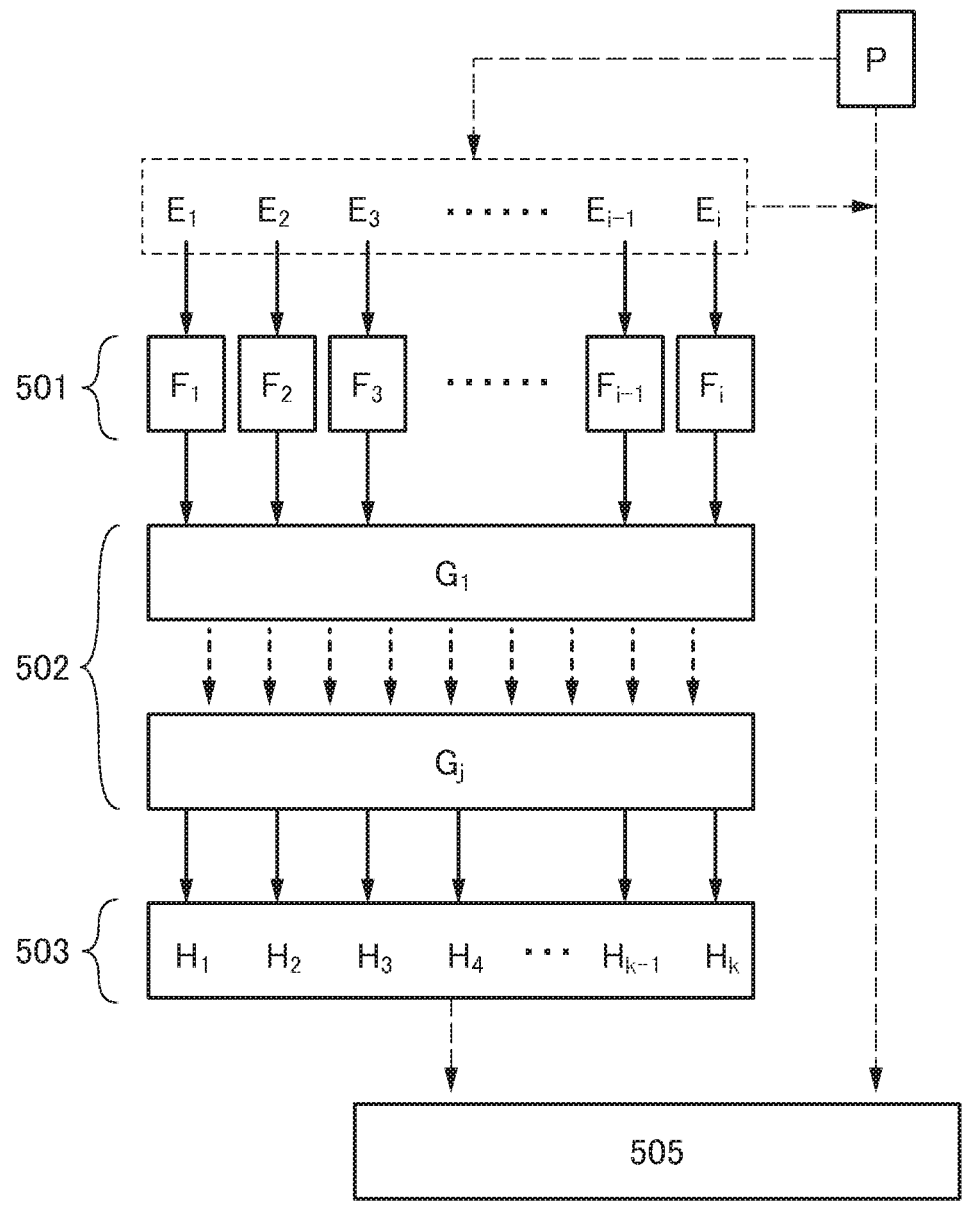
FIG. 16 illustrates an operation for estimating the category of an object with a neural network.

FIG. 16 illustrates an operation of estimating categories of an object using a neural network. Input data $E_1$ to $E_i$ (i is a natural number) correspond to features extracted from an image P of the object, such as the shape, color, and size, and data which can be obtained by the imaging display device, such as the position and time.

The input data $E_1$ to $E_i$ are respectively input to nodes $F_1$ to $F_i$ in an input layer 501, and the weighted data is input to a first layer $G_1$ in a middle layer 502. Here, the middle layer 502 includes an arbitrary number of layers $G_1$ to $G_j$ (j is a natural number). In addition, each of the layers in the middle layer 502 includes an arbitrary number of nodes. Data output from the last layer $G_j$ of the middle layer 502 is input to an output layer 503. The output layer 503 outputs any one of $H_1$ to $H_k$ (k is a natural number), which are results of the category estimation of the object, or outputs some of the category estimation results with high possibility.

Note that $H_1$ to $H_k$, which are the results of the category estimation, may be at any level, from rough categories of whether the object is a natural object, an artificial object, or a living thing to detailed categories that can identify the object.

Then, the image P of the object, the input data $E_1$ to $E_i$, and the category estimation result are transmitted to a server 505, and data on the object is searched. The detailed estimation result can narrow down the databases to search in the server 505 and thus shorten the search time.

However, the imaging display device has a limitation on the chip area and processing speed of the neural network. Therefore, the estimation of the category is preferably done to a minimum necessary extent and utilized in conjunction with the server 505. For example, on the precondition that data is contained in databases included in the server 505, in the case where the object is a building, if there are an estimation result that the object is categorized as "building", an image of the object, and positional data, sufficiently accurate data can be quickly obtained. Furthermore, in the case where the object is a human, if there are an estimation result that the object is categorized as "human" (containing data on the sex, height, age, and the like) and an image of the human (preferably containing an image of the face), an individual can be identified quickly.

Next, structure examples of a neural network that can be used in one embodiment of the present invention will be described in detail with reference to FIGS. 17A to 17C. A neural network NN includes neuron circuits and synapse circuits provided between the neuron circuits.

Figure 17A:
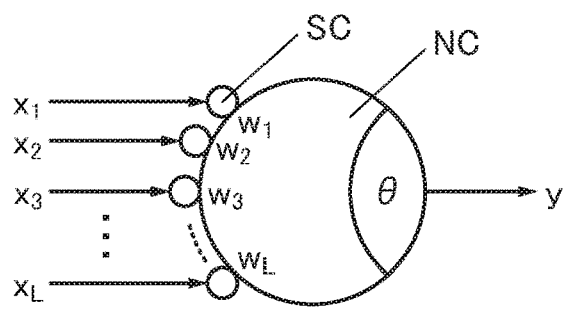
FIGS. 17A to 17C each illustrate a structure example of a neural network.

FIG. 17A illustrates structure examples of a neuron circuit NC and synapse circuits SC that constitute the neural network NN. Input data $x_1$ to $x_L$ (L is a natural number) are input to the synapse circuits SC. In addition, the synapse circuits SC each have a function of storing a weight coefficient $w_k$ (k is an integer of 1 to L inclusive). The weight coefficient $w_k$ corresponds to the connection strength between the neuron circuits NC.

When the input data $x_1$ to $x_L$ are input to the synapse circuits SC, the sum of the products $(x_k w_k)$ for k=1 to L (i.e., $x_1 w_1 + x_2 w_2 + \ldots + x_L w_L$) of input data $x_k$ input to the synapse circuit SC and the weight coefficient $w_k$ stored in the synapse circuit SC, that is, a value obtained by the product-sum operation of $x_k$ and $w_k$ is supplied to the neuron circuit NC. When the value is larger than the threshold θ of the neuron circuit NC, the neuron circuit NC outputs a high-level signal y. This phenomenon is referred to as firing of the neuron circuit NC.

Figure 17B:
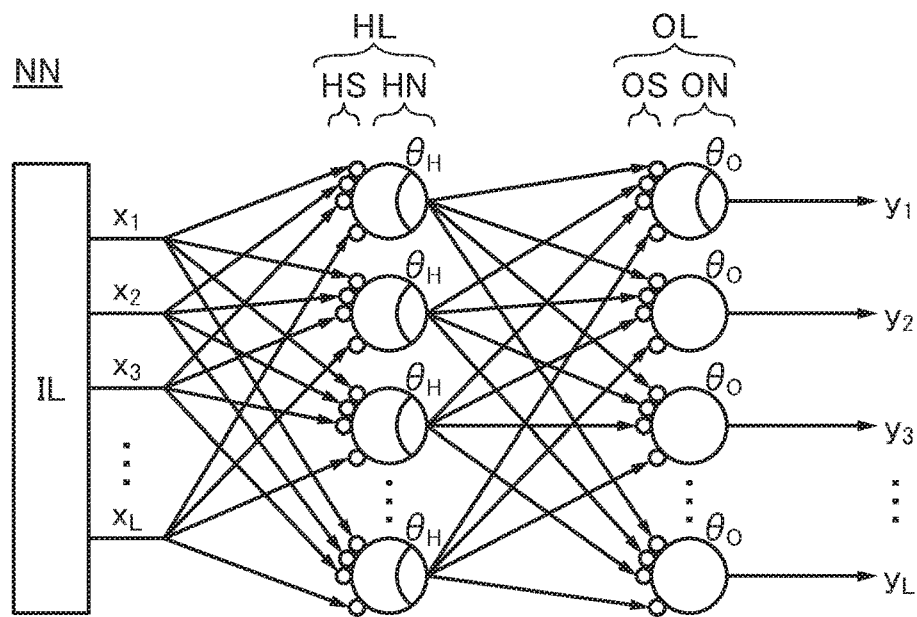

FIG. 17B illustrates an example of a model of the neural network NN. The neural network NN has a structure of a hierarchical perceptron using neuron circuits NC and synapse circuits SC. The neural network NN includes an input layer IL, a hidden layer (middle layer) HL, and an output layer OL.

The input layer IL can output the input data $x_1$ to $x_L$ to the hidden layer HL. The hidden layer HL includes hidden synapse circuits HS and hidden neuron circuits HN. The output layer OL includes output synapse circuits OS and output neuron circuits ON.

A value obtained by the product-sum operation using the input data $x_k$ and the weight coefficient $w_k$ that is held in the hidden synapse circuit HS is supplied to the hidden neuron circuit HN. Then, a value obtained by the product-sum operation using the output of the hidden neuron circuit HN and the weight coefficient $w_k$ that is held in the output synapse circuit OS is supplied to the output neuron circuit ON. Then, output data $y_1$ to $y_L$ are output from the output neuron circuits ON.

As described above, the neural network NN to which given input data is supplied has a function of outputting, as output data, values corresponding to weight coefficients held in the synapse circuits SC and thresholds θ of the neuron circuits.

In addition, the neural network NN can perform supervised learning by the input of teacher data. FIG. 17C shows a model of the neural network NN which performs supervised learning using a backpropagation method.

The backpropagation method is a method for changing a weight coefficient $w_k$ of a synapse circuit so that the error between output data from a neural network and a teacher signal is reduced. Specifically, a weight coefficient $w_k$ of the hidden synapse circuit HS is changed in accordance with an error $\delta_O$ that is determined on the basis of the output data (data $y_1$ to $y_L$) and the teacher data (data $t_1$ to $t_L$). In addition, a weight coefficient $w_k$ of a synapse circuit SC in the previous stage is changed in accordance with the amount of change in the weight coefficient $w_k$ of the hidden synapse circuit HS. In this manner, weight coefficients of the synapse circuits SC are sequentially changed on the basis of the teacher data $t_1$ to $t_L$, so that the neural network NN can perform learning.

Figure 17C:
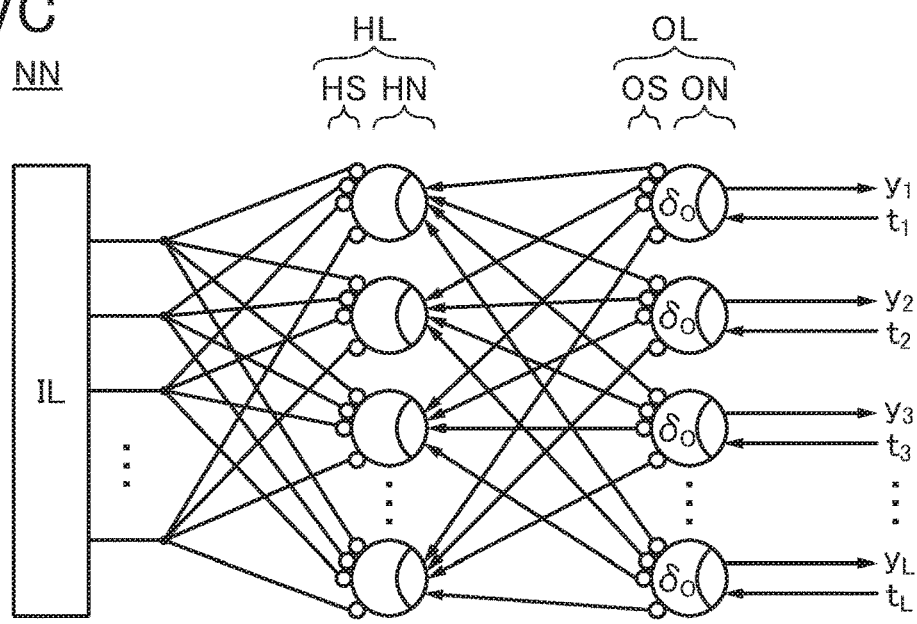

The structures of neural networks shown in FIGS. 17A to 17C can be used for the neural network 207 in FIG. 2. Furthermore, the above-mentioned backpropagation method can be used for the learning of the neural network 207.

Note that although one hidden layer HL is illustrated in FIGS. 17B and 17C, the number of hidden layers HL can be two or more. The use of a neural network including two or more hidden layers HL (such a neural network is referred to as a deep neural network (DNN)) enables deep learning. Thus, the accuracy of image production can be improved.

As described above, one embodiment of the present invention allows data on an object to be obtained quickly, and an image that well matches the reality can be AR-displayed.

This embodiment can be combined with any of the other embodiments as appropriate.

Embodiment 2

In this embodiment, configuration examples of semiconductor devices that can be used in the neural network described in the above embodiment will be described.

In the case where a neural network is composed of hardware, product-sum operations in the neural network can be performed with the use of product-sum operation elements. In this embodiment, configuration examples of semiconductor devices that can be used as product-sum operation elements in the neural network 207 will be described.

<Configuration Example of Semiconductor Device>

Figure 18:
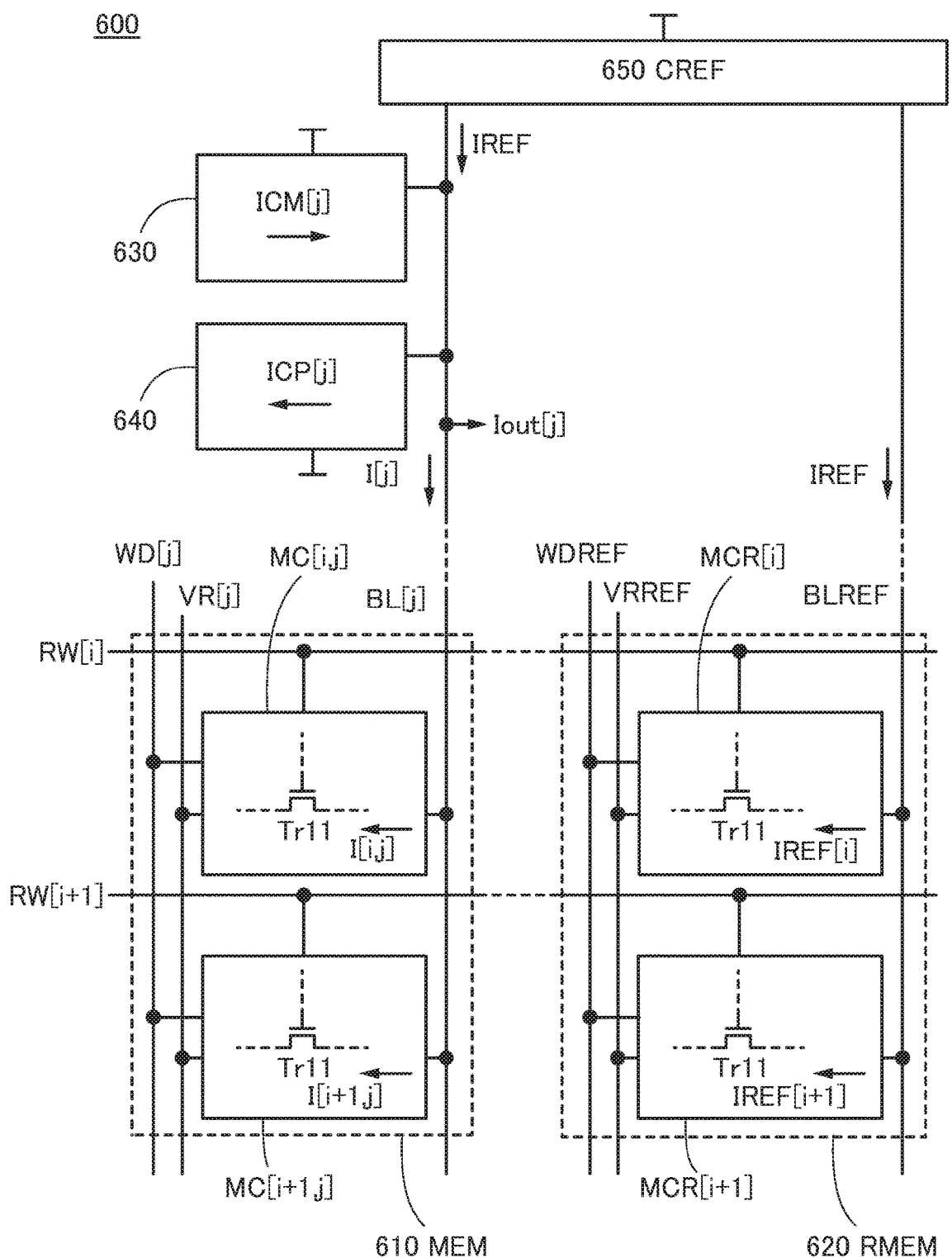
FIG. 18 illustrates a structure example of a semiconductor device.

FIG. 18 illustrates a configuration example of a semiconductor device 600. The semiconductor device 600 illustrated in FIG. 18 includes a memory circuit 610 (MEM), a reference memory circuit 620 (RMEM), a circuit 630, and a circuit 640. The semiconductor device 600 may further include a current supply circuit 650 (CREF).

The memory circuit 610 (MEM) includes a memory cell MC such as a memory cell MC[i, j] and a memory cell MC[i+1, j]. The memory cell MC includes an element that has a function of converting an input potential into current. As the element having such a function, an active element such as a transistor can be used, for example. FIG. 18 illustrates an example where the memory cell MC includes a transistor Tr11.

A first analog potential is input to the memory cell MC through a wiring WD such as a wiring WD[j]. The first analog potential corresponds to first analog data. The memory cell MC has a function of generating a first analog current corresponding to the first analog potential. Specifically, drain current of the transistor Tr11, which is obtained when the first analog potential is supplied to a gate of the transistor Tr11, can be used as the first analog current. Hereinafter, current flowing in the memory cell MC[i, j] is denoted by I[i, j], and current flowing in the memory cell MC[i+1, j] is denoted by I[i+1, j].

Note that the drain current of the transistor Tr11 operating in a saturation region is not dependent on voltage between a source and a drain and is controlled by the difference between its gate voltage and threshold voltage. Thus, the transistor Tr11 desirably operates in a saturation region. The gate voltage and the voltage between the source and the drain of the transistor Tr11 are each appropriately set to a voltage at which the transistor Tr11 operates in a saturation region.

Specifically, in the semiconductor device 600 illustrated in FIG. 18, a first analog potential Vx[i, j] or a potential corresponding to the first analog potential Vx[i, j] is input to the memory cell MC[i, j] through the wiring WD[j]. The memory cell MC[i, j] has a function of generating a first analog current corresponding to the first analog potential Vx[i, j]. This means that the current I[i, j] flowing in the memory cell MC[i, j] corresponds to the first analog current, in this case.

Furthermore, in the semiconductor device 600 illustrated in FIG. 18, a first analog potential Vx[i+1, j] or a potential corresponding to the first analog potential Vx[i+1, j] is input to the memory cell MC[i+1, j] through the wiring WD[j]. The memory cell MC[i+1, j] has a function of generating a first analog current corresponding to the first analog potential Vx[i+1, j]. This means that the current I[i+1, j] flowing in the memory cell MC[i+1, j] corresponds to the first analog current, in this case.

The memory cell MC has a function of holding the first analog potential. In other words, the memory cell MC has a function of holding the first analog current corresponding to the first analog potential.

Moreover, a second analog potential is input to the memory cell MC through a wiring RW such as a wiring RW[i] and a wiring RW[i+1]. The second analog potential corresponds to second analog data. The memory cell MC has a function of adding the second analog potential or a potential corresponding to the second analog potential to the first analog potential that is held and a function of holding a third analog potential obtained by the addition. The memory cell MC also has a function of generating a second analog current corresponding to the third analog potential. In other words, the memory cell MC has a function of holding the second analog current corresponding to the third analog potential.

Specifically, in the semiconductor device 600 illustrated in FIG. 18, a second analog potential Vw[i, j] is input to the memory cell MC[i, j] through the wiring RW[i]. The memory cell MC[i, j] has a function of holding a third analog potential corresponding to the first analog potential Vx[i, j] and the second analog potential Vw[i, j]. The memory cell MC[i, j] also has a function of generating a second analog current corresponding to the third analog potential. This means that the current I[i, j] flowing in the memory cell MC[i, j] corresponds to the second analog current, in this case.

Furthermore, in the semiconductor device 600 illustrated in FIG. 18, a second analog potential Vw[i+1, j] is input to the memory cell MC[i+1, j] through the wiring RW[i+1]. The memory cell MC[i+1, j] has a function of holding the first analog potential Vx[i+1, j] and a third analog potential corresponding to the second analog potential Vw[i+1, j]. The memory cell MC[i+1, j] also has a function of generating a second analog current corresponding to the third analog potential. This means that the current I[i+1, j] flowing in the memory cell MC[i+1, j] corresponds to the second analog current, in this case.

The current I[i, j] flows between a wiring BL[j] and a wiring VR[j] through the memory cell MC[i, j]. The current I[i+1, j] flows between the wiring BL[j] and the wiring VR[j] through the memory cell MC[i+1, j]. Accordingly, a current I[j], which corresponds to the sum of the current I[i, j] and the current I[i+1, j], flows between the wiring BL[j] and the wiring VR[j] through the memory cell MC[i, j] and the memory cell MC[i+1, j].

The reference memory circuit 620 (RMEM) includes a memory cell MCR such as a memory cell MCR[i] and a memory cell MCR[i+1]. Note that a first reference potential VPR is input to the memory cell MCR through a wiring WDREF. The memory cell MCR has a function of generating a first reference current corresponding to the first reference potential VPR. Hereinafter, current flowing in the memory cell MCR[i] is denoted by IREF[i], and current flowing in the memory cell MCR[i+1] is denoted by IREF[i+1].

Specifically, in the semiconductor device 600 illustrated in FIG. 18, the first reference potential VPR is input to the memory cell MCR[i] through the wiring WDREF. The memory cell MCR[i] has a function of generating the first reference current corresponding to the first reference potential VPR. This means that the current IREF[i] flowing in the memory cell MCR[i] corresponds to the first reference current, in this case.

Furthermore, in the semiconductor device 600 illustrated in FIG. 18, the first reference potential VPR is input to the memory cell MCR[i+1] through the wiring WDREF. The memory cell MCR[i+1] has a function of generating the first reference current corresponding to the first reference potential VPR. This means that the current IREF[i+1] flowing in the memory cell MCR[i+1] corresponds to the first reference current, in this case.

The memory cell MCR has a function of holding the first reference potential VPR. In other words, the memory cell MCR has a function of holding the first reference current corresponding to the first reference potential VPR.

Moreover, the second analog potential is input to the memory cell MCR through the wiring RW such as the wiring RW[i] and the wiring RW[i+1]. The memory cell MCR has a function of adding the second analog potential or a potential corresponding to the second analog potential to the first reference potential VPR that is held and a function of holding a second reference potential obtained by the addition. The memory cell MCR also has a function of generating a second reference current corresponding to the second reference potential. In other words, the memory cell MCR has a function of holding the second reference current corresponding to the second reference potential.

Specifically, in the semiconductor device 600 illustrated in FIG. 18, the second analog potential Vw[i, j] is input to the memory cell MCR[i] through the wiring RW[i]. The memory cell MCR[i] has a function of holding a second reference potential corresponding to the first reference potential VPR and the second analog potential Vw[i, j]. The memory cell MCR[i] also has a function of generating the second reference current corresponding to the second reference potential. This means that the current IREF[i] flowing in the memory cell MCR[i] corresponds to the second reference current, in this case.

Furthermore, in the semiconductor device 600 illustrated in FIG. 18, the second analog potential Vw[i+1, j] is input to the memory cell MCR[i+1] through the wiring RW[i+1]. The memory cell MCR[i+1] has a function of holding the first reference potential VPR and a second reference potential corresponding to the second analog potential Vw[i+1, j]. The memory cell MCR[i+1] also has a function of generating the second reference current corresponding to the second reference potential. This means that the current IREF[i+1] flowing in the memory cell MCR[i+1] corresponds to the second reference current, in this case.

The current IREF[i] flows between a wiring BLREF and a wiring VRREF through the memory cell MCR[i]. The current IREF[i+1] flows between the wiring BLREF and the wiring VRREF through the memory cell MCR[i+1]. Accordingly, a current IREF, which corresponds to the sum of the current IREF[i] and the current IREF[i+1], flows between the wiring BLREF and the wiring VRREF through the memory cell MCR[i] and the memory cell MCR[i+1].

The current supply circuit 650 has a function of supplying current with the same value as the current IREF that flows through the wiring BLREF or supplying current corresponding to the current IREF to the wiring BL. In the case where the current I[j] that flows between the wiring BL[j] and the wiring VR[j] through the memory cell MC[i, j] and the memory cell MC[i+1, j] is different from the current IREF that flows between the wiring BLREF and the wiring VRREF through the memory cell MCR[i] and the memory cell MCR[i+1] and thus offset current is set as described later, current corresponding to the difference flows in the circuit 630 or the circuit 640. The circuit 630 serves as a current source circuit, and the circuit 640 serves as a current sink circuit.

Specifically, in the case where the current I[j] is higher than the current IREF, the circuit 630 has a function of generating a current ΔI[j] that corresponds to the difference between the current I[j] and the current IREF. The circuit 630 also has a function of supplying the generated current ΔI[j] to the wiring BL[j]. This means that the circuit 630 has a function of holding the current ΔI[j].

In the case where the current I[j] is lower than the current IREF, the circuit 640 has a function of generating current corresponding to the absolute value of the current ΔI[j] that corresponds the difference between the current I[j] and the current IREF. The circuit 640 also has a function of drawing the generated current ΔI[j] from the wiring BL[j]. This means that the circuit 640 has a function of holding the current ΔI[j].

Next, an operation example of the semiconductor device 600 illustrated in FIG. 18 will be described.

First, a potential corresponding to the first analog potential is stored in the memory cell MC[i, j]. Specifically, a potential VPR−Vx[i, j], which is obtained by subtracting the first analog potential Vx[i, j] from the first reference potential VPR, is input to the memory cell MC[i, j] through the wiring WD[j]. The memory cell MC[i, j] holds the potential VPR−Vx[i, j]. In addition, the memory cell MC[i, j] generates the current I[i, j] that corresponds to the potential VPR−Vx[i, j]. The first reference potential VPR is, for example, a potential that is higher than a ground potential. Specifically, the first reference potential VPR is desirably higher than a ground potential and as high as or lower than a high-level potential VDD that is supplied to the current supply circuit 650.

Furthermore, the potential VPR is stored in the memory cell MCR[i]. Specifically, the potential VPR is input to the memory cell MCR[i] through the wiring WDREF. The memory cell MCR[i] holds the potential VPR. In addition, the memory cell MCR[i] generates the current IREF[i] that corresponds to the potential VPR.

Moreover, a potential corresponding to the first analog potential is stored in the memory cell MC[i+1, j]. Specifically, a potential VPR−Vx[i+1, j], which is obtained by subtracting the first analog potential Vx[i+1, j] from the first reference potential VPR, is input to the memory cell MC[i+1, j] through the wiring WD[j]. The memory cell MC[i+1, j] holds the potential VPR−Vx[i+1, j]. In addition, the memory cell MC[i+1, j] generates the current I[i+1, j] that corresponds to the potential VPR−Vx[i+1, j].

Furthermore, the first reference potential VPR is stored in the memory cell MCR[i+1]. Specifically, the potential VPR is input to the memory cell MCR[i+1] through the wiring WDREF. The memory cell MCR[i+1] holds the potential VPR. In addition, the memory cell MCR[i+1] generates the current IREF[i+1] that corresponds to the potential VPR.

During the above operation, the wiring RW[i] and the wiring RW[i+1] are each set to a base potential. As a base potential, for example, a ground potential or a low-level potential VSS that is lower than a base potential can be used. Alternatively, a potential between the potential VSS and the potential VDD may be used as a base potential. This is preferable because the potential of the wiring RW can be higher than the base potential regardless of whether the second analog potential Vw is positive or negative, which enables easy generation of signals and multiplication of either positive or negative analog data.

As a result of the above operation, current corresponding to the sum of currents generated in the memory cells MC connected to the wiring BL[j] flows through the wiring BL[j]. Specifically, in FIG. 18, the current I[j], which is the sum of the current I[i, j] generated in the memory cell MC[i, j] and the current I[i+1, j] generated in the memory cell MC[i+1, j], flows through the wiring BL[j]. In addition, as a result of the above operation, current corresponding to the sum of currents generated in the memory cells MCR connected to the wiring BLREF flows through the wiring BLREF. Specifically, in FIG. 18, the current IREF, which is the sum of the current IREF[i] generated in the memory cell MCR[i] and the current IREF[i+1] generated in the memory cell MCR[i+1], flows through the wiring BLREF.

Next, an offset current Ioffset[j], which is the difference between the current I[j] obtained by inputting the first analog potential and the current IREF obtained by inputting the first reference potential, is held in the circuit 630 or the circuit 640 while the wiring RW[i] and the wiring RW[i+1] are kept at base potentials.

Specifically, when the current IN is higher than the current IREF, the circuit 630 supplies the current Ioffset[j] to the wiring BL[j]. This means that a current ICM[j] that flows in the circuit 630 corresponds to the current Ioffset[j]. The current ICM[j] is held in the circuit 630. When the current I[j] is lower than the current IREF, the circuit 640 draws the current Ioffset[j] from the wiring BL[j]. This means that a current ICP[j] that flows in the circuit 640 corresponds to the current Ioffset[j]. The current ICP[j] is held in the circuit 640.

Then, the second analog potential or a potential corresponding to the second analog potential is stored in the memory cell MC[i, j] so as to be added to the first analog potential or a potential corresponding to the first analog potential held in the memory cell MC[i, j]. Specifically, when the potential of the wiring RW[i] is set to a potential that is higher than a base potential by Vw[i], a second analog potential Vw[i] is input to the memory cell MC[i, j] through the wiring RW[i]. The memory cell MC[i, j] holds a potential VPR−Vx[i, j]+Vw[i]. Furthermore, the memory cell MC[i, j] generates the current I[i, j] corresponding to the potential VPR−Vx[i, j]+Vw[i].

In addition, the second analog potential or the potential corresponding to the second analog potential is stored in the memory cell MC[i+1, j] so as to be added to the first analog potential or a potential corresponding to the first analog potential held in the memory cell MC[i+1, j]. Specifically, when the potential of the wiring RW[i+1] is set to a potential that is higher than a base potential by Vw[i+1], a second analog potential Vw[i+1] is input to the memory cell MC[i+1, j] through the wiring RW[i+1]. The memory cell MC[i+1, j] holds a potential VPR−Vx[i+1, j]+Vw[i+1]. Furthermore, the memory cell MC[i+1, j] generates the current I[i+1, j] corresponding to the potential VPR−Vx[i+1, j]+Vw[i+1].

In the case where the transistor Tr11 that operates in a saturation region is used as an element for converting a potential into current, since the drain current of the transistor Tr11 included in the memory cell MC[i, j] corresponds to the current I[i, j], the second analog current is expressed by Formula 1 below. Note that Vw[i] is the potential of the wiring RW[i], Vw[i+1] is the potential of the wiring RW[i+1], k is a coefficient, and Vth is the threshold voltage of the transistor Tr11.

$$I[i,j]=k(Vw[i]-Vth+VPR-Vx[i,j])^2 \qquad \text{(Formula 1)}$$

Furthermore, since the drain current of the transistor Tr11 included in the memory cell MCR[i] corresponds to the current IREF[i], the second reference current is expressed by Formula 2 below.

$$IREF[i]=k(Vw[i]-Vth+VPR)^2 \qquad \text{(Formula 2)}$$

The current I[j], which corresponds to the sum of the current I[i, j] flowing in the memory cell MC[i, j] and the current I[i+1, j] flowing in the memory cell MC[i+1, j], can be expressed as ΣiI[i, j]. The current IREF, which corresponds to the sum of the current IREF[i] flowing in the memory cell MCR[i] and the current IREF[i+1] flowing in the memory cell MCR[i+1], can be expressed as ΣiIREF[i]. Accordingly, the current ΔI[j] that corresponds to the difference between the current I[j] and the current IREF is expressed by Formula 3 below.

$$\Delta I[j]=IREF-I[j]=\Sigma i IREF[i]-\Sigma i I[i,j] \qquad \text{(Formula 3)}$$

The current ΔI[j] can be obtained from Formulae 1 to 3, as expressed by Formula 4 below.

$$\Delta I[j]=\Sigma i\{k(Vw[i]-Vth+VPR)^2-k(Vw[i]-Vth+VPR-Vx[i,j])^2\}=2k\Sigma i(Vw[i]\cdot Vx[i,j])-2k\Sigma i(Vth-VPR)\cdot Vx[i,j]-k\Sigma i Vx[i,j]^2 \qquad \text{(Formula 4)}$$

The term 2kΣi(Vw[i]·Vx[i, j]) in Formula 4 corresponds to the sum of the product of the first analog potential Vx[i, j] and the second analog potential Vw[i] and the product of the first analog potential Vx[i+1, j] and the second analog potential Vw[i+1].

Furthermore, if Ioffset[j] is defined as the current ΔI[j] at the time when the potential of the wiring RW[i] is all set to a base potential, that is, when the second analog potential Vw[i] and the second analog potential Vw[i+1] are both 0, Formula 5 below can be obtained from Formula 4.

$$I\text{offset}[j] = -2k\Sigma i(Vth-VPR)\cdot Vx[i,j] - k\Sigma iVx[i,j]^2 \quad \text{(Formula 5)}$$

It is found from Formulae 3 to 5 that 2kΣi(Vw[i]−Vx[i, j]) that corresponds to the product-sum of the first analog data and the second analog data is expressed by Formula 6 below.

$$2k\Sigma i(Vw[i]\cdot Vx[i,j]) = IREF - I[j] - I\text{offset}[j] \quad \text{(Formula 6)}$$

When the potential of the wiring RW[i] is Vw[i] and the potential of the wiring RW[i+1] is Vw[i+1], a current Iout[j] that flows from the wiring BL[j] is expressed by IREF−I[j]−Ioffset[j], where I[j] is the sum of currents flowing in the memory cells MC, IREF is the sum of currents flowing in the memory cells MCR, and Ioffset[j] is current flowing in the circuit 630 or the circuit 640. According to Formula 6, the current Iout[j] equals to 2kΣi(Vw[i]·Vx[i, j]), which corresponds to the sum of the product of the first analog potential Vx[i, j] and the second analog potential Vw[i] and the product of the first analog potential Vx[i+1, j] and the second analog potential Vw[i+1].

The transistor Tr11 desirably operates in a saturation region. However, even if the operation region of the transistor Tr11 deviates from an ideal saturation region, the transistor Tr11 is regarded as operating in a saturation region as long as there is no problem in obtaining current that corresponds to the sum of the product of the first analog potential Vx[i, j] and the second analog potential Vw[i] and the product of the first analog potential Vx[i+1, j] and the second analog potential Vw[i+1] with an accuracy within a desired range.

According to one embodiment of the present invention, analog data can be subjected to arithmetic processing without being converted into digital data; thus, the circuit scale of a semiconductor device can be reduced or the time required for the arithmetic processing of analog data can be shortened. Alternatively, according to one embodiment of the present invention, power consumption of a semiconductor device can be reduced while the time required for arithmetic processing of analog data is shortened.

<Structure Example of Memory Circuit>

Next, a specific configuration example of the memory circuit 610 (MEM) and the reference memory circuit 620 (RMEM) will be described with reference to FIG. 19.

Figure 19:
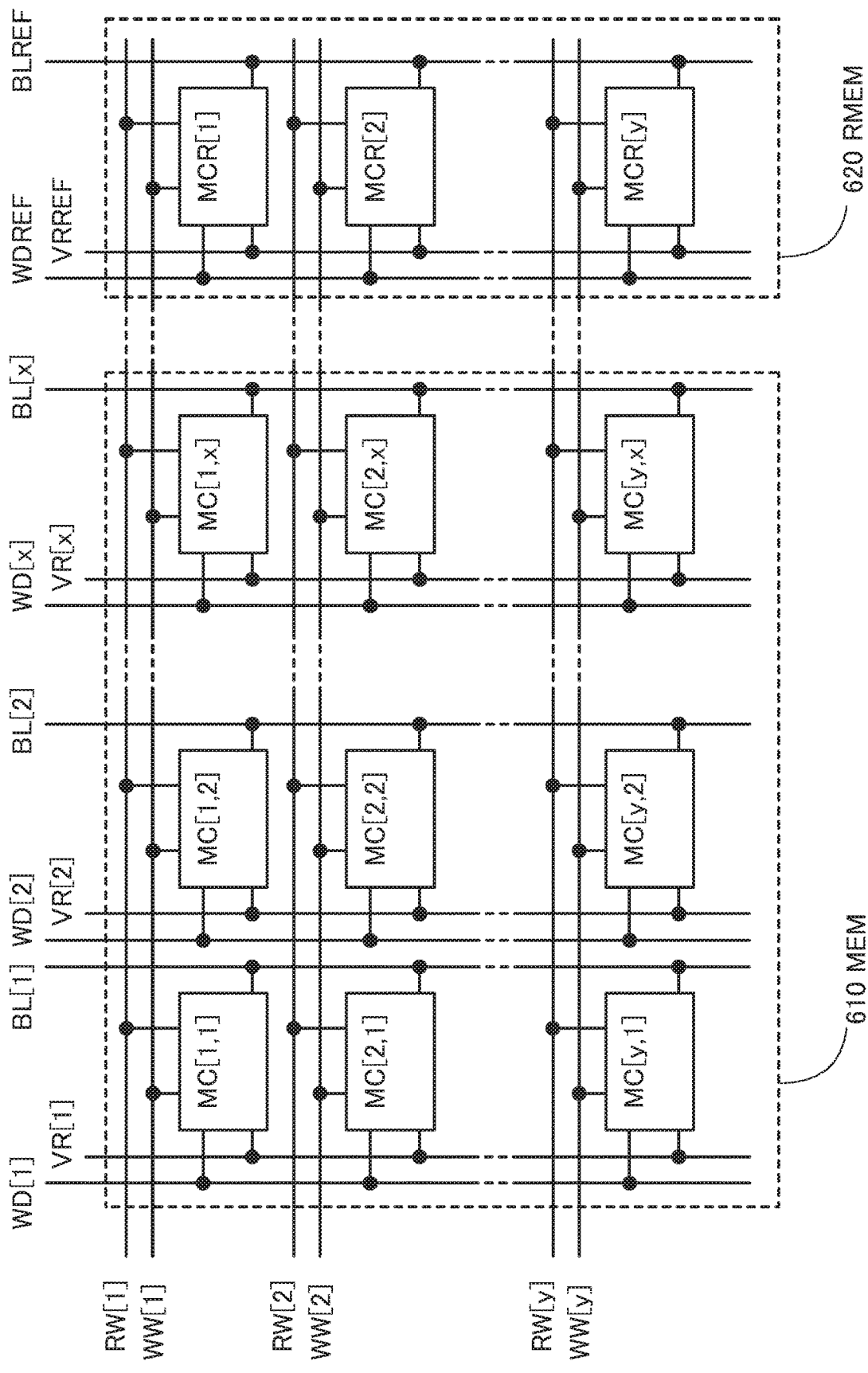
FIG. 19 illustrates a structure example of a memory circuit.

FIG. 19 illustrates an example where the memory circuit 610 (MEM) includes the memory cells MC in y rows and x columns (x and y are natural numbers) and the reference memory circuit 620 (RMEM) includes the memory cells MCR in y rows and one column.

The memory circuit 610 is connected to the wiring RW, a wiring WW, the wiring WD, the wiring VR, and the wiring BL. In the example illustrated in FIG. 19, wirings RW[1] to RW[y] and wirings WW[1] to WW[y] are connected to the memory cells MC in the respective rows. Moreover, wirings WD[1] to WD[x], wirings BL[1] to BL[x], and wirings VR[1] to VR[x] are connected to the memory cells MC in the respective columns. Note that the wirings VR[1] to VR[x] may be connected to each other.

The reference memory circuit 620 is connected to the wiring RW, the wiring WW, the wiring WDREF, the wiring VRREF, and the wiring BLREF. In the example illustrated in FIG. 19, the wirings RW[1] to RW[y] and the wirings WW[1] to WW[y] are connected to the memory cells MCR in the respective rows. Moreover, the wiring WDREF, the wiring BLREF, and the wiring VRREF are connected to the memory cells MCR in the one column. Note that the wiring VRREF may be connected to the wirings VR[1] to VR[x].

Figure 20:
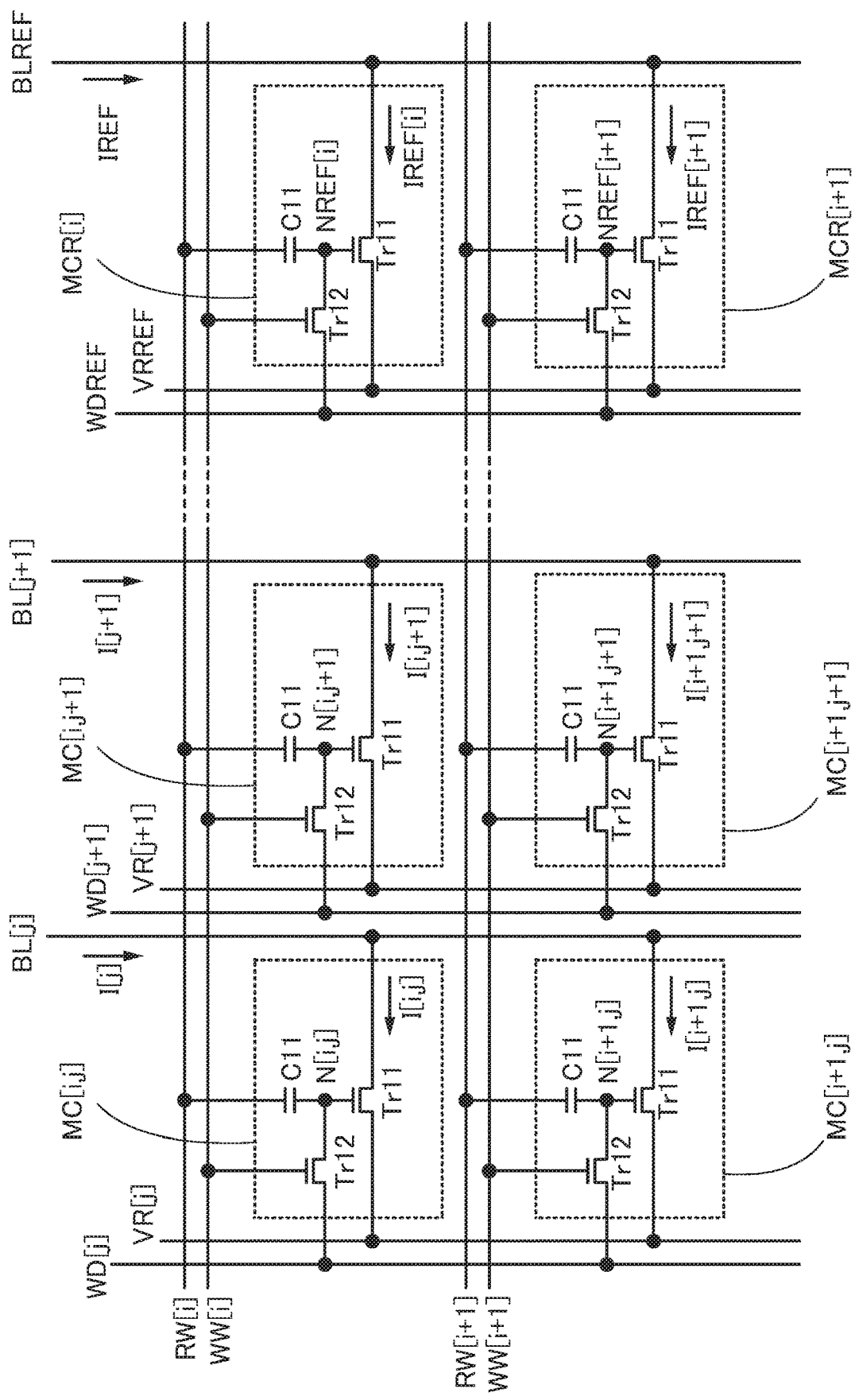
FIG. 20 illustrates a structure example of memory cells.

FIG. 20 illustrates, as an example, a specific circuit configuration and a specific connection relationship of the memory cells MC in any two rows and two columns among the memory cells MC illustrated in FIG. 19 and the memory cells MCR in any two rows and one column among the memory cells MCR illustrated in FIG. 19.

Specifically, FIG. 20 illustrates the memory cell MC[i, j] in the i-th row and the j-th column, the memory cell MC[i+1, j] in the i+1-th row and the j-th column, a memory cell MC[i, 1+1] in the i-th row and the j+1-th column, and a memory cell MC[i+1, j+1] in the i+1-th row and the j+l-th column. FIG. 20 also illustrates the memory cell MCR[i] in the i-th row and the memory cell MCR[i+1] in the i+1-th row. Note that i and 1+1 are each any number from 1 toy, and j and j+1 are each any number from 1 to x.

The memory cell MC[i, j], the memory cell MC[i, j+1], and the memory cell MCR[i] in the i-th row are connected to the wiring RW[i] and a wiring WW[i]. The memory cell MC[1+1, j], the memory cell MC[i+1, 1+1], and the memory cell MCR[i+1] in the i+l-th row are connected to the wiring RW[i+1] and a wiring WW[i+1].

The memory cell MC[i, j] and the memory cell MC[i+1, j] in the j-th column are connected to the wiring WD[j], the wiring VR[j], and the wiring BL[j]. The memory cell MC[i, 1+1] and the memory cell MC[i+1, j+1] in the j+1-th column are connected to a wiring WD[j+1], a wiring VR[j+1], and a wiring BL[i+1]. The memory cell MCR[i] in the i-th row and the memory cell MCR[i+1] in the i+l-th row are connected to the wiring WDREF, the wiring VRREF, and the wiring BLREF.

The memory cells MC and MCR each include the transistor Tr11, a transistor Tr12, and a capacitor C11. The transistor Tr12 has a function of controlling the input of the first analog potential to the memory cell MC or the memory cell MCR. The transistor Tr11 has a function of generating analog current in accordance with a potential input to its gate. The capacitor C11 has a function of adding the second analog potential or a potential corresponding to the second analog potential to the first analog potential or a potential corresponding to the first analog potential that is held in the memory cell MC or the memory cell MCR.

Specifically, in the memory cell MC illustrated in FIG. 20, a gate of the transistor Tr12 is connected to the wiring WW, one of a source and a drain of the transistor Tr12 is connected to the wiring WD, and the other of the source and the drain of the transistor Tr12 is connected to the gate of the transistor Tr11. Furthermore, one of a source and a drain of the transistor Tr11 is connected to the wiring VR, and the other of the source and the drain of the transistor Tr11 is connected to the wiring BL. A first electrode of the capacitor C11 is connected to the wiring RW, and a second electrode of the capacitor C11 is connected to the gate of the transistor Tr11.

In addition, in the memory cell MCR illustrated in FIG. 20, a gate of the transistor Tr12 is connected to the wiring WW, one of a source and a drain of the transistor Tr12 is connected to the wiring WDREF, and the other of the source and the drain of the transistor Tr12 is connected to the gate of the transistor Tr11. Furthermore, one of a source and a drain of the transistor Tr11 is connected to the wiring VRREF, and the other of the source and the drain of the transistor Tr11 is connected to the wiring BLREF. A first electrode of the capacitor C11 is connected to the wiring RW, and a second electrode of the capacitor C11 is connected to the gate of the transistor Tr11.

The gate of the transistor Tr11 in the memory cell MC is called a node N here. In the memory cell MC, the first analog potential or a potential corresponding to the first analog potential is input to the node N through the transistor Tr12. Then, when the transistor Tr12 is turned off, the node N is brought into a floating state and the first analog potential or the potential corresponding to the first analog potential is held at the node N. In the memory cell MC, when the node N is brought into a floating state, the second analog potential or a potential corresponding to the second analog potential input to the first electrode of the capacitor C11 is applied to the node N. As a result of the above operation, the node N can have a potential obtained by adding the second analog potential or the potential corresponding to the second analog potential to the first analog potential or the potential corresponding to the first analog potential.

Because the potential of the first electrode of the capacitor C11 is applied to the node N through the capacitor C11, the amount of change in the potential of the first electrode is not exactly the same as the amount of change in the potential of the node N, actually. Specifically, the accurate amount of change in the potential of the node N can be calculated in the following manner: a coupling coefficient uniquely determined by the capacitance value of the capacitor C11, the value of the gate capacitance of the transistor Tr11, and the value of parasitic capacitance is multiplied by the amount of change in the potential of the first electrode. In the following description, the amount of change in the potential of the first electrode is assumed to be substantially the same as the amount of change in the potential of the node N, for easy understanding.

The drain current of the transistor Tr11 is determined in accordance with the potential of the node N. Thus, when the transistor Tr12 is turned off, the value of the drain current of the transistor Tr11 as well as the potential of the node N is held. The drain current is affected by the first analog potential and the second analog potential.

The gate of the transistor Tr11 in the memory cell MCR is called a node NREF here. In the memory cell MCR, the first reference potential or a potential corresponding to the first reference potential is input to the node NREF through the transistor Tr12. Then, when the transistor Tr12 is turned off, the node NREF is brought into a floating state and the first reference potential or the potential corresponding to the first reference potential is held at the node NREF. In the memory cell MCR, when the node NREF is brought into a floating state, the second analog potential or a potential corresponding to the second analog potential input to the first electrode of the capacitor C11 is applied to the node NREF. As a result of the above operation, the node NREF can have a potential obtained by adding the second analog potential or the potential corresponding to the second analog potential to the first reference potential or the potential corresponding to the first reference potential.

The drain current of the transistor Tr11 is determined in accordance with the potential of the node NREF. Thus, when the transistor Tr12 is turned off, the value the drain current of the transistor Tr11 as well as the potential of the node NREF is held. The drain current is affected by the first reference potential and the second analog potential.

When the drain current of the transistor Tr11 in the memory cell MC[i, j] is the current I[i, j] and the drain current of the transistor Tr11 in the memory cell MC[i+1, j] is the current I[i+1, j], the sum of currents supplied to the memory cell MC[i, j] and the memory cell MC[i+1, j] through the wiring BL[j] is the current I[j]. When the drain current of the transistor Tr11 in the memory cell MC[i, j+1] is a current I[i, j+1] and the drain current of the transistor Tr11 in the memory cell MC[i+1,j+1] is a current I[i+1,j+1], the sum of currents supplied to the memory cell MC[i, j+1] and the memory cell MC[i+1, j+1] through the wiring BL[j+1] is a current I[j+1]. When the drain current of the transistor Tr11 in the memory cell MCR[i] is the current IREF[i] and the drain current of the transistor Tr11 in the memory cell MCR[i+1] is the current IREF[i+1], the sum of currents supplied to the memory cell MCR[i] and the memory cell MCR[i+1] through the wiring BLREF is the current IREF.

<Configuration Example of Circuit 630, Circuit 640, and Current Supply Circuit>

Then, a specific configuration example of the circuit 630, the circuit 640, and the current supply circuit 650 (CREF) will be described with reference to FIG. 21.

Figure 21:
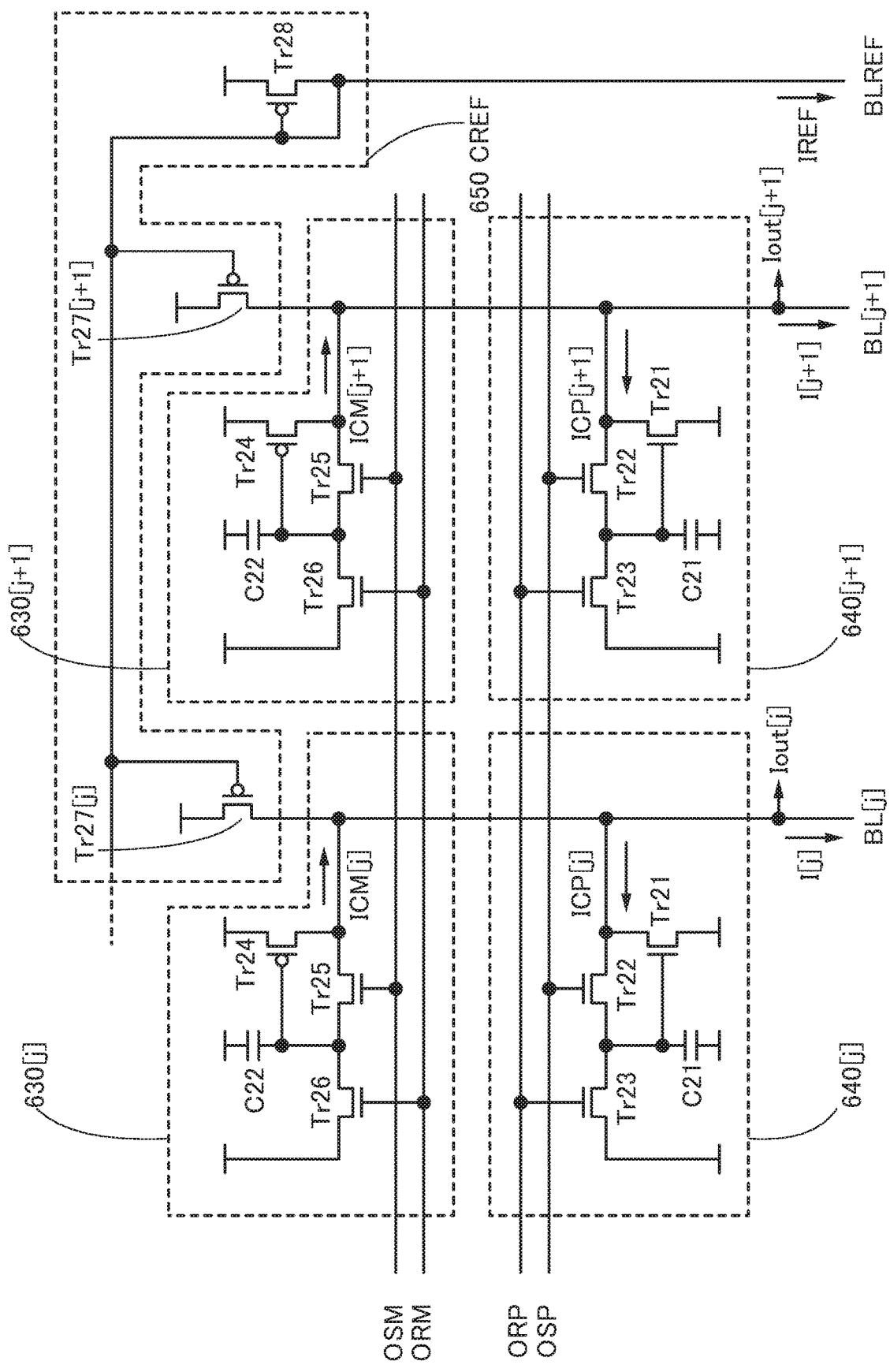
FIG. 21 illustrates structure examples of circuits.

FIG. 21 illustrates a configuration example of the circuit 630, the circuit 640, and the current supply circuit 650 for the memory cell MC and the memory cell MCR illustrated in FIG. 20. Specifically, FIG. 21 illustrates a circuit 630[j] for the memory cells MC in the j-th column and a circuit 630[j+1] for the memory cells MC in the j+1-th column, as the circuit 630. FIG. 21 illustrates a circuit 640[j] for the memory cells MC in the j-th column and a circuit 640[j+1] for the memory cells MC in the j+1-th column, as the circuit 640.

The circuit 630[j] and the circuit 640[j] are connected to the wiring BL[j]. The circuit 630[j+1] and the circuit 640[j+1] are connected to the wiring BL[j+1].

The current supply circuit 650 is connected to the wiring BL[j], the wiring BL[j+1], and the wiring BLREF. The current supply circuit 650 has a function of supplying the current IREF to the wiring BLREF and a function of supplying current that is the same as the current IREF or current that corresponds to the current IREF to each of the wiring BL[j] and the wiring BL[j+1].

Specifically, the circuit 630[j] and the circuit 630[j+1] each include a transistor Tr24, a transistor Tr25, a transistor Tr26, and a capacitor C22. The transistor Tr24 in the circuit 630[j] has a function of generating the current ICM[j] that corresponds to the difference between the current I[j] and the current IREF, when the current I[j] is higher than the current IREF and offset current is set. Furthermore, the transistor Tr24 in the circuit 630[j+1] has a function of generating a current ICM[j+1] that corresponds to the difference between the current I[j+1] and the current IREF, when the current I[j+1] is higher than the current IREF. The current ICM[j] and the current ICM[j+1] are supplied from the circuit 630[j] and the circuit 630[j+1] to the wiring BL[j] and the wiring BL[j+1], respectively.

In each of the circuit 630[j] and the circuit 630[j+1], one of a source and a drain of the transistor Tr24 is connected to the corresponding wiring BL, and the other of the source and the drain is connected to a wiring through which a predetermined potential is supplied. One of a source and a drain of the transistor Tr25 is connected to the corresponding wiring BL, and the other of the source and the drain is connected to a gate of the transistor Tr24. One of a source and a drain of the transistor Tr26 is connected to the gate of the transistor Tr24, and the other of the source and the drain is connected to a wiring through which a predetermined potential is supplied. A first electrode of the capacitor C22 is connected to the gate of the transistor Tr24, and a second electrode of the capacitor C22 is connected to a wiring through which a predetermined potential is supplied.

A gate of the transistor Tr25 is connected to a wiring OSM, and a gate of the transistor Tr26 is connected to a wiring ORM.

Note that FIG. 21 illustrates an example where the transistor Tr24 is a p-channel transistor and the transistors Tr25 and Tr26 are n-channel transistors.

The circuit 640[j] and the circuit 640[j+1] each include a transistor Tr21, a transistor Tr22, a transistor Tr23, and a capacitor C21. The transistor Tr21 in the circuit 640[j] has a function of generating the current ICP[j] that corresponds to the difference between the current I[j] and the current IREF, when the current I[j] is lower than the current IREF and offset current is set. Furthermore, the transistor Tr21 in the circuit 640[j+1] has a function of generating a current ICP[j+1] that corresponds to the difference between the current I[j+1] and the current IREF, when the current I[j+1] is lower than the current IREF. The current ICP[j] and the current ICP[j+1] are drawn from the wiring BL[j] and the wiring BL[j+1] into the circuit 640[j] and the circuit 640[j+1], respectively.

Note that the current ICM[j] and the current ICP[j] each correspond to Ioffset[j], and the current ICM[j+1] and the current ICP[j+1] each correspond to Ioffset[j+1].

In each of the circuit 640[j] and the circuit 640[j+1], one of a source and a drain of the transistor Tr21 is connected to the corresponding wiring BL, and the other of the source and the drain is connected to a wiring through which a predetermined potential is supplied. One of a source and a drain of the transistor Tr22 is connected to the corresponding wiring BL, and the other of the source and the drain is connected to a gate of the transistor Tr21. One of a source and a drain of the transistor Tr23 is connected to the gate of the transistor Tr21, and the other of the source and the drain is connected to a wiring through which a predetermined potential is supplied. A first electrode of the capacitor C21 is connected to the gate of the transistor Tr21, and a second electrode of the capacitor C21 is connected to a wiring through which a predetermined potential is supplied.

A gate of the transistor Tr22 is connected to a wiring OSP, and a gate of the transistor Tr23 is connected to a wiring ORP.

Note that FIG. 21 illustrates an example where the transistors Tr21 to Tr23 are n-channel transistors.

The current supply circuit 650 includes a transistor Tr27 for the wiring BL and a transistor Tr28 for the wiring BLREF. Specifically, FIG. 21 illustrates an example where the current supply circuit 650 includes, as the transistor Tr27, a transistor Tr27[j] for the wiring BL[j] and a transistor Tr27[j+1] for the wiring BL[j+1].

A gate of the transistor Tr27 is connected to a gate of the transistor Tr28. One of a source and a drain of the transistor Tr27 is connected to the corresponding wiring BL, and the other of the source and the drain is connected to a wiring through which a predetermined potential is supplied. One of a source and a drain of the transistor Tr28 is connected to the wiring BLREF, and the other of the source and the drain is connected to a wiring through which a predetermined potential is supplied.

The transistors Tr27 and Tr28 have the same polarity. FIG. 21 illustrates an example where the transistors Tr27 and Tr28 are p-channel transistors.

The drain current of the transistor Tr28 corresponds to the current IREF. The transistor Tr27 and the transistor Tr28 collectively serve as a current mirror circuit; thus, the drain current of the transistor Tr27 is substantially the same as the drain current of the transistor Tr28 or corresponds to the drain current of the transistor Tr28.

<Operation Example of Semiconductor Device>

Next, a specific operation example of the semiconductor device 600 of one embodiment of the present invention will be described with reference to FIG. 20, FIG. 21, and FIG. 22.

Figure 22:
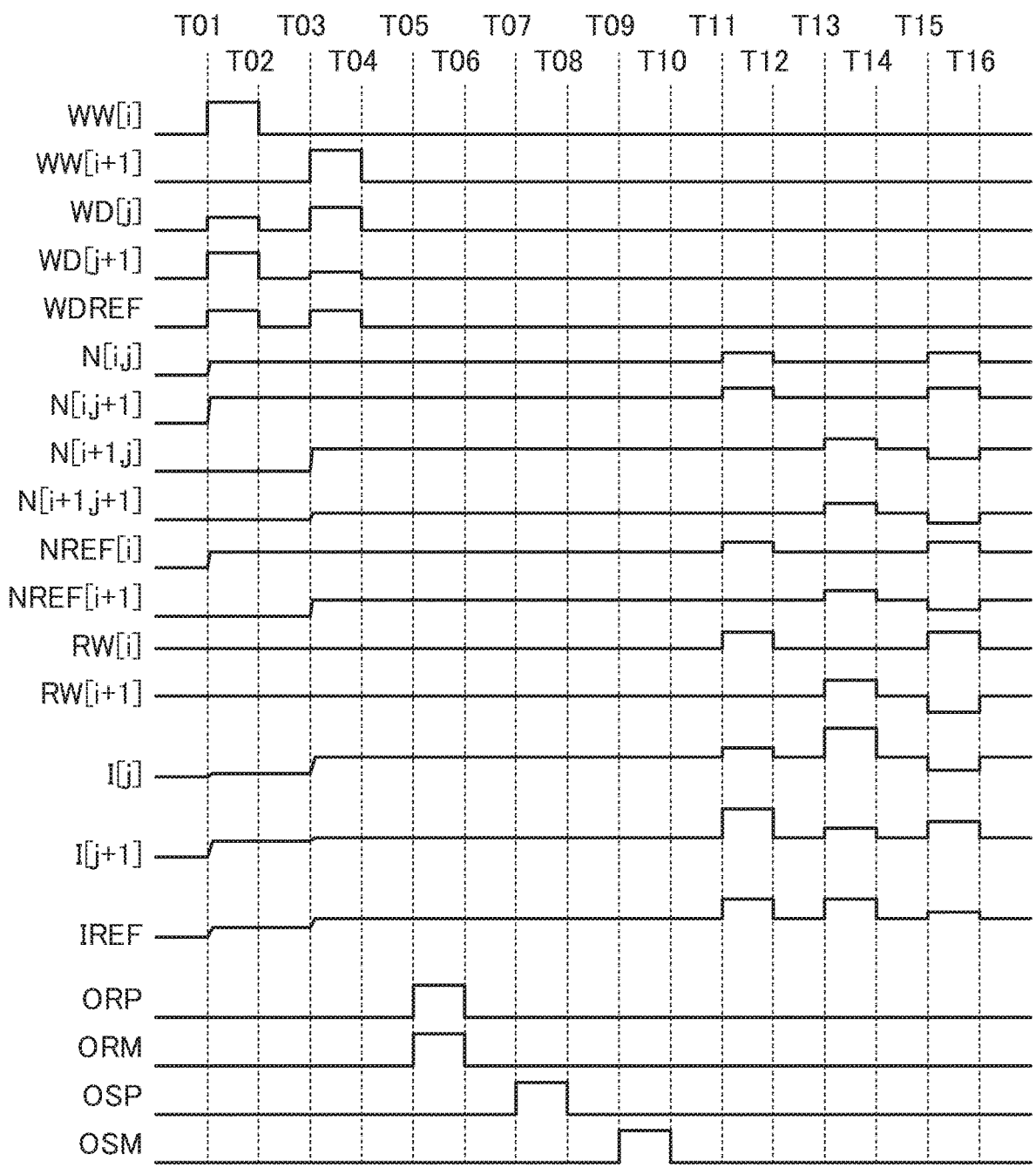
FIG. 22 is a timing chart illustrating an operation of a semiconductor device.

FIG. 22 is an example of a timing chart showing the operations of the memory cell MC and the memory cell MCR illustrated in FIG. 20 and the circuit 630, the circuit 640, and the current supply circuit 650 illustrated in FIG. 21. From Time T01 to Time T04 in FIG. 22, the first analog data is stored in the memory cell MC and the memory cell MCR. From Time T05 to Time T10, the value of the offset current Ioffset that is supplied from the circuit 630 and the circuit 640 is set. From Time T11 to Time T16, data corresponding to the product-sum of the first analog data and the second analog data is acquired.

Note that a low-level potential VSS is supplied to the wiring VR[j] and the wiring VR[j+1]. The high-level potential VDD is supplied to all wirings having a predetermined potential that are connected to the circuit 630. The low-level potential VSS is supplied to all wirings having a predetermined potential that are connected to the circuit 640. Furthermore, the high-level potential VDD is supplied to all wirings having a predetermined potential that are connected to the current supply circuit 650.

The transistors Tr11, Tr21, Tr24, Tr27[j], Tr27[j+1], and Tr28 each operate in a saturation region.

First, a high-level potential is applied to the wiring WW[i] and a low-level potential is applied to the wiring WW[i+1] from Time T01 to Time T02. Accordingly, the transistors Tr12 in the memory cell MC[i, j], the memory cell MC[i, j+1], and the memory cell MCR[i] illustrated in FIG. 20 are turned on. The transistors Tr12 in the memory cell MC[i+1, j], the memory cell MC[i+1, j+1], and the memory cell MCR[i+1] remain off.

In addition, from Time T01 to Time T02, a potential obtained by subtracting the first analog potential from the first reference potential VPR is applied to each of the wiring WD[j] and the wiring WD[j+1] illustrated in FIG. 20. Specifically, the potential VPR−Vx[i, j] is applied to the wiring WD[j], and a potential VPR−Vx[i, j+1] is applied to the wiring WD[j+1]. The first reference potential VPR is applied to the wiring WDREF, and a potential between the potential VSS and the potential VDD, e.g., a potential (VDD+VSS)/2, is applied as a base potential to the wiring RW[i] and the wiring RW[i+1].

Accordingly, the potential VPR−Vx[i, j] is applied to a node N[i, j] through the transistor Tr12 in the memory cell MC[i, j] illustrated in FIG. 20, the potential VPR−Vx[i, j+1] is applied to a node N[i, j+1] through the transistor Tr12 in the memory cell MC[i, j+1], and the potential VPR is applied to a node NREF[i] through the transistor Tr12 in the memory cell MCR[i].

After Time T02, the potential applied to the wiring WW[i] illustrated in FIG. 20 changes from a high-level potential to a low-level potential, so that the transistors Tr12 in the memory cell MC[i, j], the memory cell MC[i, j+1], and the memory cell MCR[i] are turned off. Accordingly, the potential VPR−Vx[i, j] is held at the node N[i, j], the potential VPR−Vx[i, j+1] is held at the node N[i, j+1], and the potential VPR is held at the node NREF[i].

Then, from Time T03 to Time T04, the potential of the wiring WW[i] illustrated in FIG. 20 remains at a low level and a high-level potential is applied to the wiring WW[i+1]. Accordingly, the transistors Tr12 in the memory cell MC[i+

1, j], the memory cell MC[i+1,j+1], and the memory cell MCR[i+1] illustrated in FIG. 20 are turned on. The transistors Tr12 in the memory cell MC[i, j], the memory cell MC[i, j+1], and the memory cell MCR[i] remain off.

In addition, from Time T03 to Time T04, a potential obtained by subtracting the first analog potential from the first reference potential VPR is applied to each of the wiring WD[j] and the wiring WD[j+1] illustrated in FIG. 20. Specifically, the potential VPR−Vx[i+1, j] is applied to the wiring WD[j], and a potential VPR−Vx[i+1, j+1] is applied to the wiring WD[j+1]. The first reference potential VPR is applied to the wiring WDREF, and a potential between the potential VSS and the potential VDD, e.g., the potential (VDD+VSS)/2, is applied as a base potential to the wiring RW[i] and the wiring RW[i+1].

Accordingly, the potential VPR−Vx[i+1, j] is applied to a node N[i+1, j] through the transistor Tr12 in the memory cell MC[i+1, j] illustrated in FIG. 20, the potential VPR−Vx[i+1, 1+1] is applied to a node N[i+1, j+1] through the transistor Tr12 in the memory cell MC [i+1, j+1], and the potential VPR is applied to a node NREF[i+1] through the transistor Tr12 in the memory cell MCR[i+1].

After Time T04, the potential applied to the wiring WW[i+1] illustrated in FIG. 20 changes from a high-level potential to a low-level potential, so that the transistors Tr12 in the memory cell MC[i+1, j], the memory cell MC[i+1, j+1], and the memory cell MCR[i+1] are turned off. Accordingly, the potential VPR−Vx[i+1, j] is held at the node N[i+1, j], the potential VPR−Vx[i+1, j+1] is held at the node N[i+1, j+1], and the potential VPR is held at the node NREF[i+1].

Next, a high-level potential is applied to the wiring ORP and the wiring ORM illustrated in FIG. 21 from Time T05 to Time T06. When a high-level potential is applied to the wiring ORM, the transistors Tr26 in the circuit 630[$_7$] and the circuit 630[$j$+1] illustrated in FIG. 21 are turned on, so that the gates of the transistors Tr24 are reset by the potential VDD applied thereto. Furthermore, when a high-level potential is applied to the wiring ORP, the transistors Tr23 in the circuit 640[$j$] and the circuit 640[$j$+1] illustrated in FIG. 21 are turned on, so that the gates of the transistors Tr21 are reset by the potential VSS applied thereto.

After Time T06, the potential applied to the wiring ORP and the wiring ORM illustrated in FIG. 21 changes from a high-level potential to a low-level potential, so that the transistors Tr26 in the circuit 630[$j$] and the circuit 630[$j$+1] and the transistors Tr23 in the circuit 640[$j$] and the circuit 640[$j$+1] are turned off. Accordingly, the potential VDD is held at the gate of the transistor Tr24 in each of the circuit 630[$j$] and the circuit 630[$j$+1], and the potential VSS is held at the gate of the transistor Tr21 in each of the circuit 640[$j$] and the circuit 640[$j$+1].

From Time T07 to Time T08, a high-level potential is applied to the wiring OSP illustrated in FIG. 21. Furthermore, a potential between the potential VSS and the potential VDD, e.g., the potential (VDD+VSS)/2, is applied as a base potential to the wiring RW[i] and the wiring RW[i+1] illustrated in FIG. 20. Since a high-level potential is applied to the wiring OSP, the transistors Tr22 in the circuit 640[$j$] and the circuit 640[$j$+1] are turned on.

If the current I[j] flowing through the wiring BL[j] is lower than the current IREF flowing through the wiring BLREF, that is, if the current ΔI[j] has a positive value, it means that the sum of current that can be drawn by the transistor Tr28 in the memory cell MC[i, j] illustrated in FIG. 20 and current that can be drawn by the transistor Tr28 in the memory cell MC[i+1, j] is smaller than the value of the drain current of the transistor Tr27[$j$]. Thus, if the current ΔI[j] has a positive value, part of the drain current of the transistor Tr27[$j$] flows to the gate of the transistor Tr21 when the transistor Tr22 is turned on in the circuit 640[$j$], and the potential of the gate starts to rise. When the drain current of the transistor Tr21 becomes substantially equal to the current ΔI[j], the potential of the gate of the transistor Tr21 converges on a certain value. The potential of the gate of the transistor Tr21 at this time corresponds to a potential at which the drain current of the transistor Tr21 becomes the current ΔI[j], i.e., Ioffset[j](=ICP[j]). This means that the transistor Tr21 in the circuit 640[$j$] is in a state of serving as a current source that can supply the current ICP[j].

Similarly, if I[j+1] flowing through the wiring BL[j+1] is lower than the current IREF flowing through the wiring BLREF, that is, if a current ΔI[j+1] has a positive value, part of the drain current of the transistor Tr27[$j$+1] flows to the gate of the transistor Tr21 when the transistor Tr22 is turned on in the circuit 640[$j$+1], and the potential of the gate starts to rise. When the drain current of the transistor Tr21 becomes substantially equal to the current ΔI[j+1], the potential of the gate of the transistor Tr21 converges on a certain value. The potential of the gate of the transistor Tr21 at this time corresponds to a potential at which the drain current of the transistor Tr21 becomes the ΔI[j+1], i.e., Ioffset[j+1] (=ICP[j+1]). This means that the transistor Tr21 in the circuit 640[$j$+1] is in a state of serving as a current source that can supply the current ICP[j+1].

After Time T08, the potential applied to the wiring OSP illustrated in FIG. 21 changes from a high-level potential to a low-level potential, so that the transistors Tr22 in the circuit 640[$j$] and the circuit 640[$j$+1] are turned off. Accordingly, the potentials of the gates of the transistors Tr21 are held. Thus, the circuit 640[$j$] remains in a state of serving as the current source that can supply the current ICP[j], and the circuit 640[$j$+1] remains in a state of serving as the current source that can supply the current ICP [j+1].

From Time T09 to Time T10, a high-level potential is applied to the wiring OSM illustrated in FIG. 21. Furthermore, a potential between the potential VSS and the potential VDD, e.g., the potential (VDD+VSS)/2, is applied as a base potential to each of the wiring RW[i] and the wiring RW[i+1] illustrated in FIG. 20. Since a high-level potential is applied to the wiring OSM, the transistors Tr25 in the circuit 630[$j$] and the circuit 630[$j$+1] are turned on.

If I[j] flowing through the wiring BL[j] is higher than the current IREF flowing through the wiring BLREF, that is, if ΔI[j] has a negative value, it means that the sum of current that can be drawn by the transistor Tr28 in the memory cell MC[i, j] illustrated in FIG. 20 and current that can be drawn by the transistor Tr28 in the memory cell MC[i+1, j] is larger than the value of the drain current of the transistor Tr27[$j$]. Thus, if the current ΔI[j] has a negative value, current flows from the gate of the transistor Tr24 to the wiring BL[j] when the transistor Tr25 is turned on in the circuit 630[$j$], and the potential of the gate starts to decrease. When the drain current of the transistor Tr24 becomes substantially equal to the current ΔI[j], the potential of the gate of the transistor Tr24 converges on a certain value. The potential of the gate of the transistor Tr24 at this time corresponds to a potential at which the drain current of the transistor Tr24 becomes the current ΔI[j], i.e., Ioffset[j] (=ICM[j]). This means that the transistor Tr24 in the circuit 630[$j$] is in a state of serving as a current source that can supply the current ICM[j].

Similarly, if I[j+1] flowing through the wiring BL[j+1] is higher than the current IREF flowing through the wiring BLREF, that is, if the current ΔI[j+1] has a negative value, current flows from the gate of the transistor Tr24 in the circuit 630[j+1] to the wiring BL[j+1] when the transistor Tr25 is turned on, and the potential of the gate starts to decrease. When the drain current of the transistor Tr24 becomes substantially equal to the absolute value of the current ΔI[j+1], the potential of the gate of the transistor Tr24 converges on a certain value. The potential of the gate of the transistor Tr24 at this time corresponds to a potential at which the drain current of the transistor Tr24 becomes equal to the absolute value of the current ΔI[j+1], i.e., Ioffset[j+1] (=ICM[j+1]). This means that the transistor Tr24 in the circuit 630[j+1] is in a state of serving as a current source that can supply the current ICM[j+1].

After Time T10, the potential applied to the wiring OSM illustrated in FIG. 21 changes from a high-level potential to a low-level potential, so that the transistors Tr25 in the circuit 630[j] and the circuit 630[j+1] are turned off. Accordingly, the potentials of the gates of the transistors Tr24 are held. Thus, the circuit 630[j] remains in a state of serving as the current source that can supply the current ICM[j], and the circuit 630[j+1] remains in a state of serving as the current source that can supply the current ICM[j+1].

In each of the circuit 640[j] and the circuit 640[j+1], the transistor Tr21 has a function of drawing current. Thus, from Time T07 to Time T08, when the current I[j] flowing through the wiring BL[j] is higher than the current IREF flowing through the wiring BLREF and ΔI[j] has a negative value, or when the current I[j+1] flowing through the wiring BL[j+1] is higher than the current IREF flowing through the wiring BLREF and ΔI[j+1] has a negative value, it might be difficult to supply current from the circuit 640[j] or the circuit 640[j+1] to the wiring BL[j] or the wiring BL[j+1] without excess or deficiency. In that case, it might be difficult for the transistor Tr11 in the memory cell MC, the transistor Tr21 in the circuit 640[j] or the circuit 640[j+1], and the transistor Tr27[j] or Tr27[j+1] to concurrently operate in a saturation region because a balance between the current flowing through the wiring BLREF and the current flowing through the wiring BL[j] or the wiring BL[j+1] is struck.

To ensure the operations of the transistor Tr11, the transistor Tr21, and the transistor Tr27[j] or Tr27[j+1] in a saturation region from Time T07 to Time T08 even when ΔI[j] has a negative value, the potential of the gate of the transistor Tr24 may be set to a potential that is high enough to obtain a predetermined drain current, instead of resetting the potential of the gate of the transistor Tr24 to the potential VDD, from Time T05 to Time T06. In the above configuration, the amount of current that cannot be drawn by the transistor Tr11 can be drawn by the transistor Tr21 to some extent because current from the transistor Tr24, as well as the drain current of the transistor Tr27[j] or Tr27[j+1], is supplied; thus, the operations of the transistor Tr11, the transistor Tr21, and the transistor Tr27[j] or Tr27[j+1] in a saturation region can be ensured.

Note that if I[j] flowing through the wiring BL[j] is lower than the current IREF flowing through the wiring BLREF, that is, if ΔI[j] has a positive value, from Time T09 to Time T10, since the circuit 640[j] has been set as the current source that can supply the current ICP[j] from Time T07 to Time T08, the potential of the gate of the transistor Tr24 in the circuit 630[j] keeps a value substantially the same as that of the potential VDD. Similarly, if the current I[j+1] flowing through the wiring BL[j+1] is lower than the current IREF flowing through the wiring BLREF, that is, if the current ΔI[j+1] has a positive value, since the circuit 640[j+1] has been set as the current source that can supply the current ICP[j+1] from Time T07 to Time T08, the potential of the gate of the transistor Tr24 in the circuit 630[j+1] keeps a value substantially the same as that of the potential VDD.

Then, from Time T11 to Time T12, the second analog potential Vw[i] is applied to the wiring RW[i] illustrated in FIG. 20. Furthermore, a potential between the potential VSS and the potential VDD, e.g., the potential (VDD+VSS)/2, is still applied as a base potential to the wiring RW[i+1]. In practice, the potential of the wiring RW[i] is a potential higher than the potential between the potential VSS and the potential VDD (e.g., the potential (VDD+VSS)/2), which is a base potential, by Vw[i]; for the simplicity of the following description, however, the potential of the wiring RW[i] is assumed to be the potential Vw[i].

When the potential of the wiring RW[i] becomes the potential Vw[i], with the assumption that the amount of change in the potential of the first electrode of the capacitor C11 is substantially the same as the amount of change in the potential of the node N, the potential of the node N in the memory cell MC[i, j] illustrated in FIG. 20 becomes VPR−Vx[i, j]+Vw[i] and the potential of the node N in the memory cell MC[i, j+1] becomes VPR−Vx[i, j+1]+Vw[i]. According to Formula 6, the product-sum of the first analog data and the second analog data for the memory cell MC[i, j] affects current obtained by subtracting Ioffset[j] from the current ΔI[j], that is, the current Iout[j] flowing from the wiring BL[j]. Furthermore, the product-sum of the first analog data and the second analog data for the memory cell MC[i, j+1] affects current obtained by subtracting Ioffset[j+1] from the current ΔI[j+1], that is, a current Iout[j+1] flowing from the wiring BL[j+1].

After Time T12, a potential between the potential VSS and the potential VDD (e.g., the potential (VDD+VSS)/2), which is a base potential, is applied again to the wiring RW[i].

Then, from Time T13 to Time T14, the second analog potential Vw[i+1] is applied to the wiring RW[i+1] illustrated in FIG. 20. Furthermore, a potential between the potential VSS and the potential VDD, e.g., the potential (VDD+VSS)/2, is still applied as a base potential to the wiring RW[i]. In practice, the potential of the wiring RW[i+1] is a potential higher than the potential between the potential VSS and the potential VDD (e.g., the potential (VDD+VSS)/2), which is a base potential, by Vw[i+1]; for the simplicity of the following description, however, the potential of the wiring RW[i+1] is assumed to be the potential Vw[i+1].

When the potential of the wiring RW[i+1] becomes the potential Vw[i+1], with the assumption that the amount of change in the potential of the first electrode of the capacitor C11 is substantially the same as the amount of change in the potential of the node N, the potential of the node N in the memory cell MC[i+1, j] illustrated in FIG. 20 becomes VPR−Vx[i+1, j]+Vw[i+1] and the potential of the node N in the memory cell MC[i+1, 1+1] becomes VPR−Vx[i+1, j+1]+Vw[i+1]. According to Formula 6, the product-sum of the first analog data and the second analog data for the memory cell MC[i+1, j] affects current obtained by subtracting Ioffset[j] from the current ΔI[j], that is, Iout[j]. Furthermore, the product-sum of the first analog data and the second analog data for the memory cell MC[i+1, j+1] affects current obtained by subtracting Ioffset[j+1] from the current ΔI[j+1], that is, Iout[j+1].

After Time T12, a potential between the potential VSS and the potential VDD (e.g., the potential (VDD+VSS)/2), which is a base potential, is applied again to the wiring RW[i+1].

Then, from Time T15 to Time T16, the second analog potential Vw[i] is applied to the wiring RW[i] illustrated in FIG. 20 and the second analog potential Vw[i+1] is applied to the wiring RW[i+1]. In practice, the potential of the wiring RW[i] is a potential higher than the potential between the potential VSS and the potential VDD (e.g., the potential (VDD+VSS)/2), which is a base potential, by Vw[i], and the potential of the wiring RW[i+1] is a potential higher than the potential between the potential VSS and the potential VDD (e.g., the potential (VDD+VSS)/2), which is a base potential, by Vw[i+1]; for the simplicity of the following description, however, the potential of the wiring RW[i] is assumed to be the potential Vw[i] and the potential of the wiring RW[i+1] is assumed to be the potential Vw[i+1].

When the potential of the wiring RW[i] becomes the potential Vw[i], with the assumption that the amount of change in the potential of the first electrode of the capacitor C11 is substantially the same as the amount of change in the potential of the node N, the potential of the node N in the memory cell MC[i, j] illustrated in FIG. 20 becomes VPR−Vx[i, j]+Vw[i] and the potential of the node N in the memory cell MC[i, j+1] becomes VPR−Vx[i, j+1]+Vw[i]. Furthermore, when the potential of the wiring RW[i+1] becomes the potential Vw[i+1], with the assumption that the amount of change in the potential of the first electrode of the capacitor C11 is substantially the same as the amount of change in the potential of the node N, the potential of the node N in the memory cell MC[i+1, j] illustrated in FIG. 20 becomes VPR−Vx[i+1, j]+Vw[i+1] and the potential of the node N in the memory cell MC[i+1, 1+1] becomes VPR−Vx[i+1, j+1]+Vw[i+1].

According to Formula 6, the product-sum of the first analog data and the second analog data for the memory cell MC[i, j] and the memory cell MC[i+1, j] affects current obtained by subtracting Ioffset[j] from the current ΔI[j], that is, the current Iout[j]. Furthermore, the product-sum of the first analog data and the second analog data for the memory cell MC[i, j+1] and the memory cell MC[i+1,j+1] affects current obtained by subtracting Ioffset[j+1] from the current ΔI[j+1], that is, a current Iout[j+1].

After Time T16, a potential between the potential VSS and the potential VDD (e.g., the potential (VDD+VSS)/2), which is a base potential, is applied again to the wiring RW[i] and the wiring RW[i+1].

With the above configuration, the product-sum operation can be performed with a small circuit scale. With the above configuration, the product-sum operation can be performed at high speed. With the above configuration, the product-sum operation can be performed with low power.

Note that a transistor with an extremely low off-state current is desirably used as the transistor Tr12, Tr22, Tr23, Tr25, or Tr26. When a transistor with an extremely low off-state current is used as the transistor Tr12, the potential of the node N can be held for a long time. When a transistor with an extremely low off-state current is used as the transistors Tr22 and Tr23, the potential of the gate of the transistor Tr21 can be held for a long time. When a transistor with an extremely low off-state current is used as the transistors Tr25 and Tr26, the potential of the gate of the transistor Tr24 can be held for a long time.

As a transistor with an extremely low off-state current, an OS transistor may be used. The leakage current of an OS transistor normalized by channel width can be lower than or equal to $10 \times 10^{-21}$ A/μm (10 zA/μm) with a source-drain voltage of 10 V at room temperature (approximately 25° C.).

With the use of the semiconductor device described above, the product-sum operation in the neural network 207 can be performed.

This embodiment can be combined with any of the other embodiments as appropriate.

Embodiment 3

In this embodiment, a photoelectric conversion element, a display element, and a transistor which can be used in the imaging display device of one embodiment of the present invention will be described with reference to the drawings.

Figure 23A:
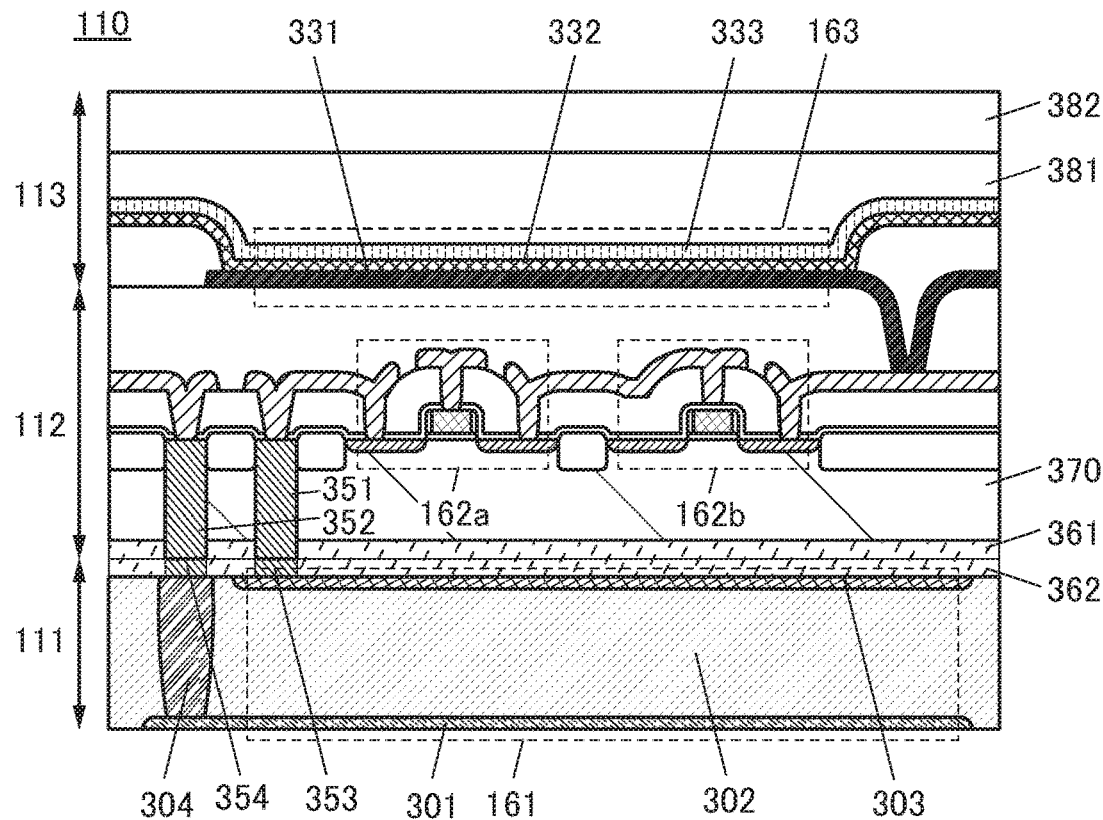
FIGS. 23A and 23B each illustrate a structure of a pixel in an imaging device.

FIG. 23A illustrates a cross section of a pixel included in the imaging display device 110 illustrated in FIG. 4A. The layer 111 includes a photodiode as the photoelectric conversion element 161. The layer 112 includes a transistor or the like included in the pixel circuit 162. The layer 113 includes a light-emitting element as the display element 163.

The photodiode included in the layer 111 is a PN photodiode or a PIN photodiode which uses silicon in its photoelectric conversion layer, and includes a layer 301, a layer 302, and a layer 303.

For example, the layer 301 can be an n-type region, the layer 302 can be a p⁻-type region, and the layer 303 can be a p⁺-type region. Note that the layer 302 may be an i-type region. In the layer 302, a region 304 for connection between a power supply line and the layer 301 is provided. For example, the region 304 can be a p⁺-type region.

The PN photodiode or the PIN photodiode can be formed using typically single crystal silicon. Furthermore, the PIN photodiode may be formed using a thin film of amorphous silicon, microcrystalline silicon, polycrystalline silicon, or the like.

Here, FIG. 23A illustrates a structure example in which an electric connection between the layer 111 and the layer 112 is established by a bonding step.

On a first surface of the layer 111, an insulating layer 362 and conductive layers 353 and 354 which include regions embedded in the insulating layer 362 are provided. The conductive layer 353 is electrically connected to the layer 303. The conductive layer 354 is electrically connected to the region 304. Furthermore, the insulating layer 362, the conductive layer 353, and the conductive layer 354 are planarized to have an aligned surface therebetween.

On a first surface of the layer 112, an insulating layer 361 and conductive layers 351 and 352 which include regions embedded in the insulating layer 361 are provided. The conductive layer 351 is electrically connected to a power supply line. The conductive layer 352 is electrically connected to a source or a drain of the transistor 162a. Furthermore, the insulating layer 361, the conductive layer 351, and the conductive layer 352 are planarized so as to have an aligned surface therebetween.

Here, a main component of the conductive layer 351 and a main component of the conductive layer 353 are preferably the same metal element. A main component of the conductive layer 352 and a main component of the conductive layer 354 are preferably the same metal element. Moreover, the insulating layers 361 and 362 are preferably formed of the same components.

For example, the conductive layers 351, 352, 353, and 354 can be formed using Cu, Al, Sn, Zn, W, Ag, Pt, Au, or the like. Preferably, Cu, Al, W, or Au is used for easy bonding. In addition, silicon oxide, silicon oxynitride, silicon nitride oxide, silicon nitride, titanium nitride, or the like can be used for the insulating layers 361 and 362.

That is, the same metal element selected from the above-described metal elements is preferably used in the conductive layers 351 and 353, and the same metal element selected from the above-described metal elements is preferably used in the conductive layers 352 and 354. Furthermore, the same insulating material selected from the above-described insulating materials is preferably used in the insulating layers 361 and 362. With this structure, a bonding step where a boundary between the layer 111 and the layer 112 is a bonding position can be performed. This bonding step enables an electric connection between the conductive layer 351 and the conductive layer 353 and between the conductive layer 352 and the conductive layer 354. Moreover, the insulating layer 361 and the insulating layer 362 can be connected with adequate mechanical strength.

For bonding the metal layers to each other, surface activated bonding and diffusion bonding can be used. Surface activated bonding is a method in which an oxide film and a layer adsorbing impurities over the surface of the metal layer are removed by sputtering treatment or the like and the cleaned and activated surfaces of the metal layers are made to be in contact with and bonded to each other. Diffusion bonding is a method in which the surfaces of the metal layers are bonded to each other by adjusting temperature and pressure together. Both methods can cause bonding at an atomic level and therefore the bonding with excellent electric and mechanical strength can be achieved.

For bonding the insulating layers to each other, hydrophilic bonding or the like can be used after high planarity is obtained by polishing or the like. Hydrophilic bonding is a method in which the surfaces of the insulating layers are subjected to hydrophilicity treatment with oxygen plasma or the like, arranged in contact with and bonded to each other temporarily, and then dehydrated by heat treatment to perform final bonding. The hydrophilic bonding can also cause bonding at an atomic level; thus, bonding with excellent mechanical strength can be achieved.

The insulating layers and the metal layers are mixed on the bonding surfaces of the layers 111 and 112; therefore, for example, surface activated bonding and hydrophilic bonding are preferably performed in combination when the layers 111 and 112 are bonded to each other.

For example, the following method can be used: the surfaces of the metal layers are made clean after polishing, the surfaces of the metal layers are subjected to antioxidant treatment and hydrophilicity treatment, and then bonding is performed. Alternatively, hydrophilicity treatment may be performed on the surfaces of the metal layers with the use of hardly oxidizable metal such as Au. Note that a bonding method other than the above method may be used.

Note that the transistor or the like may be formed on a first surface of the same silicon substrate, and the photodiode may be formed on a surface opposite to the first surface.

Figure 25A:
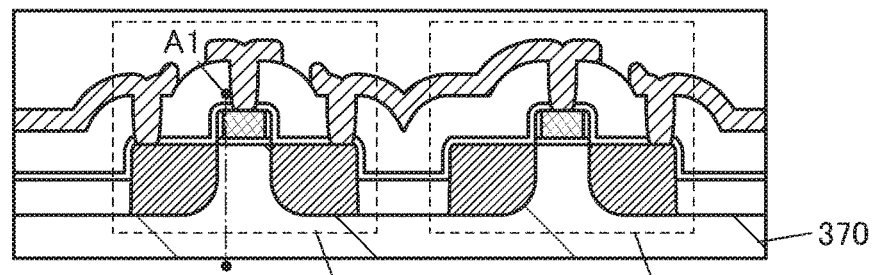
FIGS. 25A to 25E each illustrate a structure of a pixel in an imaging device.
Figure 25B:
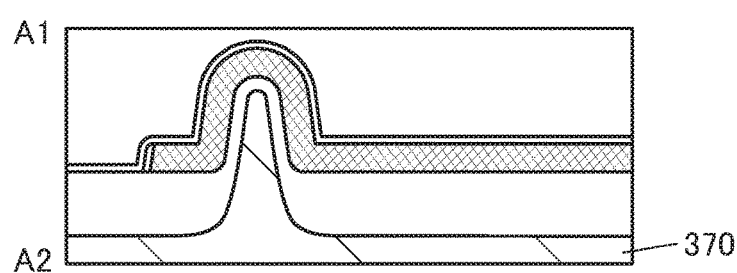
Figure 25C:
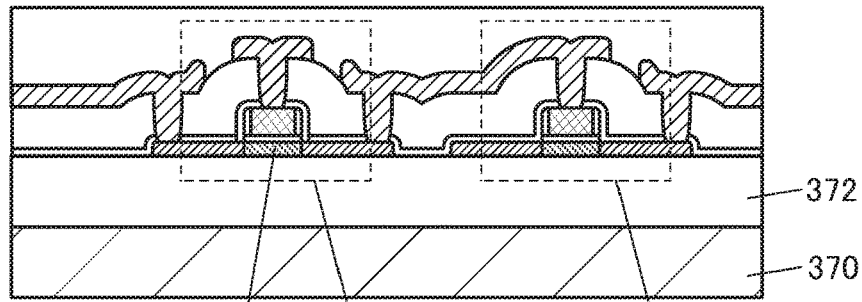

The layer 112 includes a Si transistor provided on a silicon substrate 370. Although the Si transistor illustrated in FIG. 23A is of a planar type including an active region in the silicon substrate 370, the Si transistor may include a fin semiconductor layer in the silicon substrate 370 as illustrated in FIGS. 25A and 25B. Alternatively, the transistor may include a semiconductor layer 371 formed of a silicon thin film, as illustrated in FIG. 25C. The semiconductor layer 371 can be single crystal silicon (silicon on insulator (SOI)) formed on an insulating layer 372 on the silicon substrate 370, for example.

In the layer 113, a light-emitting element is included as the display element 163. As the light-emitting element, a self-luminous element can be used. An element whose luminance is controlled by current or voltage is included in the category of the light-emitting element. For example, an LED, an organic EL element, an inorganic EL element, or the like can be used.

The light-emitting element has a top emission structure, a bottom emission structure, a dual emission structure, or the like. Here, light is extracted from the layer 113 to the direction opposite to the layer 112 side; accordingly, a top-emission light-emitting element is used. A conductive film that transmits visible light is used as an electrode 333 through which light is extracted. A conductive film that reflects visible light is preferably used as an electrode 331 through which light is not extracted.

An EL layer 332 is provided between the electrode 331 and the electrode 333. The EL layer 332 includes at least a light-emitting layer. In addition to the light-emitting layer, the EL layer 332 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 332, either a low-molecular compound or a high-molecular compound can be used, and an inorganic compound may also be used. Each of the layers included in the EL layer 332 can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer 332 from the anode side and electrons are injected to the EL layer 332 from the cathode side. The injected electrons and holes are recombined in the EL layer 332 and a light-emitting substance contained in the EL layer 332 emits light.

In the case where a light-emitting element emitting white light is used as the light-emitting element, the EL layer 332 preferably contains two or more kinds of light-emitting substances. For example, the two or more kinds of light-emitting substances are selected so as to emit light of complementary colors to obtain white light emission. Specifically, it is preferable to contain two or more substances selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer 332. For example, the plurality of light-emitting layers in the EL layer 332 may be stacked in contact with each other or may be stacked with a region that does not include any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive film. For example, a stack of indium tin oxide and an alloy of silver and magnesium is preferably used, in which case conductivity can be increased. Still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

As a protective layer, a substrate 382 which transmits visible light is provided over the light-emitting element with an adhesive layer 381 provided therebetween. As the substrate 382, a glass substrate, a resin film, or the like can be used.

As the adhesive layer 381, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display panel.

In addition, a filler with a high refractive index or a light-scattering member may be mixed into the resin, in which case light extraction efficiency can be improved. For example, titanium oxide, barium oxide, zeolite, or zirconium can be used.

In the case where a white-light-emitting element is used, a color layer of red (R), green (G), blue (B), yellow (Y), cyan (C), magenta (M), or the like is provided over the light-emitting element, so that a color image can be produced. As examples of a material that can be used for the color layer, a metal material, a resin material, and a resin material containing a pigment or dye can be given.

Figure 23B:
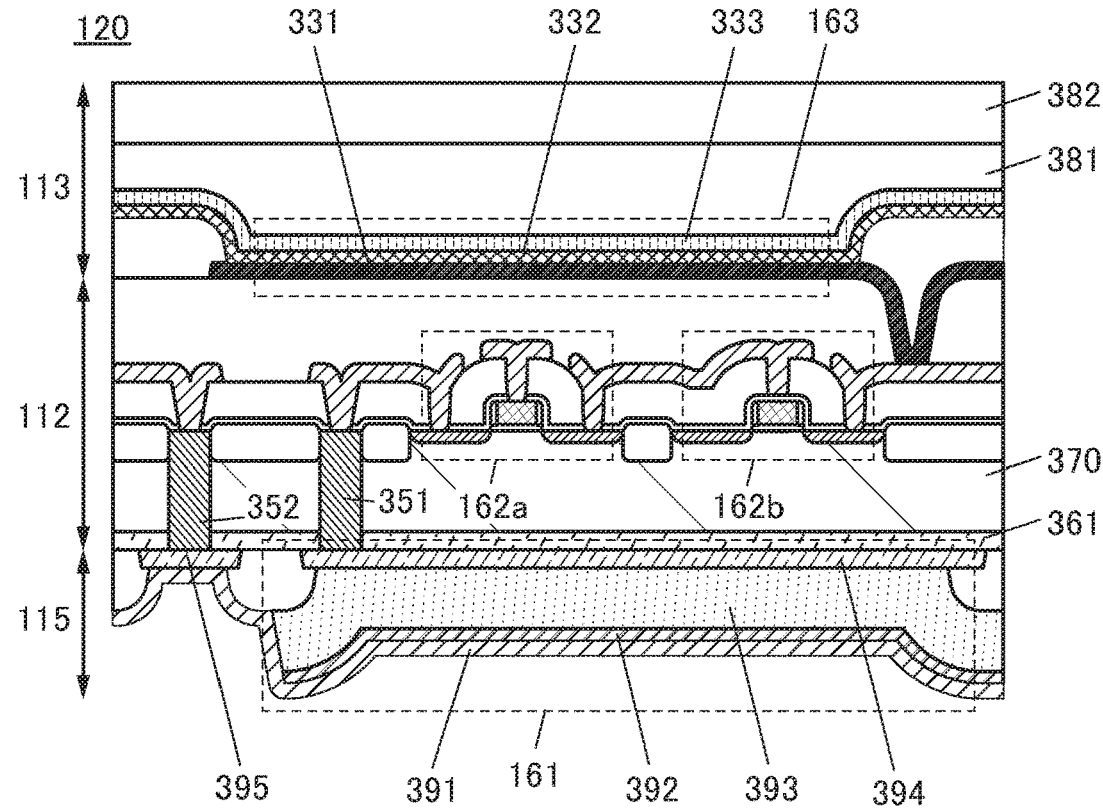

FIG. 23B illustrates a cross section of a pixel included in the imaging display device 120 illustrated in FIG. 4B. The layer 115 includes a photodiode as the photoelectric conversion element 161. The layer 112 includes a transistor or the like which is part of the pixel circuit 162. The layer 113 includes a light-emitting element as the display element 163. The imaging display device 120 is different from the imaging display device 110 in the structure of the photodiode. For the structures of the layers 112 and 113, the description of the imaging display device 110 can be referred to.

The illustrated photodiode in the layer 115 is a PN photodiode including a selenium-based material in a photoelectric conversion layer, and includes a layer 391, a layer 392, a layer 393, and a layer 394.

The layer 391 corresponds to a common electrode, and is preferably a conductive layer having a high light-transmitting property with respect to visible light. For example, indium oxide, tin oxide, zinc oxide, indium tin oxide, gallium zinc oxide, indium gallium zinc oxide, graphene, or the like can be used. Note that the layer 391 can be omitted.

The layers 392 and 393 are photoelectric conversion portions. A selenium-based material, which is a p-type semiconductor, is preferably used for the layer 393. A gallium oxide or the like, which is an n-type semiconductor, is preferably used for the layer 392.

The photoelectric conversion element including a selenium-based material has high external quantum efficiency with respect to visible light. Such a photoelectric conversion element can be a highly sensitive sensor in which the amount of amplification of electrons with respect to the amount of incident light is large owing to the avalanche effect. A selenium-based material has a high light-absorption coefficient, and thus enables, for example, formation of a thin photoelectric conversion layer; accordingly, the use of a selenium-based material has advantages in production. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials also have a function of a hole injection blocking layer, so that a dark current can be decreased.

The layer 394 corresponds to a pixel electrode, and a low-resistance metal layer or the like is preferably used for the layer 394. For example, aluminum, titanium, tungsten, tantalum, silver, or a stacked layer thereof can be used.

The layer 115 can be formed over the layer 112. The layer 394 is electrically connected to a source or a drain of the transistor 162a through the conductive layer 351 provided in the layer 112. The layer 391 is electrically connected to a power supply line through a conductive layer 395 and the conductive layer 352 provided in the layer 112.

Figure 24A:
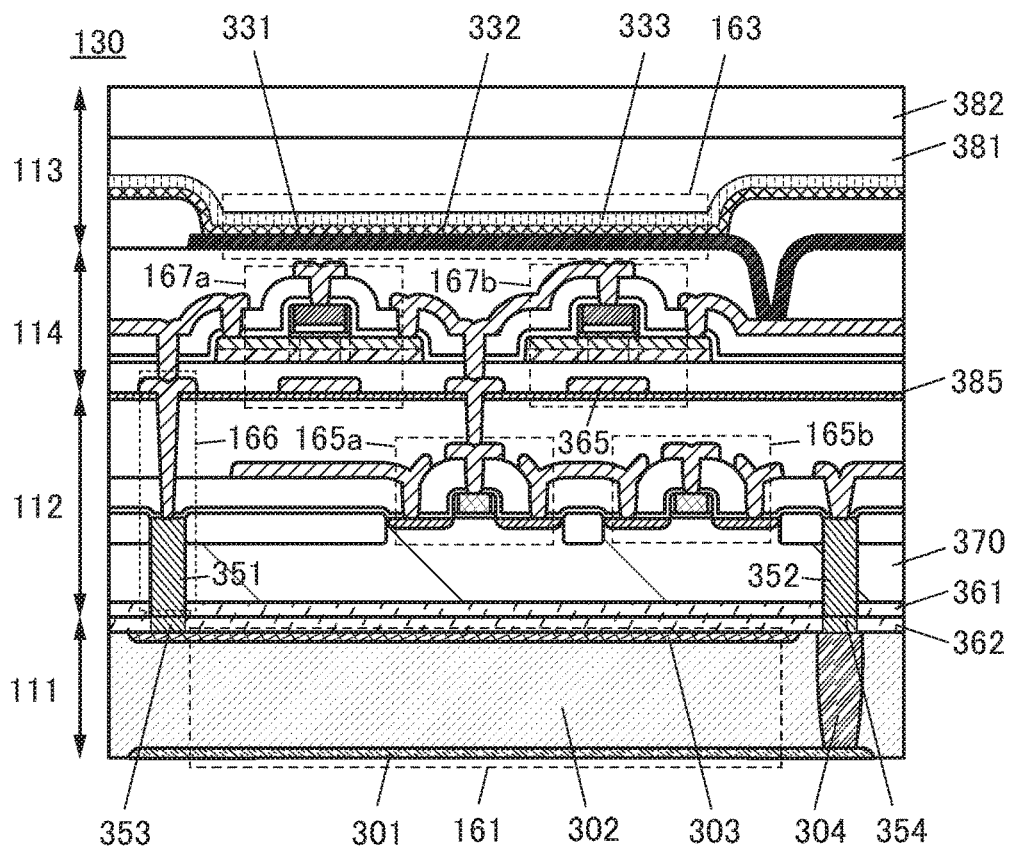
FIGS. 24A and 24B each illustrate a structure of a pixel in an imaging device.

FIG. 24A illustrates a cross section of a pixel included in the imaging display device 130 illustrated in FIG. 5A. The layer 111 includes a photodiode as the photoelectric conversion element 161. The layer 112 and the layer 114 include transistors or the like which are part of the pixel circuit 167. The layer 113 includes a light-emitting element as the display element 163. The imaging display device 130 is different from the imaging display device 110 in including the layer 114. For the structures of the layers 111, 112, and 113, the description of the imaging display device 110 can be referred to.

Figure 25D:
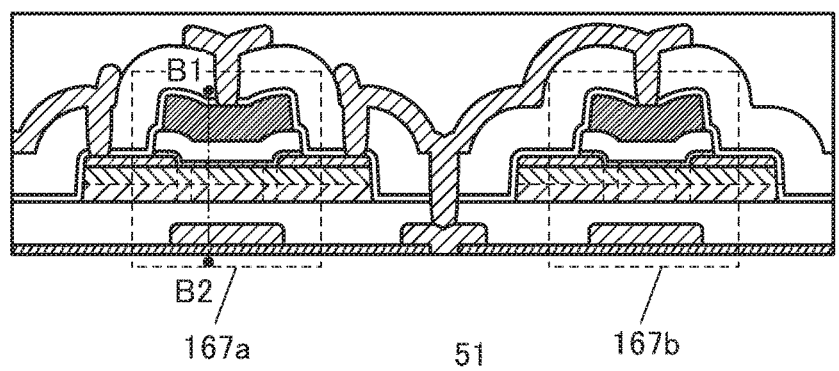

The layer 114 includes OS transistors. Although the OS transistors having a self-aligned structure are illustrated in FIG. 24A, top-gate transistors having a non-self-aligned structure may also be used as illustrated in FIG. 25D.

Figure 25E:
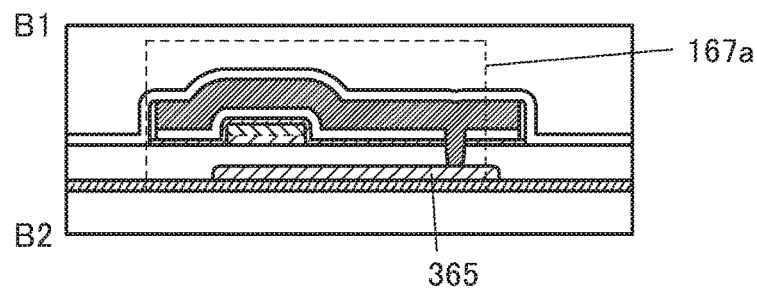

Although the transistors 167a and 167b both having a backgate 365 are illustrated, a structure in which one of the transistors 167a and 167b has a backgate may be employed as well. As illustrated in FIG. 25E, the backgate 365 might be electrically connected to a front gate of the transistor, which is provided to face the backgate. Alternatively, different fixed potentials may be supplied to the backgate 365 and the front gate.

As a semiconductor material used for the OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAC-OS described later can be used, for example.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, the atomic ratio of metal elements of a sputtering target used for forming a film of the In-M-Zn oxide preferably satisfy In≥M and Zn≥M. The atomic ratio of the metal elements (In:M:Zn) in such a sputtering target is preferably 1:1:1, 1:1:1.2, 3:1:2, 4:2:3, 4:2:4.1, 5:1:6, 5:1:7, or 5:1:8, for example. Note that the atomic ratio of the metal elements in the formed oxide semiconductor layer varies from the above atomic ratios of the metal elements of the sputtering targets in a range of ±40%.

An oxide semiconductor with a low carrier density is used as the semiconductor layer. For example, the semiconductor layer can be formed using an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$ and is higher than or equal to $1 \times 10^{-9}/cm^3$. Such an oxide semiconductor is referred to as a highly purified intrinsic or substantially highly purified intrinsic oxide semiconductor. Such an oxide semiconductor has a low impurity concentration and a low density of defect states and can thus be regarded as having stable characteristics.

Note that without limitation to the above examples, a material with an appropriate composition can be used depending on required semiconductor characteristics and electrical characteristics (e.g., field-effect mobility and threshold voltage) of the transistor. To obtain required semiconductor characteristics of the transistor, the carrier density, impurity concentration, defect density, atomic ratio between a metal element and oxygen, interatomic distance, density, and the like of the semiconductor layer are preferably set to appropriate values.

When silicon or carbon, which are elements belonging to Group 14, is contained in the oxide semiconductor included in the semiconductor layer, oxygen vacancies are increased and the semiconductor layer becomes n-type. Thus, the concentration of silicon or carbon (measured by secondary ion mass spectrometry) in the semiconductor layer is lower than or equal to $2 \times 10^{18}$ atoms/cm$^3$, preferably lower than or equal to $2 \times 10^{17}$ atoms/cm$^3$.

Alkali metal and alkaline earth metal may generate carriers when bonded to an oxide semiconductor, in which case the off-state current of the transistor might be increased. Therefore, the concentration of alkali metal or alkaline earth metal in the semiconductor layer (the concentration measured by secondary ion mass spectrometry) is lower than or equal to $1 \times 10^{18}$ atoms/cm$^3$, preferably lower than or equal to $2 \times 10^{16}$ atoms/cm$^3$.

When nitrogen is contained in the oxide semiconductor included in the semiconductor layer, electrons serving as carriers are generated and the carrier density increases, so that the semiconductor layer easily becomes n-type. Thus, a transistor including an oxide semiconductor that contains nitrogen is likely to be normally-on. Hence, the concentration of nitrogen in the semiconductor layer (the concentration measured by secondary ion mass spectrometry) is preferably lower than or equal to $5 \times 10^{18}$ atoms/cm$^3$.

The semiconductor layer may have a non-single-crystal structure, for instance. Examples of the non-single-crystal structure include a CAAC-OS (c-axis-aligned crystalline oxide semiconductor, or c-axis-aligned a-b-plane-anchored crystalline oxide semiconductor) including a c-axis-aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film with the amorphous structure has, for example, disordered atomic arrangement and no crystalline component. Alternatively, an oxide film with the amorphous structure has, for example, an absolutely amorphous structure and no crystal part.

Note that the semiconductor layer may be a mixed film including two or more of the following: a region with an amorphous structure, a region with a microcrystalline structure, a region with a polycrystalline structure, a CAAC-OS region, and a region with a single crystal structure. The mixed film has, for example, a single-layer structure or a stacked-layer structure including two or more of the above regions in some cases.

A structure of a cloud-aligned composite oxide semiconductor (CAC-OS), which is one embodiment of an amorphous semiconductor layer, will be described below.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element including a CAC-OS has high reliability. Thus, the CAC-OS is suitably used as a material in a variety of semiconductor devices.

An insulating layer 385 that has a function of inhibiting diffusion of hydrogen is provided between a region including OS transistors and a region including Si transistors. Dangling bonds of silicon are terminated with hydrogen in insulating layers provided in the vicinities of the active regions of the transistors 165a and 165b. Meanwhile, hydrogen in insulating layers which are provided in the vicinity of the oxide semiconductor layer that is the active layer of the transistors 167a and 167b causes generation of carriers in the oxide semiconductor layer.

Hydrogen is confined in the one layer by the insulating layer 385, so that the reliability of the transistors 165a and 165b can be improved. Furthermore, diffusion of hydrogen from the one layer to the other layer is inhibited, so that the reliability of the transistors 167a and 167b can also be improved.

The insulating layer 385 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Figure 24B:
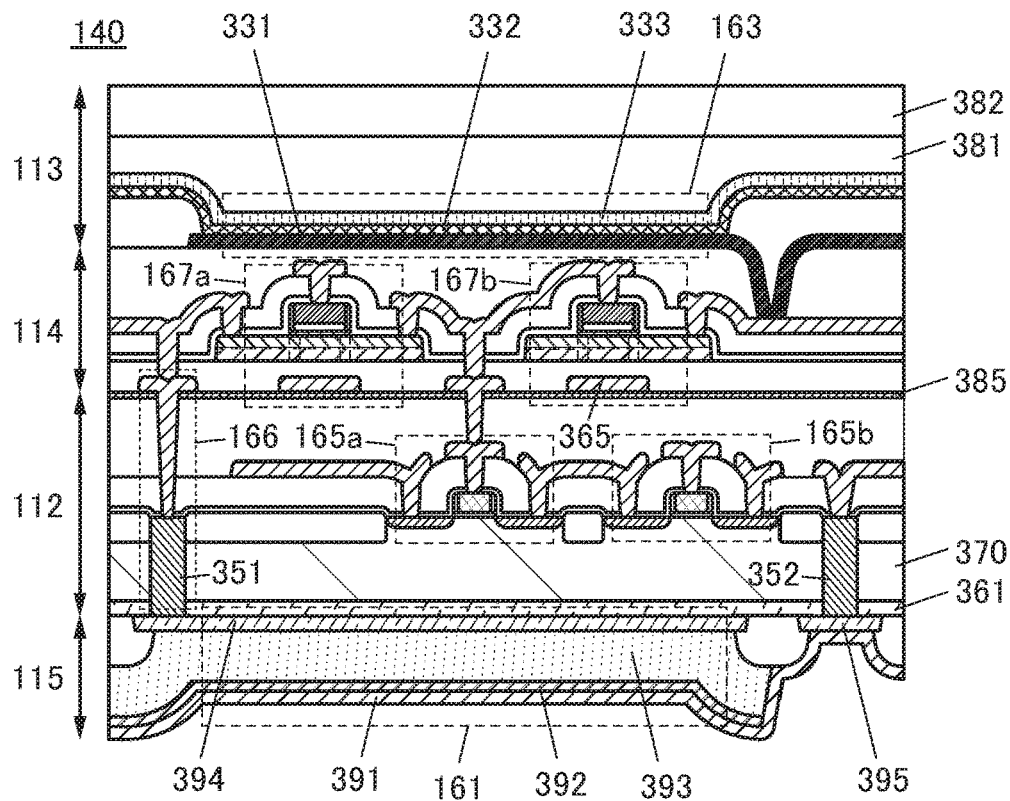

FIG. 24B illustrates a cross section of a pixel included in the imaging display device 140 illustrated in FIG. 5B. The layer 115 includes a photodiode as the photoelectric conversion element 161. The layer 112 and the layer 114 include transistors or the like which are part of the pixel circuit 167. The layer 113 includes a light-emitting element as the display element 163. The imaging display device 140 is different from the imaging display device 120 in including the layer 114. For the structures of the layers 112, 113, 114, and 115, the description of the imaging display devices 110 to 130 can be referred to.

Figure 26A:
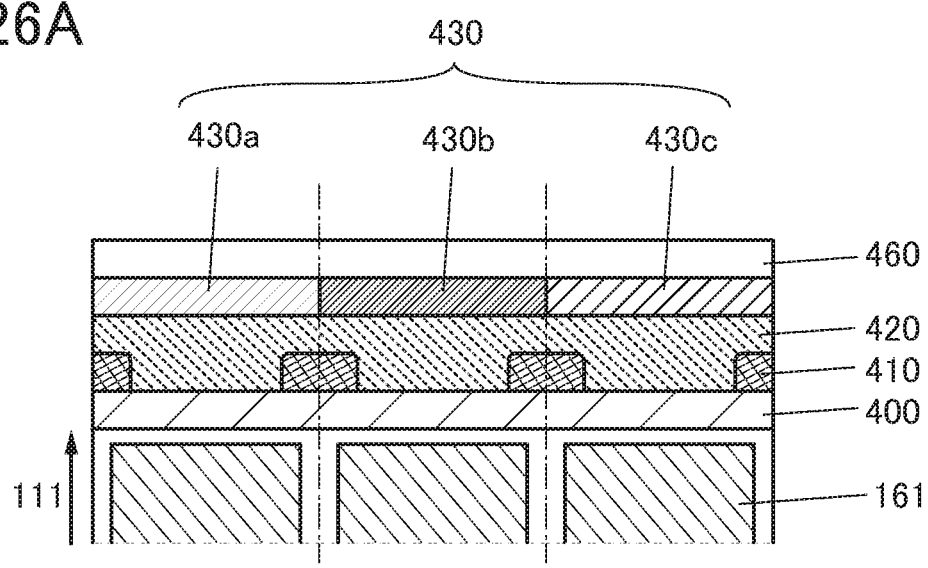
FIGS. 26A to 26C each illustrate a structure of an imaging device.

FIG. 26A is a cross-sectional view illustrating an example in which a color filter and the like are added over the imaging portion 101 of the imaging device of one embodiment of the present invention. The cross-sectional view shows part of a region including pixel circuits for three pixels. An insulating layer 400 is formed over the layer 111 or the layer 115 in which the photoelectric conversion element 161 is formed. As the insulating layer 400, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 410 may be formed over the insulating layer 400. The light-blocking layer 410 has a function of preventing color mixing of light passing through the upper color filter. As the light-blocking layer 410, a metal layer of aluminum, tungsten, or the like can be used. Furthermore, the metal layer and a dielectric film having a function of an anti-reflection film may be stacked as well.

An organic resin layer 420 can be provided as a planarization film over the insulating layer 400 and the light-blocking layer 410. A color filter 430 (a color filter 430a, a color filter 430b, or a color filter 430c) is formed in each pixel. For example, the color filter 430a, the color filter 430b, and the color filter 430c each have a color of red (R), green (G), blue (B), yellow (Y), cyan (C), magenta (M), or the like, so that a color image can be obtained.

Note that in the case where a color filter is provided over the photoelectric conversion element 161, a color filter of the same color as the light-emission color of a light-emitting element 163 is preferably provided over the light-emitting element 163. Note that in the case where color filters over the photoelectric conversion element 161 are provided in Bayer arrangement, the color filters over the light-emitting element 163 are also provided in Bayer arrangement, that is, the color filters on both sides are provided in the same arrangement manner.

An insulating layer 460 or the like having a light-transmitting property with respect to visible light can be provided over the color filter 430.

Figure 26B:
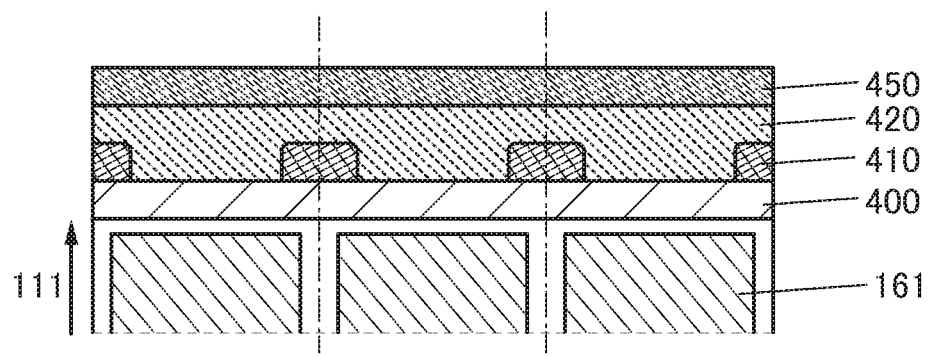

As illustrated in FIG. 26B, an optical conversion layer 450 may be used instead of the color filter 430. Such a structure enables the imaging device to capture images in various wavelength regions.

For example, when a filter that blocks light with a wavelength shorter than or equal to that of visible light is used as the optical conversion layer 450, an infrared imaging device is obtained. When a filter that blocks light with a wavelength shorter than or equal to that of near infrared light is used as the optical conversion layer 450, a far-infrared imaging device is obtained. When a filter that blocks light with a wavelength longer than or equal to that of visible light is used as the optical conversion layer 450, an ultraviolet imaging device is obtained.

When a scintillator is used as the optical conversion layer 450, it is possible to obtain an imaging device that takes an image visualizing the intensity of radiation and is used for an X-ray imaging device or the like. Radiations such as X-rays that pass through an object to enter a scintillator are converted into light (fluorescence) such as visible light or ultraviolet light owing to photoluminescence. Then, the photoelectric conversion element 161 detects the light to obtain image data. Moreover, the imaging device having the above structure may be used in a radiation detector or the like.

A scintillator contains a substance that, when irradiated with radiation such as X-rays or gamma rays, absorbs energy of the radiation to emit visible light or ultraviolet light. For example, it is possible to use a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed.

In the photoelectric conversion element 161 using a selenium-based material, radiation such as X-rays can be directly converted into charge; thus, the scintillator is not necessarily used.

Figure 26C:
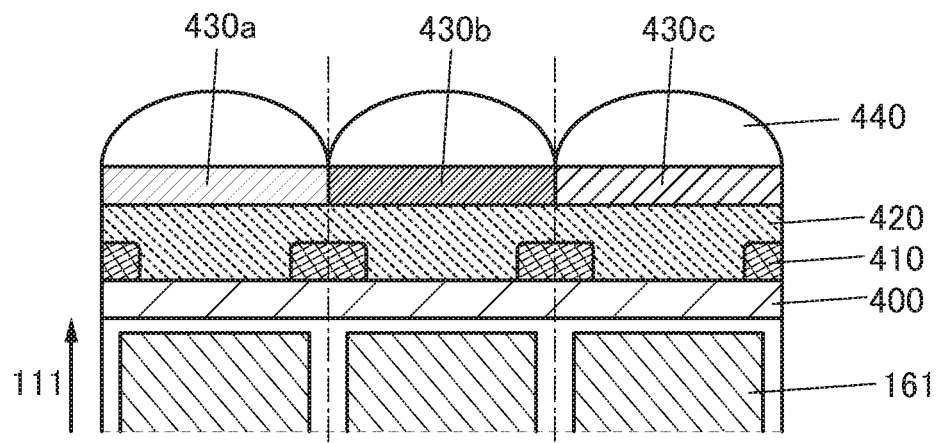

Alternatively, as illustrated in FIG. 26C, a microlens array 440 may be provided over the color filters 430a, 430b, and 430c. Light penetrating lenses included in the microlens array 440 goes through the color filters positioned thereunder to reach the photoelectric conversion element 161. Alternatively, as illustrated in FIG. 26B, the microlens array 440 may be provided over the optical conversion layer 450.

This embodiment can be combined with any of the other embodiments as appropriate.

Embodiment 4

Figure 27A:
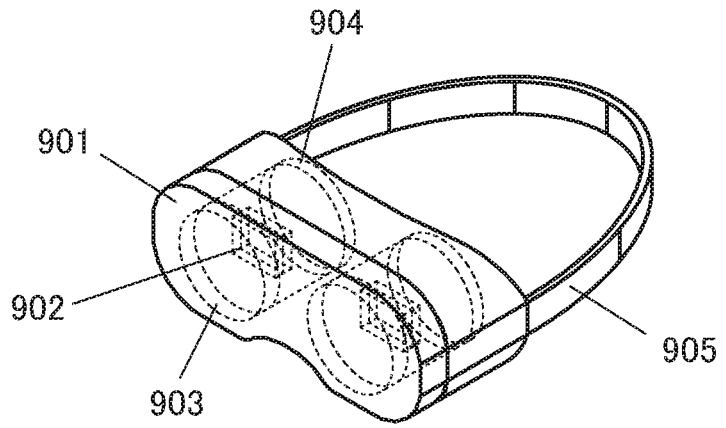
FIGS. 27A to 27C each illustrate an electronic device.
Figure 27B:
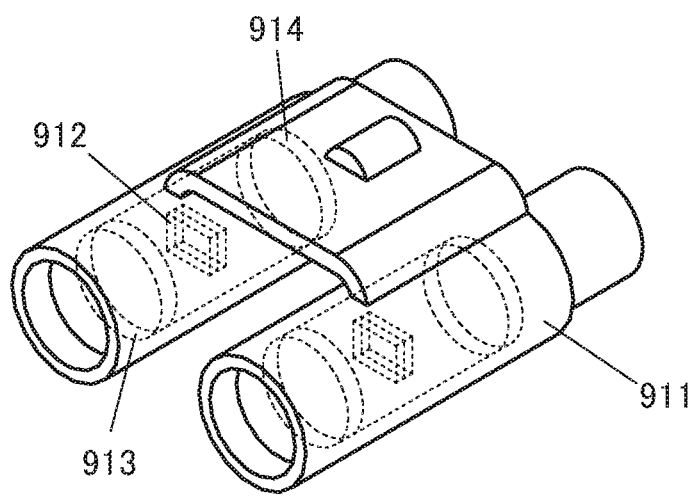
Figure 27C:
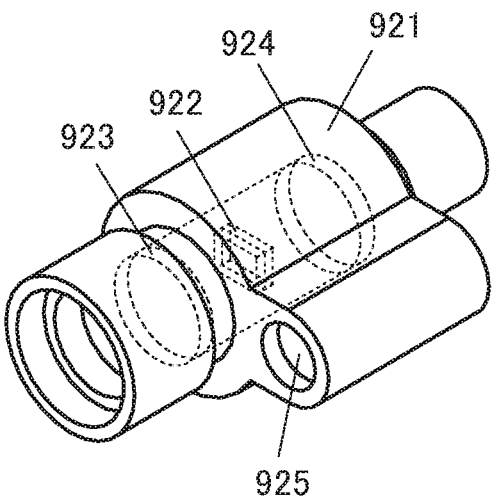

Specific examples of an electronic device that can use the imaging display device of one embodiment of the present invention are illustrated in FIGS. 27A to 27C.

FIG. 27A illustrates smart glasses which include an imaging display device 902 of one embodiment of the present invention, an objective lens 903, and an eye lens 904 in a main body 901. The smart glasses can be fixed to the head with a belt 905, so that AR-displayed data as well as a real background image can be seen. Alternatively, the real background image may be cut so that the device can be utilized as a head mounted display with which an image input from the outside can be seen.

FIG. 27B illustrates binoculars which include an imaging display device 912 of one embodiment of the present invention, an objective lens 913, and an eye lens 914 in a barrel 911. The binoculars include the objective lens 913 of high power; thus, AR-displayed data for a distant object can be seen. Furthermore, a similar structure can be applied to a monocle or a telescope.

FIG. 27C illustrates a night scope which includes an imaging display device 922 of one embodiment of the present invention, an objective lens 923, and an eye lens 924 inside a barrel 921. The night scope basically has a structure similar to the above-described binoculars but is provided with an infrared radiation device 925. By infrared irradiation of an object, sensing and display of the object can be performed with high visibility in a dark night.

This embodiment can be combined with any of the other embodiments as appropriate.

REFERENCE NUMERALS

10: photoelectric conversion element, 11: display element, 12: display element, C11: capacitor, C21: capacitor, C22: capacitor, Tr11: transistor, Tr12: transistor, Tr21: transistor, Tr22: transistor, Tr23: transistor, Tr24: transistor, Tr25: transistor, Tr26: transistor, Tr27: transistor, Tr28: transistor, 51: transistor, 52: transistor, 53: transistor, 54: transistor, 55: transistor, 56: transistor, 57: transistor, 58: transistor, 59: transistor, 60: capacitor, 61: transistor, 62: transistor, 63: transistor, 64: capacitor, 71: wiring, 72: wiring, 73: wiring, 74: wiring, 75: wiring, 76: wiring, 77: wiring, 78: wiring, 79: wiring, 80: wiring, 81: wiring, 82: wiring, 83: wiring, 84: wiring, 85: wiring, 86: wiring, 87: wiring, 100: imaging display device, 101: imaging portion, 102: display portion, 102a: circuit portion, 103: lens, 104: lens, 105: object, 106: viewer, 110: imaging display device, 111: layer, 112: layer, 113: layer, 114: layer, 115: layer, 120: imaging display device, 130: imaging display device, 140: imaging display device, 150: region, 151: region, 152: region, 152a: circuit, 152b: circuit, 152c: circuit, 152d: circuit, 152e: circuit, 152f: circuit, 152g: circuit, 152h: circuit, 153: region, 154: region, 155: region, 155a: circuit, 155b: circuit, 160: light-emitting element, 161: photoelectric conversion element, 162: pixel circuit, 162a: transistor, 162b: transistor, 163: display element, 165a: transistor, 165b: transistor, 166: connection portion, 167: pixel circuit, 167a: transistor, 167b: transistor, 171: pixel circuit, 172: pixel circuit, 173: pixel circuit, 174: pixel circuit, 175: pixel circuit, 176: pixel circuit, 177: pixel circuit, 178: pixel circuit, 179: pixel circuit, 180: pixel circuit, 200: data processing portion, 201: arithmetic portion, 202: image processing portion, 203: position sensor, 204: input output portion, 205: memory portion, 206: server, 207: neural network, 208: storage medium, 301: layer, 302: layer, 303: layer, 304: region, 331: electrode, 332: EL layer, 333: electrode, 351: conductive layer, 352: conductive layer, 353: conductive layer, 354: conductive layer, 361: insulating layer, 362: insulating layer, 365: backgate, 370: silicon substrate, 371: semiconductor layer, 372: insulating layer, 381: adhesive layer, 382: substrate, 385: insulating layer, 391: layer, 392: layer, 393: layer, 394: layer, 395: conductive layer, 400: insulating layer, 410: light-blocking layer, 420: organic resin layer, 430: color filter, 430a: color filter, 430b: color filter, 430c: color filter, 440: microlens array, 450: optical conversion layer, 460: insulating layer, 501: input layer, 502: middle layer, 503: output layer, 505: server, 600: semiconductor device, 610: memory circuit, 620: reference memory circuit, 630: circuit, 640: circuit, 650: current supply circuit, 901: main body, 902: imaging display device, 903: objective lens, 904: eye lens, 905: belt, 911: barrel, 912: imaging display device, 913: objective lens, 914: eye lens, 921: barrel, 922: imaging display device, 923: objective lens, 924: eye lens, 925: infrared radiation device.

This application is based on Japanese Patent Application Serial No. 2017-090230 filed with Japan Patent Office on Apr. 28, 2017, the entire contents of which are hereby incorporated by reference.

The invention claimed is:

1. An imaging display device comprising:
an imaging portion on a first surface; and
a display portion on a second surface, the second surface being opposite to the first surface,
wherein the imaging portion comprises a photoelectric conversion element configured to receive light delivered to the first surface,
wherein the display portion comprises a light-emitting element configured to emit light in a direction opposite to the first surface,
wherein the photoelectric conversion element is electrically connected to a gate of a transistor, and
wherein the light-emitting element is electrically connected to one of a source and a drain of the transistor.

2. The imaging display device according to claim 1, further comprising:
a data processing portion,
wherein the data processing portion comprises a neural network configured to estimate the kind of an object.

3. The imaging display device according to claim 2, wherein the data processing portion is positioned between the photoelectric conversion element and the light-emitting element.

4. An electronic device comprising:
the imaging display device according to claim 1; and
a lens.

5. An imaging display device comprising:
a first layer;
a second layer; and
a third layer,
wherein the second layer is between the first layer and the third layer,
wherein the first layer comprises a light-emitting element,
wherein the second layer comprises a first transistor and a second transistor,
wherein the third layer comprises a photoelectric conversion element,
wherein the light-emitting element is electrically connected to one of a source and a drain of the first transistor,
wherein the photoelectric conversion element is electrically connected to one of a source and a drain of the second transistor, and
wherein a gate of the first transistor is electrically connected to the other of the source and the drain of the second transistor.

6. The imaging display device according to claim 5, further comprising:
a fourth layer,
wherein the fourth layer is between the second layer and the third layer,
wherein the fourth layer comprises a third transistor,
wherein the third transistor is electrically connected to the second transistor,
wherein each of the first transistor and the second transistor comprises a metal oxide in a channel formation region, and
wherein the third transistor comprises silicon in a channel formation region.

7. The imaging display device according to claim 6, wherein the metal oxide comprises In, Zn, and M, and wherein M is Al, Ti, Ga, Sn, Y, Zr, La, Ce, Nd, or Hf.

8. The imaging display device according to claim 5, wherein the photoelectric conversion element comprises selenium or a compound comprising selenium.

9. An electronic device comprising:
the imaging display device according to claim 5; and
a lens.

10. An imaging display device comprising:
a first transistor;
a second transistor;
a third transistor;
a photoelectric conversion element; and
a light-emitting element,
wherein one electrode of the photoelectric conversion element is electrically connected to one of a source and a drain of the first transistor,
wherein the one electrode of the photoelectric conversion element is electrically connected to one of a source and a drain of the second transistor,
wherein a gate of the third transistor is electrically connected to the other of the source and the drain of the second transistor, and
wherein one electrode of the light-emitting element is electrically connected to one of a source and a drain of the third transistor.

11. The imaging display device according to claim 10, further comprising:
a fourth transistor,
wherein one of a source and a drain of the fourth transistor is electrically connected to the other of the source and the drain of the second transistor,
wherein the other of the source and the drain of the fourth transistor is electrically connected to the gate of the third transistor.

12. An electronic device comprising:
the imaging display device according to claim 10; and
a lens.

* * * * *